(12) United States Patent
Park et al.

(10) Patent No.: US 10,615,311 B2
(45) Date of Patent: Apr. 7, 2020

(54) LIGHT EMITTING DEVICE AND DISPLAY COMPRISING SAME

(71) Applicant: LG INNOTEK CO., LTD., Seoul (KR)

(72) Inventors: Duk Hyun Park, Seoul (KR); Eun Bin Ko, Seoul (KR); Sung Wook Moon, Seoul (KR); Sang Rock Park, Seoul (KR); Young Kuen Jung, Seoul (KR); Ki Yong Hong, Seoul (KR); Byung Hak Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 36 days.

(21) Appl. No.: 16/094,985

(22) PCT Filed: Apr. 21, 2017

(86) PCT No.: PCT/KR2017/004295
§ 371 (c)(1),
(2) Date: Oct. 19, 2018

(87) PCT Pub. No.: WO2017/183944
PCT Pub. Date: Oct. 26, 2017

(65) Prior Publication Data
US 2019/0148601 A1    May 16, 2019

(30) Foreign Application Priority Data

| Apr. 22, 2016 | (KR) | ........................ 10-2016-0049576 |
| Apr. 29, 2016 | (KR) | ........................ 10-2016-0053610 |
| Apr. 29, 2016 | (KR) | ........................ 10-2016-0053611 |

(51) Int. Cl.
*H01L 33/00* (2010.01)
*H01L 33/44* (2010.01)
(Continued)

(52) U.S. Cl.
CPC .............. *H01L 33/44* (2013.01); *H01L 25/18* (2013.01); *H01L 27/124* (2013.01);
(Continued)

(58) Field of Classification Search
CPC ....... H01L 33/44; H01L 33/382; H01L 25/18; H01L 27/124; H01L 27/156;
(Continued)

(56) References Cited

U.S. PATENT DOCUMENTS

| 10,535,798 B2* | 1/2020 | Jeon ........................ H01L 33/10 |
| 2006/0220031 A1 | 10/2006 | Krames et al. |
| 2009/0173956 A1 | 7/2009 | Aldaz et al. |

FOREIGN PATENT DOCUMENTS

| JP | 2002-151739 | 5/2002 |
| JP | 2006-352089 | 12/2006 |

(Continued)

OTHER PUBLICATIONS

International Search Report (with English Translation) and Written Opinion dated Jul. 25, 2017 issued in Application No. PCT/KR2017/004295.

*Primary Examiner* — David Vu
(74) *Attorney, Agent, or Firm* — Ked & Associates, LLP

(57) ABSTRACT

An embodiment discloses a light emitting device and a display comprising the same. The light emitting device includes: a light transmitting substrate; a light emitting structure including a second conductive semiconductor layer disposed on the light transmitting substrate, a first conductive semiconductor layer disposed on the second conductive semiconductor layer, and an active layer disposed between the second conductive semiconductor layer and the first conductive semiconductor layer; an insulating layer covering the light emitting structure; a first ohmic electrode electrically connected to the first conductive semiconductor (Continued)

layer; a second ohmic electrode disposed on one side of the second conductive semiconductor layer facing the light transmitting substrate and electrically connected to the second conductive semiconductor layer; a first electrode electrically connected to the first ohmic electrode through the insulating layer; and a second electrode electrically connected to the second ohmic electrode through the insulating layer and the light emitting structure, wherein the active layer emits light of a red wavelength band, the second ohmic electrode includes a pad electrode disposed at the center of the second conductive semiconductor layer and a plurality of branched electrodes extending outward from the center of the second conductive semiconductor layer.

9 Claims, 33 Drawing Sheets

(51) Int. Cl.
| | |
|---|---|
| *H01L 33/14* | (2010.01) |
| *H01L 33/38* | (2010.01) |
| *H01L 25/18* | (2006.01) |
| *H01L 27/12* | (2006.01) |
| *H01L 27/15* | (2006.01) |
| *H01L 33/12* | (2010.01) |
| *H01L 33/30* | (2010.01) |
| *H01L 33/62* | (2010.01) |
| *H01L 33/06* | (2010.01) |
| *H01L 33/32* | (2010.01) |
| *H01L 33/42* | (2010.01) |
| *H01L 33/46* | (2010.01) |

(52) U.S. Cl.
CPC ........ *H01L 27/156* (2013.01); *H01L 33/0062* (2013.01); *H01L 33/12* (2013.01); *H01L 33/14* (2013.01); *H01L 33/30* (2013.01); *H01L 33/382* (2013.01); *H01L 33/385* (2013.01); *H01L 33/62* (2013.01); *H01L 33/0025* (2013.01); *H01L 33/06* (2013.01); *H01L 33/32* (2013.01); *H01L 33/42* (2013.01); *H01L 33/46* (2013.01); *H01L 2933/0016* (2013.01); *H01L 2933/0025* (2013.01)

(58) Field of Classification Search
CPC ..... H01L 33/0062; H01L 33/12; H01L 33/30; H01L 33/385; H01L 33/62; H01L 33/14; H01L 33/0025; H01L 33/06; H01L 33/32; H01L 33/42; H01L 33/46; H01L 2933/0016; H01L 2933/0025
See application file for complete search history.

(56) References Cited

FOREIGN PATENT DOCUMENTS

| | | |
|---|---|---|
| JP | 2011-165799 | 8/2011 |
| KR | 10-2005-0013047 | 2/2005 |
| KR | 10-2015-0139630 | 12/2015 |
| WO | WO 2005/064697 | 7/2005 |

* cited by examiner

LIGHT EMITTING DEVICE AND DISPLAY COMPRISING SAME

CROSS-REFERENCE TO RELATED PATENT APPLICATIONS

This application is a U.S. National Stage Application under 35 U.S.C. § 371 of PCT Application No. PCT/KR2017/004295, filed Apr. 21, 2017, which claims priority to Korean Patent Application Nos. 10-2016-0049576, filed Apr. 22, 2016, 10-2016-0053610, filed on Apr. 29, 2016 and 10-2016-0053611, filed on Apr. 29, 2016, whose entire disclosures are hereby incorporated by reference.

TECHNICAL FIELD

An embodiment relates to a light emitting device and a display including the same.

BACKGROUND ART

A light emitting diode (LED) is one of light emitting devices that emit light when a current is applied thereto. The LED is capable of emitting light with a low voltage and high efficiency, thereby having an excellent energy saving effect. In recent years, an LED brightness problem has been significantly improved, and the LED has been applied to various devices such as a backlight unit of a liquid crystal display, an electric sign board, a display device, and home appliances.

An LED having AlGaInP uses a GaAs substrate as a growth substrate, but to manufacture the LED as a flip chip type, there is a need to remove the GaAs substrate in order to prevent light absorption. However, there is a problem in that it is difficult to remove the GaAs substrate using a conventional laser lift-off (LLO) process. Therefore, most LEDs having AlGaInP is manufactured as a vertical type.

DISCLOSURE

Technical Problem

An embodiment provides a flip chip type red light emitting device.

In addition, an embodiment provides a light emitting device with excellent light extraction efficiency.

In addition, an embodiment provides a light emitting device with an excellent current distribution effect.

In addition, an embodiment provides a light emitting device with excellent ohmic contact.

Technical Solution

A light emitting device according to an embodiment of the present invention includes: a light transmitting substrate; a light emitting structure including a second conductive semiconductor layer disposed on the light transmitting substrate, a first conductive semiconductor layer disposed on the second conductive semiconductor layer, and an active layer disposed between the second conductive semiconductor layer and the first conductive semiconductor layer; an insulating layer configured to cover the light emitting structure; a first ohmic electrode electrically connected to the first conductive semiconductor layer; a second ohmic electrode disposed on one side of the second conductive semiconductor layer facing the light transmitting substrate and electrically connected to the second conductive semiconductor layer; a first electrode electrically connected to the first ohmic electrode through the insulating layer; and a second electrode electrically connected to the second ohmic electrode through the insulating layer and the light emitting structure, wherein the active layer emits light in a red wavelength band, the second ohmic electrode includes a pad electrode disposed at the center of the second conductive semiconductor layer and a plurality of branched electrodes extending outward from the center of the second conductive semiconductor layer.

The light emitting device may include an optical layer disposed between the second conductive semiconductor layer and the light transmitting substrate, and the optical layer may join the light transmitting substrate and the light emitting structure.

The first electrode may have a rotationally symmetrical shape about a central axis of the light emitting structure, the second electrode may have a rotationally symmetrical shape about the central axis of the light emitting structure, the first electrode may be disposed on the central axis of the light emitting structure, and the second electrode may be disposed on an edge of the light emitting structure.

The second electrode may be electrically connected to the second ohmic electrode through the insulating layer and the light emitting structure, the light emitting structure may include a through-hole in which the second electrode extends, and a ratio between a diameter of the through-hole and a diameter of the pad electrode of the second ohmic electrode may be 1:1.2 to 1:2.

An area of the second ohmic electrode may be 2% to 7% of an entire area of the second conductive semiconductor layer.

The second conductive semiconductor layer may include a second clad layer, a second current distribution layer, and a second ohmic layer, the light emitting structure may include an accommodating groove formed on the first conductive semiconductor layer and configured to expose the second current distribution layer, and the second ohmic electrode may be disposed on a bottom surface of the accommodating groove.

The second current distribution layer and the second ohmic layer may include Ga and P.

The first conductive semiconductor layer may include a first ohmic layer coming into contact with the first ohmic electrode, and the first ohmic layer may include a GaAs composition.

Advantageous Effects

According to an embodiment, a red light emitting device can be implemented as a flip chip type.

In addition, a light emitting device having excellent light extraction efficiency can be manufactured.

In addition, a light emitting device having excellent ohmic contact can be manufactured.

In addition, a display with high brightness and light reproduction can be implemented by disposing light emitting diodes (LEDs) configured to emit different colors as subpixels in a single pixel.

Various advantageous effects of the present invention are not limited to those described above, and other unmentioned advantageous effects should be more easily understood in the process in which specific embodiments of the present invention are described.

MODES OF THE INVENTION

The present embodiments may be modified to other forms, or various embodiments may be combined with each other. The scope of the present invention is not limited to each embodiment described below.

Even when a detail described in relation to a specific embodiment is not described in relation to another embodiment, the detail may be understood as description related to the other embodiment unless description contrary or contradictory to the detail is given in relation to the other embodiment.

For example, when a feature of configuration A is described in relation to a specific embodiment while a feature of configuration B is described in relation to another embodiment, even when an embodiment in which configuration A and configuration B are combined is not clearly stated, the embodiment should be understood as belonging to the scope of the present invention unless description contrary or contradictory to the embodiment is given.

In description of an embodiment, a case in which a certain element is stated as being formed "on or under" another element includes both a case in which two elements are directly in contact with each other and a case in which two elements are indirectly in contact with each other while one or more other elements are disposed therebetween. In addition, "on or under" may refer to a downward direction as well as an upward direction with respect a single element.

Hereinafter, embodiments of the present invention will be described in detail with reference to the accompanying drawings so that one of ordinary skill in the art to which the present invention pertains is able to easily practice the embodiments of the present invention.

Figure 1:
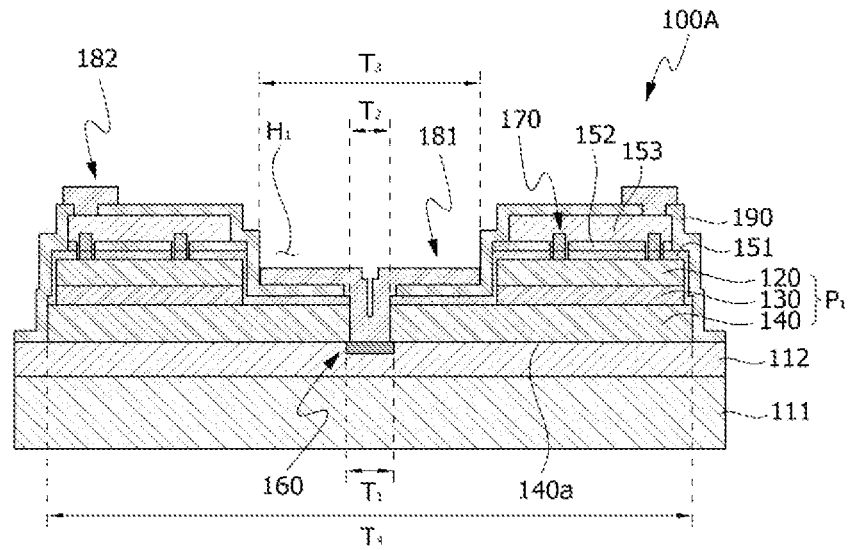
FIG. 1 is a conceptual diagram of a light emitting device according to a first embodiment of the present invention.
Figure 2:
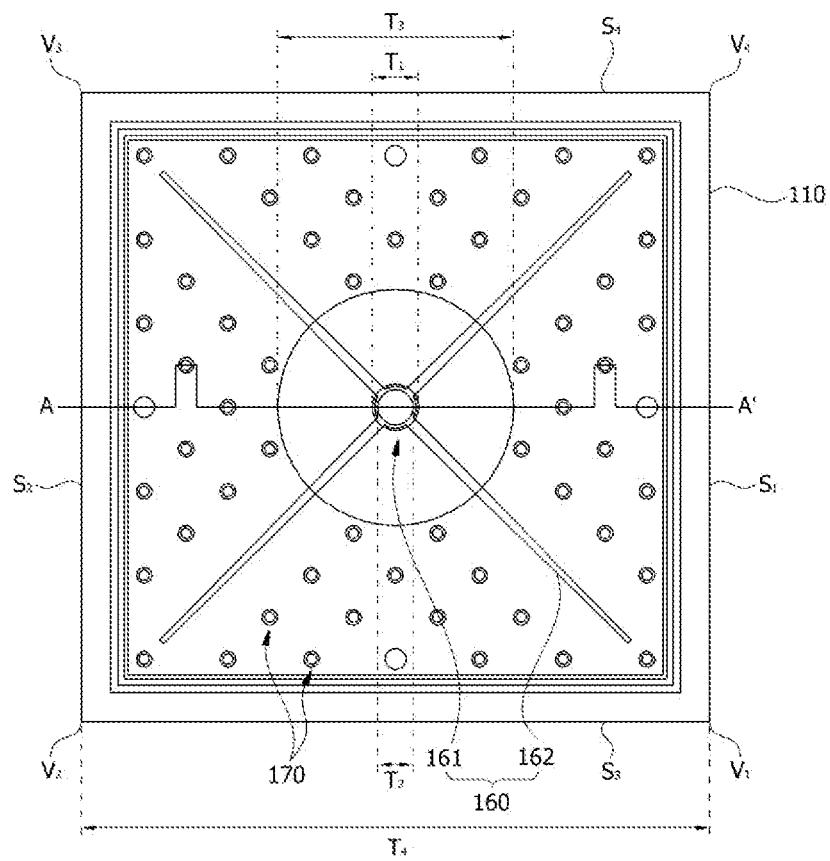
FIG. 2 is a plan view of FIG. 1.
Figure 3:
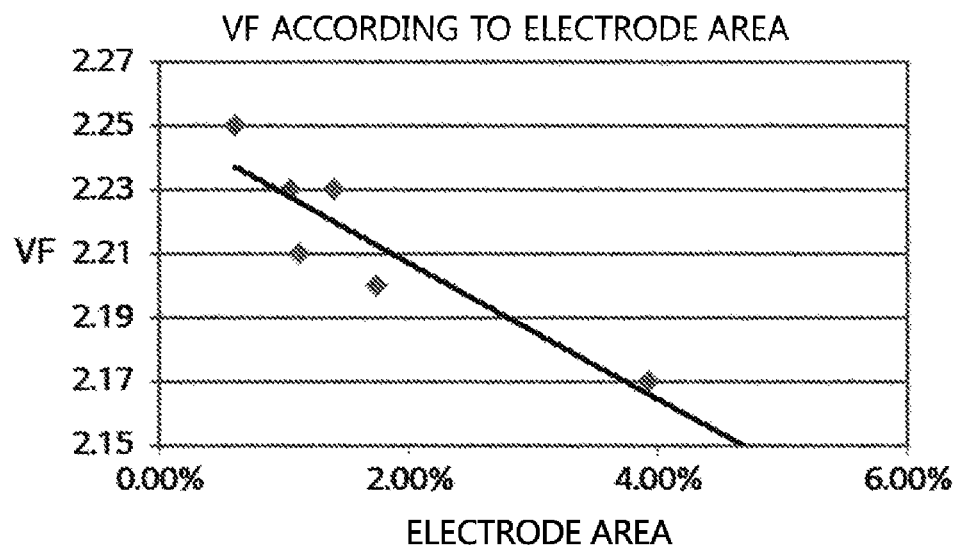
FIG. 3 is a graph showing measurements of an operating voltage VF according to an area of an ohmic electrode.
Figure 4:
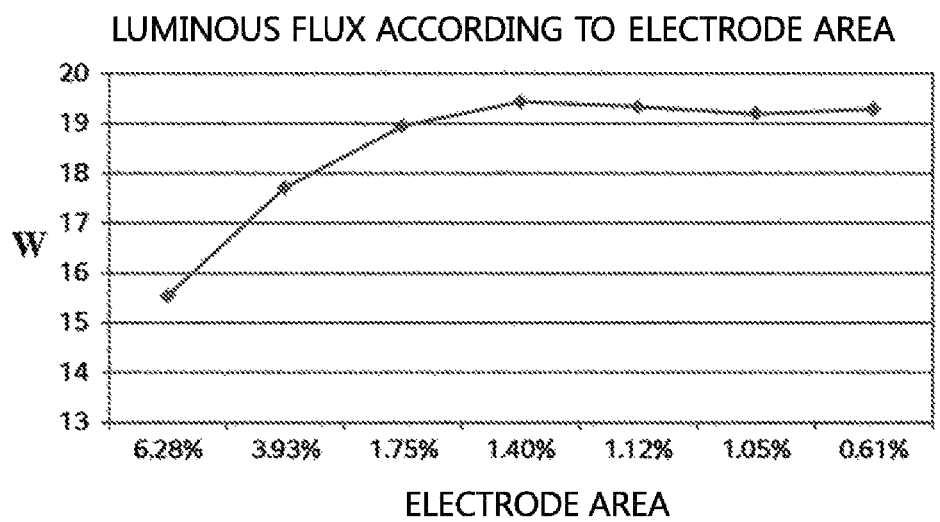
FIG. 4 is a graph showing measurements of a change in luminous flux according to an area of an ohmic electrode.

FIG. 1 is a conceptual diagram of a light emitting device according to a first embodiment of the present invention, FIG. 2 is a plan view of FIG. 1, FIG. 3 is a graph showing measurements of an operating voltage VF according to an area of an ohmic electrode, and FIG. 4 is a graph showing measurements of a change in luminous flux according to an area of an ohmic electrode.

Referring to FIGS. 1 and 2, a light emitting device 100A includes a light emitting structure P1, an insulating layer 190 disposed at the other side of the light emitting structure P1, a first electrode 182 electrically connected to a first conductive semiconductor layer 120 through the insulating layer 190, and a second electrode 181.

The light emitting structure P1 includes the first conductive semiconductor layer 120, an active layer 130, and a second conductive semiconductor layer 140. Light output from the light emitting structure P1 may be in a red wavelength band. However, embodiments are not necessarily limited thereto.

A first reflective layer 151 may be disposed on the first conductive semiconductor layer 120. The first reflective layer 151 may be an omni-directional reflector (ODR) formed of at least one selected from a compound, a mixture, an oxide, and a nitride containing Si, Ti, Mg, Al, Zn, In, Sn, and C. However, embodiments are not necessarily limited thereto, and an insulating layer or a reflective layer formed of various other materials may be applied as the first reflective layer 151. When the first reflective layer 151 is indium tin oxide (ITO), the first reflective layer 151 may be disposed only on an upper portion of the first conductive semiconductor layer 120.

A plurality of first ohmic electrodes 170 may come into contact with the first conductive semiconductor layer 120 through the first reflective layer 151. A surface layer of the first conductive semiconductor layer 120 may have a GaAs composition with a low energy band gap. Therefore, contact resistance between the first conductive semiconductor layer 120 and the first ohmic electrode 170 may be reduced.

A transparent electrode layer 152 may be disposed on the first reflective layer 151. The transparent electrode layer 152 may be formed of a material having excellent electrical conductivity so that a current injected from the outside is able to be evenly spread horizontally.

The transparent electrode layer 152 may be formed of a transparent conductive oxide (TCO). The TCO may be selected from ITO, indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, and the like. However, embodiments are not necessarily limited thereto, and the first reflective layer 151 and the transparent electrode layer 152 may also be configured as a single layer. As an example, the first reflective layer 151 and the transparent electrode layer 152 may include an ITO layer, but embodiments are not necessarily limited thereto.

A second reflective layer 153 may be formed of a material having high reflectance such as Ag, Ni, Al, Rh, Pd, Ir, Ru, Mg, Zn, Pt, Au, Hf, and the like or may be formed of a mixture of the material having high reflectance and a transparent conductive material such as IZO, IZTO, IAZO, IGZO, IGTO, AZO, and ATO.

The insulating layer 190 may be disposed on the light emitting structure P1. The insulating layer 190 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but embodiments are not limited thereto. The insulating layer 190 may be formed of a single layer or multiple layers. As an example, the insulating layer 190 may have a distributed Bragg reflector (DBR) structure in which $TiO_2$ and $SiO_2$ are alternately stacked.

The insulating layer 190 may be formed at a sidewall of a through-hole H1 formed in the center of the light emitting structure P1 and may electrically insulate the second electrode 181 and the active layer 130 from each other.

The second ohmic electrode 160 may be disposed on a surface 140a at which the second conductive semiconductor layer 140 faces a substrate 111. The second conductive semiconductor layer 140 may have a GaP composition. Therefore, contact resistance between the second conductive semiconductor layer 140 and the second ohmic electrode 160 may be decreased.

The first ohmic electrode 170 and the second ohmic electrode 160 may be formed to include at least one of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, and Hf, but materials of the first ohmic electrode 170 and the second ohmic electrode 160 are not limited thereto.

The second electrode 181 may be electrically connected to the second ohmic electrode 160 through the insulating layer 190. The second electrode 181 may be disposed at an edge of the light emitting structure, but embodiments are not necessarily limited thereto.

An optical layer 112 may be formed at one side of the light emitting structure P1 and cover the second ohmic electrode 160 and adhere the light transmitting substrate 111 and the light emitting structure P1 to each other. The optical layer 112 may be resin such as polycarbonates (PC) and polymethyl-methacrylate (PMMA) and may also be an optical clear adhesive (OCA). A material of the optical layer 112 is not particularly limited as long as the material has light transmittance of 90% or higher with respect to visible light.

The light transmitting substrate 111 may be an insulating substrate. The light transmitting substrate 111 may be formed of a material selected from sapphire ($Al_2O_3$), SiC, GaN, ZnO, Si, GaP, InP, and Ge, but the material of the light transmitting substrate 111 is not particularly limited as long as the material transmits 90% or more of visible light. A plurality of irregularities may be formed on the light transmitting substrate 111. The irregularities may improve light extraction efficiency.

Referring to FIG. 2, the plurality of first ohmic electrodes 170 may occupy 2 to 7% of an entire area in plan view. A diameter of the first ohmic electrode 170 may be 5 μm to 15 μm or 8 μm to 10 μm.

Referring to FIG. 3, it can be seen that VF decreases as the area of the first ohmic electrodes 170 becomes greater. Referring to FIG. 4, it can be seen that luminous flux increases as the area of the first ohmic electrodes 170 becomes smaller. It can be checked that the luminous flux is improved when the area of the first ohmic electrodes 170 is 1.05% to 1.75% of the entire area of the first conductive semiconductor layer 120.

Referring back to FIGS. 1 and 2, the second ohmic electrode 160 may include a pad electrode 161 formed at the center of the light emitting structure P1 and a plurality of branched electrodes 162 which extend from the pad electrode 161 toward corners V1, V2, V3, and V4 or sides S1, S2, S3, and S4.

The light emitting structure P1 may include a through-hole T2 in which the second electrode 181 extends, and a ratio T2:T1 between a diameter of the through-hole T2 and a diameter T1 of the pad electrode of the second ohmic electrode 160 may be 1:1.2 to 1:2.0. When the ratio between the diameters is 1:1.2, it may be difficult for the second ohmic electrode 160 and the second electrode 181 to come into sufficient contact. When the ratio between the diameters exceeds 1:2, there is a problem in that an amount of light absorbed by the pad electrode 161 extremely increases. An area of the second ohmic electrode 160 may occupy 2% to 7% of an entire area of the second conductive semiconductor layer 140.

The ratio between the diameter T1 of the pad electrode 161 and a diameter T3 of the through-hole formed in the insulating layer 190 may be 1:3 to 1:7. When the ratio between the diameters becomes less than 1:3, the diameter T3 of the through-hole decreases and it may become difficult to secure a sufficient solder area. When the ratio between the diameters exceeds 1:7, an area of an active area extremely decreases and there is a problem in that it is not possible to have a sufficient amount of light.

The plurality of first ohmic electrodes 170 may be respectively disposed in a plurality of divided regions partitioned by the branched electrodes 162 of the second ohmic electrode 160. That is, the first ohmic electrodes 170 and the second ohmic electrode 160 may not overlap with each other in plan view.

Figure 5:
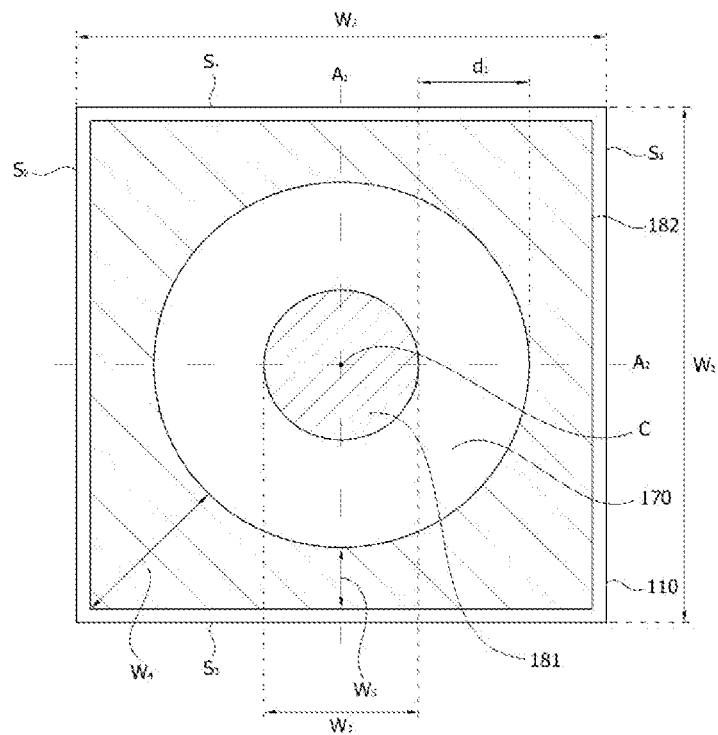
FIG. 5 is a view for describing shapes of a first electrode and a second electrode.

FIG. 5 is a view for describing shapes of a first electrode and a second electrode.

Referring to FIG. 5, in plan view, a light emitting device may have a square shape having a first surface S1 and a second surface S2 which face each other and a third surface S3 and a fourth surface S4 which face each other.

The first electrode 182 and the second electrode 181 may have symmetrical shapes about a first virtual line A1 and a second virtual line A2 passing through the center. Here, the first virtual line A1 may be parallel with the first surface S1, and the second virtual line A2 may be parallel with the third surface S3.

According to such a structure, a normal electrode connection becomes possible even when, upon mounting the light emitting device, a chip is rotated 90° or 180° about a center C of a bottom surface. Such a non-oriented electrode structure may improve reliability upon mounting.

With respect to an entire area of the bottom surface set as 100, an area of the first electrode 182 and the second electrode 181 may be 60% to 90% or 65% to 80%. When the area of the first electrode 182 and the second electrode 181 is less than 60%, there is a problem in that an area of the pad is decreased. When the area of the first electrode 182 and the second electrode 181 exceeds 90%, a gap d1 between the first electrode 182 and the second electrode 181 becomes narrow, and it may be difficult to electrically separate the first electrode 182 and the second electrode 181.

With respect to the entire area of the bottom surface set as 100, the first electrode 182 may be 20% to 40%. With respect to the entire area of the bottom surface set as 100, the first electrode 182 may be 50% to 70%.

A radius ($\frac{1}{2} \times W3$) of the second electrode 181 may be 30% to 60% of a diagonal width W4 of the first electrode 182. In addition, the gap d1 between the first electrode 182 and the second electrode 181 may be 60% to 80% of the diagonal width W4 of the first electrode 182.

A horizontal width W5 of the first electrode 182 may be 20% to 60% of the diagonal width W4 of the first electrode 182. Here, the diagonal width may be a length of a virtual line that ranges from a corner of the bottom surface to the center C of the bottom surface, and the horizontal width may be a length of a virtual line that ranges from a point at which any one of the surfaces S1, S2, S3, and S4 is halved to the center C of the bottom surface. When such conditions are satisfied, an area of a corner portion of the second electrode 181 increases, and a change in a position of the second electrode 181 may be prevented upon mounting the second electrode 181 on a substrate.

As an example, a width W1 of the first surface S1 and a width W2 of the fourth surface S4 may be 500 μm to 700 μm, a width W3 of the second electrode 181 may be 150 μm to 200 μm, the diagonal width W4 of the first electrode 182 may be 150 μm to 200 μm, and the gap d1 between the first electrode 182 and the second electrode 181 may be 100 μm to 150 μm.

Figure 6:
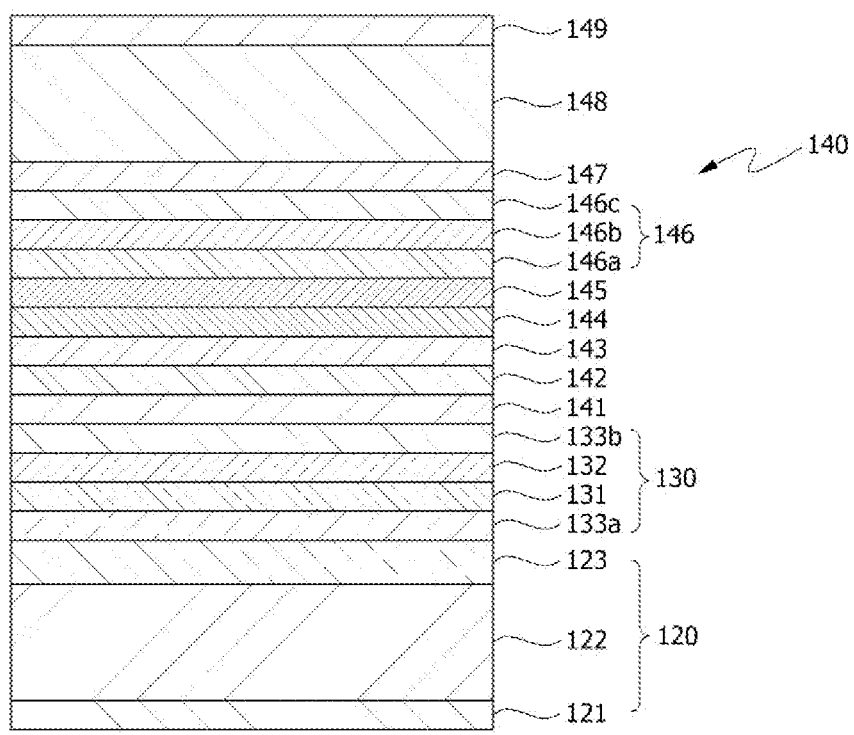
FIG. 6 is a cross-sectional view of a light emitting structure.

FIG. 6 is a cross-sectional view of a light emitting structure.

Referring to FIG. 6, a light emitting structure P1 may include a first conductive semiconductor layer 120, an active layer 130, and a second conductive semiconductor layer 140.

The first conductive semiconductor layer 120 may be implemented using at least one of a Group III-V compound semiconductor and a Group II-VI compound semiconductor which are doped with a first conductive dopant.

The first conductive semiconductor layer 120 may be formed of a semiconductor material having an empirical formula of, for example, $In_xAl_yGa_{1-x-y}N$ ($0 \leq x \leq 1$, $0 \leq y \leq 1$, $0 \leq x+y \leq 1$).

The first conductive semiconductor layer 120 may include at least one of, for example, GaN, AlN, AlGaN, InGaN, InN, InAlGaN, AlInN, AlGaAs, GaP, GaAs, GaAsP, and AlGaInP.

The first conductive semiconductor layer 120 may be an n-type semiconductor layer doped with an n-type dopant such as Si, Ge, Sn, Se, and Te. The first conductive semiconductor layer 120 may be disposed as a single layer or multiple layers.

The first conductive semiconductor layer 120 according to an embodiment may include a first clad layer 123, a first current distribution layer 122, and a first ohmic layer 121.

The first clad layer 123 may be an n-type carrier injection layer and include AlInP. The Al composition may be 0.2 to 0.7. As an example, the first clad layer 123 may have a composition of $Al_{0.5}In_{0.5}P$. A thickness of the first clad layer 123 may be 300 nm to 700 nm.

The first current distribution layer 122 serves to distribute a current injected through an electrode. The first current distribution layer 122 may have an energy band gap that is smaller than that of the first clad layer 123 and is larger than that of the first ohmic layer 121. The first current distribution layer 122 may include AlGaInP. The Al composition may be 0.2 to 0.7. As the Al composition becomes higher, the transmittance may become higher but resistance may also become higher. As an example, the first current distribution layer 122 may be $(Al_{0.4}Ga_{0.6})_{0.5}In_{0.5}P$. The first current distribution layer 122 may serve as a low resistance layer due to having a lower Al composition than that of the first clad layer 123.

A thickness of the first current distribution layer 122 may be 2500 nm to 3000 nm. Irregularities may be formed on a surface of the first current distribution layer 122 and increase light extraction efficiency. The irregularities may be formed by dry etching.

The first ohmic layer 121 may include GaAs and may be doped with an n-type dopant such as Si, Ge, Sn, Se, and Te. A thickness of the first ohmic layer 121 may be about 20 nm to 50 nm. Since the first ohmic layer 121 has a smaller energy band gap than that of the first current distribution layer 122, ohmic contact between the first ohmic layer 121 and an electrode may be facilitated. As an example, the energy band gap of the first ohmic layer 121 may be 1.4 eV.

The active layer 130 may be formed of at least one of a single well structure, a single quantum well structure, a multi-well structure, a multi-quantum well (MQW) structure, a quantum-wire structure, and a quantum dot structure.

The active layer 130 is a layer at which electrons (or holes) injected through the first conductive semiconductor layer 120 and holes (or electrons) injected through the second conductive semiconductor layer 140 combine and light is emitted due to a band gap difference according to a material forming the active layer 130.

The active layer 130 may be implemented using a compound semiconductor. As an example, the active layer 130 may be implemented using at least one of a Group II-VI compound semiconductor and a Group III-V compound semiconductor.

The active layer 130 includes a plurality of well layers 131 and a plurality of barrier layers 132 which are alternately disposed, wherein a well layer 131/barrier layer 132 pair may be formed every 2 to 30 cycles. The well layer 131/barrier layer 132 cycle includes, for example, at least one of a AlInGaP/AlInGaP pair, a InGaN/GaN pair, a GaN/AlGaN pair, a AlGaN/AlGaN pair, a InGaN/AlGaN pair, a InGaN/InGaN pair, a AlGaAs/GaAs pair, a InGaAs/GaAs pair, a InGaP/GaP pair, a AlInGaP/InGaP pair, and a InP/GaAs pair.

The well layer 131 may be disposed as a semiconductor material having an empirical formula of $In_xAl_yGa_{1-x-y}P$ ($0<x\leq1$, $0\leq y\leq1$, $0\leq x+y<1$). The barrier layer 132 may be formed using a semiconductor material having an empirical formula of $In_xAl_yGa_{1-x-y}P$ ($0\leq x\leq1$, $0\leq y\leq1$, $0\leq x+y<1$).

As an example, the well layer 131 may be $(Al_{0.1}Ga_{0.9})_{0.5}In_{0.5}P$, and the barrier layer 132 may be $(Al_{0.7}Ga_{0.3})_{0.5}In_{0.5}P$. A thickness of the well layer 131 may be about 5 nm to 10 nm, and a thickness of the barrier layer 132 may be 10 to 20 nm.

The active layer 130 may include outermost barrier layers 133a and 133b disposed adjacent to the first conductive semiconductor layer 120 and the second conductive semiconductor layer 140. The outermost barrier layers 133a and 133b may have a composition of $(Al_{0.1}Ga_{0.9})_{0.5}In_{0.5}P$ and a thickness of 40 nm to 60 nm.

A diffusion preventing layer 141 may be disposed between the active layer 130 and the second conductive semiconductor layer 140. The diffusion preventing layer 141 may prevent diffusion of a dopant of the second conductive semiconductor layer 140 to the active layer 130. The diffusion preventing layer 141 may have a composition of $Al_{0.5}In_{0.5}P$ and a thickness of 200 nm to 300 nm.

The second conductive semiconductor layer 140 may be formed of a semiconductor material having an empirical formula of, for example, $In_xAl_yGa_{1-x-y}N$ ($0\leq x\leq1$, $0\leq y\leq1$, $0\leq x+y\leq1$).

The second conductive semiconductor layer 140 may include, for example, at least one of AlInP, GaP, GaN, AlN, AlGaN, InGaN, InN, InAlGaN, AlInN, AlGaAs, GaAs, GaAsP, and AlGaInP and may be a p-type semiconductor layer doped with a p-type dopant such as Mg.

The second conductive semiconductor layer 140 may be disposed as a single layer or multiple layers. The second conductive semiconductor layer 140 may have a superlattice structure in which at least two layers different from each other are alternately disposed. The second conductive semiconductor layer 140 may be an electrode contact layer.

The second conductive semiconductor layer 140 may include a second clad layer 142, a second current distribution layer 148, and a second ohmic layer 149.

The second clad layer 142 may be a P-type carrier injection layer and include AlInP. The Al composition may be 0.2 to 0.7. As an example, the second clad layer 142 may be $Al_{0.5}In_{0.5}P$. A thickness of the second clad layer 142 may be 300 nm to 700 nm. A dopant doping concentration may be $1.0\times10^{18}/cm^3$ to $2.0\times10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0\times10^{18}/cm^3$ to $2.0\times10^{18}/cm^3$.

The second ohmic layer 149 may include GaP and may be doped with carbon. A thickness of the second ohmic layer 149 may be about 150 nm to 250 nm. A carbon doping concentration may be $5.0\times10^{19}/cm^3$ to $2.0\times10^{20}/cm^3$. When the carbon doping concentration is $5.0\times10^{19}/cm^3$ to $2.0\times10^{20}/cm^3$, an effect of ohmic contact with a metal or ITO may be improved due to an increase in electrical conductivity. The carbon concentration may be increased as the second ohmic layer 149 becomes more distant from the active layer 130.

A plurality of buffer layers may be disposed between the second clad layer 142 and the second current distribution layer 148. A first buffer layer 143 may have a composition of $(Al_{0.85}Ga_{0.15})_{0.5}In_{0.5}P$, a thickness of 150 nm to 250 nm, and a dopant doping concentration of $1.0\times10^{18}/cm^3$ to $2.0\times10^{18}/cm^3$. A second buffer layer 144 may have a composition of $(Al_{0.3}Ga_{0.7})_{0.5}In_{0.5}P$, a thickness of 10 nm to 15 nm, and a dopant doping concentration of $1.0\times10^{18}/cm^3$ to $2.0\times10^{18}/cm^3$. The Al composition in the first buffer layer 143 and the second buffer layer 144 may be gradually reduced to decrease an energy band gap difference between AlGaP and GaP.

A third buffer layer 145 may have a composition of $Ga_{0.75}In_{0.25}P$, a thickness of 20 nm to 40 nm, and a dopant doping concentration of $1.0\times10^{18}/cm^3$ to $2.0\times10^{18}/cm^3$. The third buffer layer 145 may mitigate stress due to a crystal lattice difference between AlGaP and GaP.

A fourth buffer layer 146 may have a GaP composition and enhance thin film quality of the second current distribution layer 148 by adjusting a growth speed and a growth temperature. As an example, a fourth-first buffer layer 146a may be grown at a low speed at about 650° C. and then a fourth-second buffer layer 146b and a fourth-third buffer layer 146c may be formed at an increased growth temperature, 750° C. A thickness of the fourth-first buffer layer 146a may be 10 nm to 15 nm, a thickness of a fourth-second buffer layer 146b may be 40 nm to 60 nm, and a thickness of a fourth-third buffer layer 146c may be 60 nm to 80 nm. A doping concentration of all of the fourth-first to fourth-third buffer layers 146a, 146b, and 146c may be $1.0\times10^{18}/cm^3$ to $2.0\times10^{18}/cm^3$.

The diffusion preventing layer 147 may be fabricated with a low doping concentration, $2.0\times10^{17}/cm^3$ to $3.0\times10^{17}/cm^3$ and prevent diffusion of a dopant such as Mg. A thickness of the diffusion preventing layer 147 may be 150 nm to 250 nm.

Figure 7:
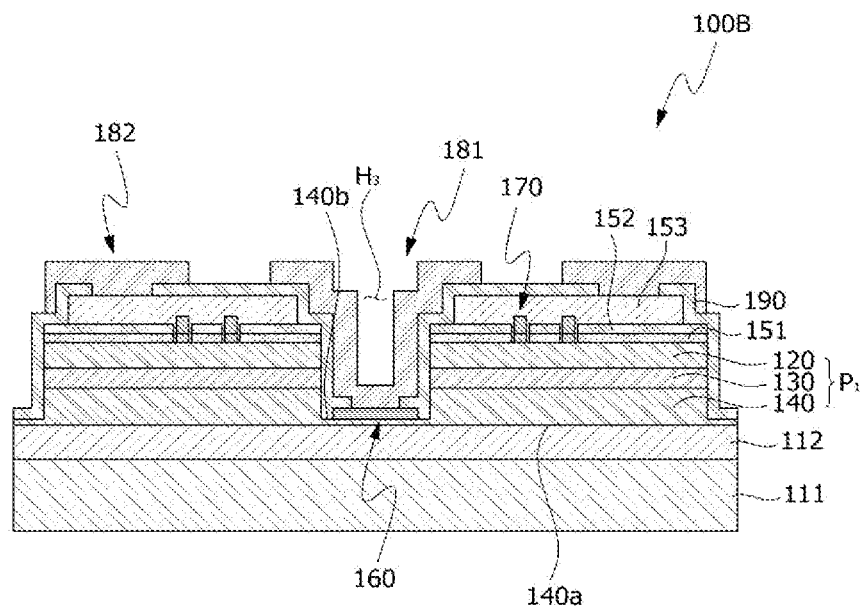
FIG. 7 is a conceptual diagram of a light emitting device according to a second embodiment of the present invention.
Figure 8:
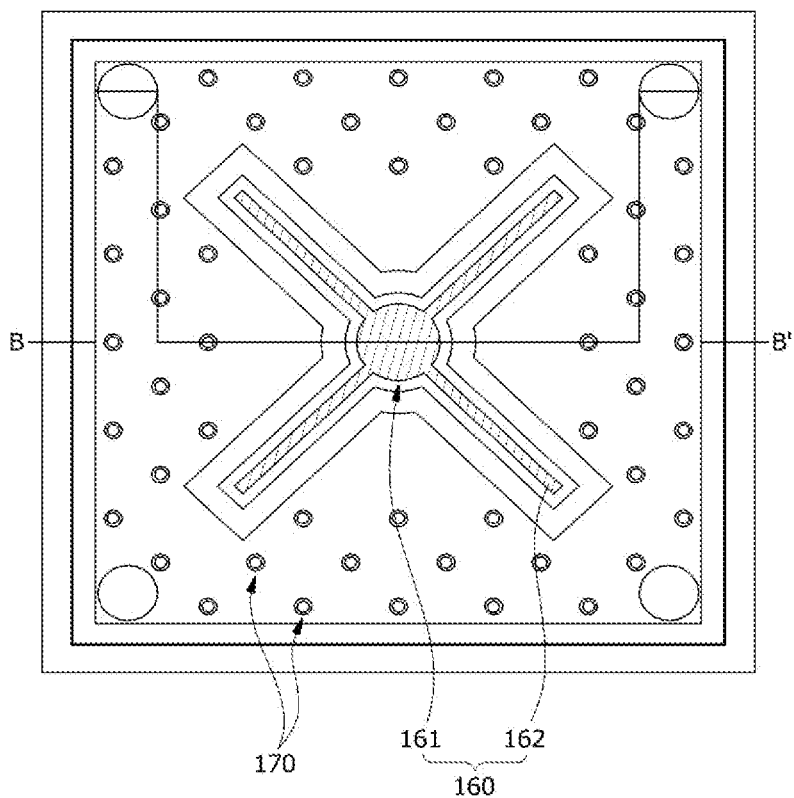
FIG. 8 is a plan view of FIG. 7.
Figure 9:
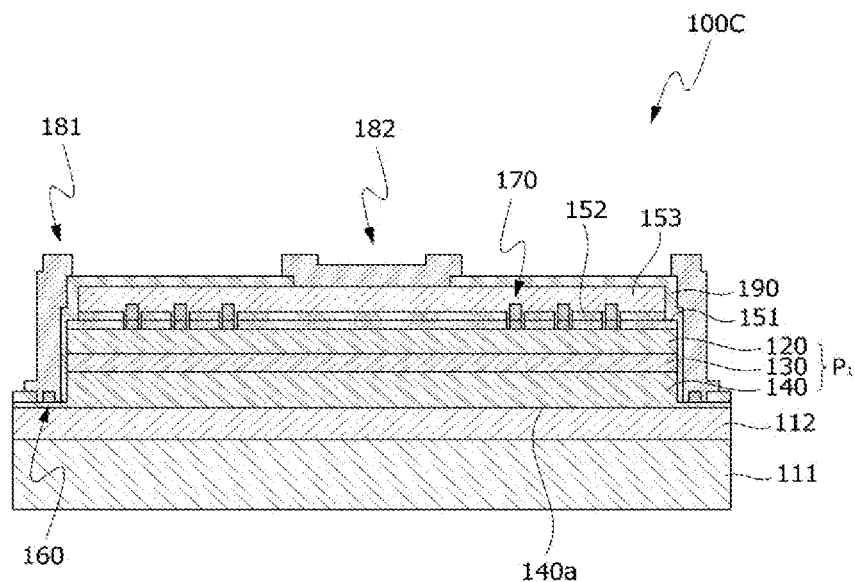
FIG. 9 is a conceptual diagram of a light emitting device according to a third embodiment of the present invention.
Figure 10:
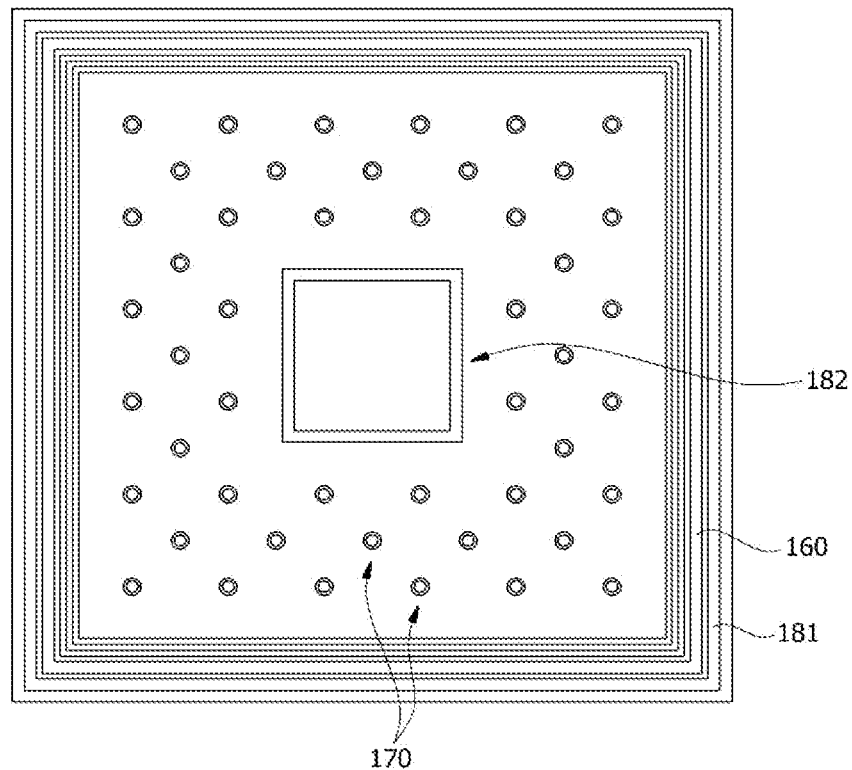
FIG. 10 is a plan view of FIG. 9.
Figure 11:
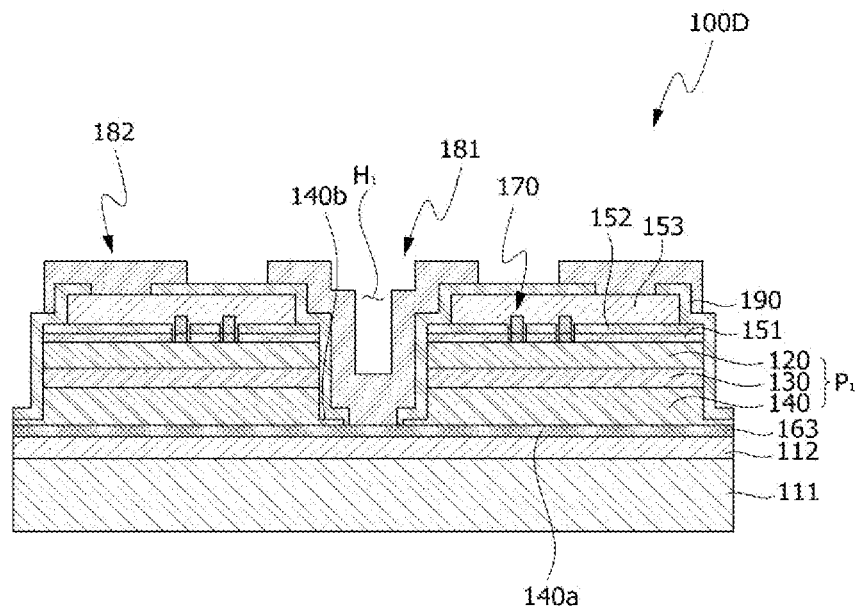
FIG. 11 is a conceptual diagram of a light emitting device according to a fourth embodiment of the present invention.
Figure 12:
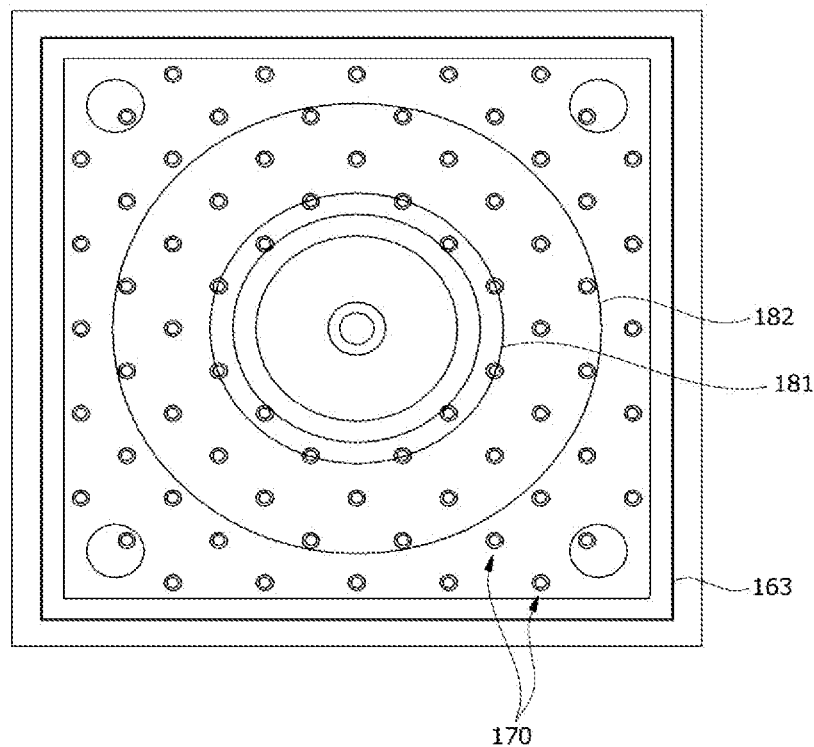
FIG. 12 is a plan view of FIG. 11.

FIG. 7 is a conceptual diagram of a light emitting device according to a second embodiment of the present invention, FIG. 8 is a plan view of FIG. 7, FIG. 9 is a conceptual diagram of a light emitting device according to a third embodiment of the present invention, FIG. 10 is a plan view of FIG. 9, FIG. 11 is a conceptual diagram of a light emitting device according to a fourth embodiment of the present invention, and FIG. 12 is a plan view of FIG. 11.

Referring to FIG. 7, a light emitting device 100B according to the embodiment may have a first ohmic electrode 170 disposed at an inner surface 140b of a second conductive semiconductor layer 140.

A light emitting structure P1 includes an accommodating groove H3 that is formed on a first conductive semiconductor layer 120 and configured to expose a second current distribution layer or a second ohmic layer of the second conductive semiconductor layer 140. A second ohmic electrode 160 may be disposed on a bottom surface of the accommodating groove H3.

The structure of the light emitting structure described above with reference to FIG. 6 may be applied as it is to the present embodiment. Since the thickness of the second current distribution layer is 3000 nm to 4000 nm and the thickness of the second ohmic layer is 150 nm to 250 nm with reference to FIG. 6, a thickness of the second conductive semiconductor layer 140 remaining at a lower portion of the accommodating groove H3 may be 150 nm to 4250 nm.

Referring to FIG. 8, the first ohmic electrode 170 may include a pad electrode 161 disposed at the center and branched electrodes 162, and a groove that corresponds to the shape of the second ohmic electrode 160 may be formed in an insulating layer 190.

Referring to FIGS. 9 and 10, a light emitting device 100C according to an embodiment may have a second electrode 181 formed in a quadrilateral shape and disposed at the center and a first electrode 182 disposed at an edge of the light emitting device. In this case, a second ohmic electrode 160 may also be disposed at an edge of a light emitting structure.

Referring to FIGS. 11 and 12, a light emitting device 100D according to an embodiment may have an ITO layer 163 as a substitute for a second ohmic electrode. Since a second conductive semiconductor layer 140 includes carbon in a surface layer as described above, efficiency of ohmic contact with the ITO layer 163 may be improved.

FIGS. 13 to 24 are views for describing a method of manufacturing a light emitting device according to an embodiment of the present invention.

Figure 13:
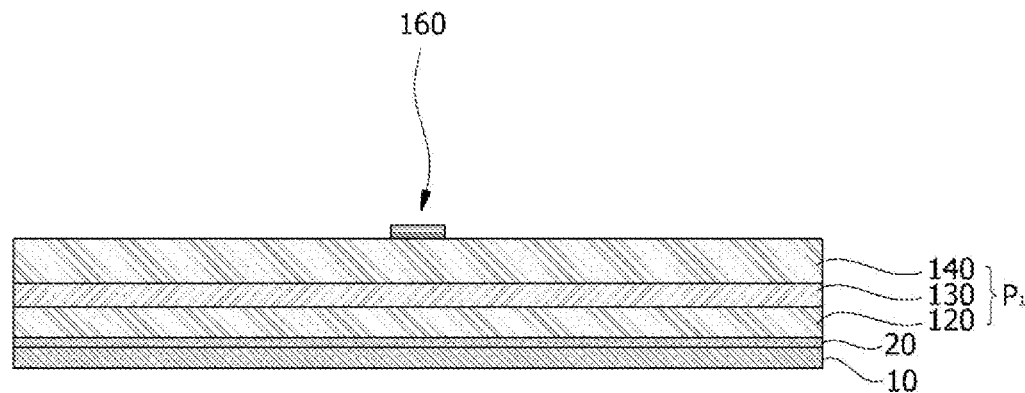
FIGS. 13 to 24 are views for describing a method of manufacturing a light emitting device according to an embodiment of the present invention.
Figure 14:
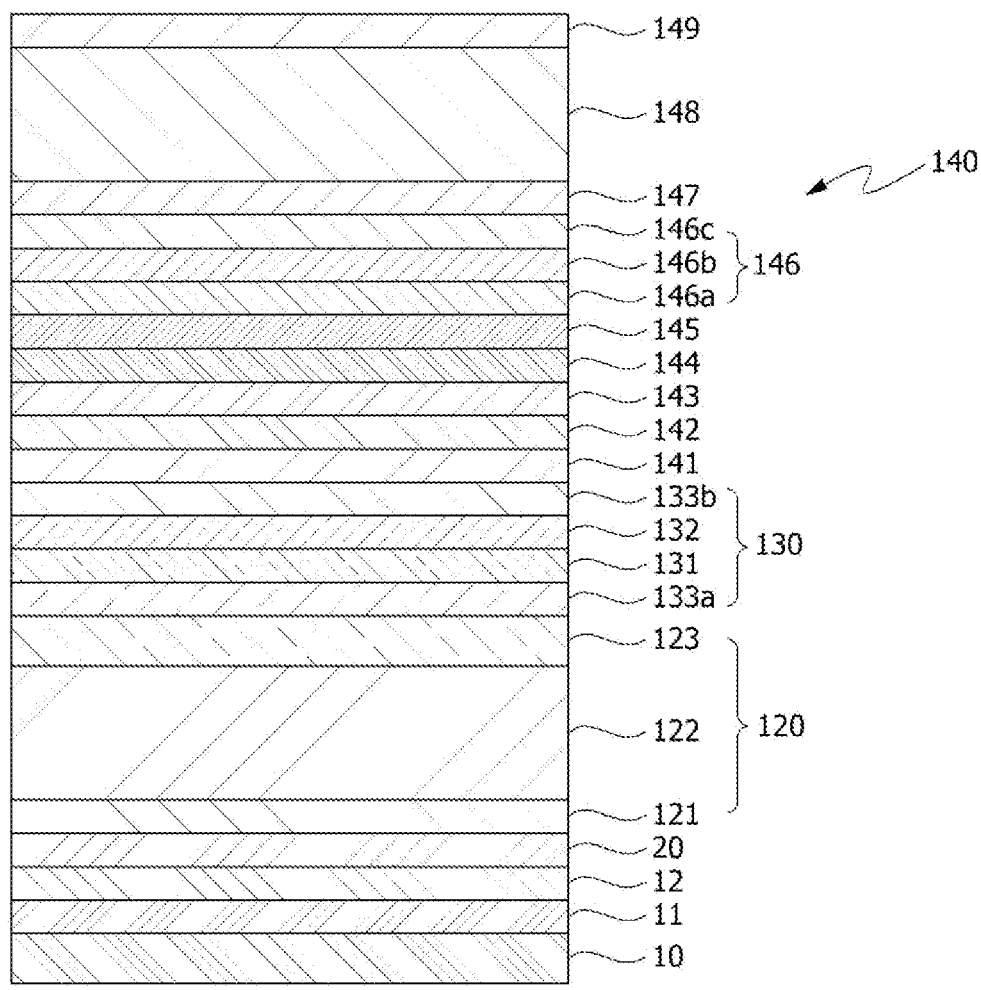

Referring to FIGS. 13 and 14, an etch stop layer 20 may be formed on a growth substrate 10, and a light emitting structure P1 and a first ohmic electrode 170 may be grown on the etch stop layer 20.

The growth substrate 10 may be a GaAs substrate. A thickness of the substrate is 0.5 to 0.8 mm. An off-angle of the growth substrate 10 may be 15° but is not necessarily limited thereto. After the growth substrate 10 is pre-heated, stress mitigating layers 11 and 12 are formed. The stress mitigating layers 11 and 12 may have a GaAs composition and a thickness of 200 nm to 400 nm. The stress mitigating layers 11 and 12 may be doped with a dopant as necessary.

Then, the etch stop layer 20 may be formed. The etch stop layer 20 may have a GaInP composition and may be doped with an n-type dopant as necessary. The etch stop layer 20 may be formed to have a thickness of about 100 nm to 200 nm.

A first clad layer 123 may be an n-type carrier injection layer and include AlInP. The Al composition may be 0.2 to 0.7. As an example, the first clad layer 123 may be $Al_{0.5}In_{0.5}P$. A thickness of the first clad layer 123 may be 300 nm to 700 nm.

A first current distribution layer 122 serves to distribute a current injected through an electrode. The first current distribution layer 122 may have an energy band gap that is smaller than that of the first clad layer 123 and larger than that of a first ohmic layer 121. The first current distribution layer 122 may include AlGaInP. As an example, the first current distribution layer 122 may be formed to have a composition of $(Al_{0.4}Ga_{0.6})_{0.5}In_{0.5}P$.

The first current distribution layer 122 may be fabricated to have a thickness of 2500 nm to 3000 nm. Irregularities may be formed on a surface of the first current distribution layer 122 to improve light extraction efficiency. The irregularities may be formed by dry etching.

The first ohmic layer 121 may include GaAs and may be doped with an n-type dopant such as Si, Ge, Sn, Se, and Te. A thickness of the first ohmic layer 121 may be about 20 nm to 50 nm. Since an energy band gap of the first ohmic layer 121 is smaller than that of the first current distribution layer 122, ohmic contact may be facilitated. As an example, the energy band gap of the first ohmic layer 121 may be 1.4 eV.

An active layer 130 may include a plurality of well layers 131 and a plurality of barrier layers 132 which are alternately formed. The number of well layer 131/barrier layer 132 pairs may be 20 but is not necessarily limited thereto.

As an example, the well layer 131 may be $(Al_{0.1}Ga_{0.9})_{0.5}In_{0.5}P$, and the barrier layer 132 may be $(Al_{0.7}Ga_{0.3})_{0.5}In_{0.5}P$. A thickness of the well layer 131 may be about 5 nm to 10 nm, and a thickness of the barrier layer 132 may be 10 to 20 nm. The active layer 130 may include outermost barrier layers 133a and 133b disposed adjacent to the first conductive semiconductor layer 120 and the second conductive semiconductor layer 140. The outermost barrier layers 133a and 133b may have a composition of $(Al_{0.1}Ga_{0.9})_{0.5}In_{0.5}P$ and a thickness of 40 nm to 60 nm.

A diffusion preventing layer 141 may be disposed between the active layer 130 and the second conductive semiconductor layer 140. The diffusion preventing layer 141 may prevent diffusion of a dopant of the second conductive semiconductor layer 140 to the active layer 130. The diffusion preventing layer 141 may have a composition of $Al_{0.5}In_{0.5}P$ and a thickness of 200 nm to 300 nm.

The second conductive semiconductor layer 140 may be formed of a semiconductor material having an empirical formula of, for example, $In_xAl_yGa_{1-x-y}N$ ($0 \leq x \leq 1$, $0 \leq y \leq 1$, $0 \leq x+y \leq 1$).

The second conductive semiconductor layer 140 may include a second clad layer 142, a second current distribution layer 148, and a second ohmic layer 149.

The second clad layer 142 may be a P-type carrier injection layer and include AlInP. The Al composition may be 0.2 to 0.7. As an example, the second clad layer 142 may be $Al_{0.5}In_{0.5}P$. A thickness of the second clad layer 142 may be 300 nm to 700 nm. A dopant doping concentration may be $1.0 \times 10^{18}/cm^3$ to $2.0 \times 10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0 \times 10^{18}/cm^3$ to $2.0 \times 10^{18}/cm^3$.

The second ohmic layer 149 may include GaP and may be doped with carbon. A thickness of the second ohmic layer 149 may be about 150 nm to 250 nm. A carbon doping concentration may be $5.0 \times 10^{19}/cm^3$ to $2.0 \times 10^{20}/cm^3$. When the carbon doping concentration is $5.0 \times 10^{19}/cm^3$ to $2.0 \times 10^{20}/cm^3$, an effect of ohmic contact with a metal or ITO may be improved due to an increase in electrical conductivity.

A plurality of buffer layers may be disposed between the second clad layer 142 and the second current distribution layer 148. A first buffer layer 143 may have a composition of $(Al_{0.85}Ga_{0.15})_{0.5}In_{0.5}P$, a thickness of 150 nm to 250 nm, and a dopant doping concentration of $1.0 \times 10^{18}/cm^3$ to $2.0 \times 10^{18}/cm^3$. A second buffer layer 144 may have a composition of $(Al_{0.3}Ga_{0.7})_{0.5}In_{0.5}P$, a thickness of 10 nm to 15 nm, and a dopant doping concentration of $1.0 \times 10^{18}/cm^3$ to $2.0 \times 10^{18}/cm^3$. The first buffer layer 143 and the second buffer layer 144 may decrease an energy band gap difference between AlGaP and GaP.

A third buffer layer 145 may have a composition of $Ga_{0.75}In_{0.25}P$, a thickness of 20 nm to 40 nm, and a dopant doping concentration of $1.0 \times 10^{18}/cm^3$ to $2.0 \times 10^{18}/cm^3$. The third buffer layer 145 may mitigate stress due to a crystal lattice difference between AlGaP and GaP.

A fourth buffer layer 146 may have a GaP composition and enhance thin film quality of the second current distribution layer 148 by adjusting a growth speed and a growth temperature. As an example, a fourth-first buffer layer 146a may be grown at about 650° C. and then a fourth-second buffer layer 146b and a fourth-third buffer layer 146c may be formed at an increased growth temperature, 750° C. A thickness of the fourth-first buffer layer 146a may be 10 nm to 15 nm, a thickness of a fourth-second buffer layer 146b may be 40 nm to 60 nm, and a thickness of a fourth-third buffer layer 146c may be 60 nm to 80 nm. A doping concentration of all of the fourth-first buffer layer to the fourth-third buffer layer 146c may be $1.0\times10^{18}/cm^3$ to $2.0\times10^{18}/cm^3$.

The diffusion preventing layer 141 may be fabricated with a low doping concentration, $2.0\times10^{17}/cm^3$ to $3.0\times10^{17}/cm^3$ and prevent diffusion of a dopant such as Mg. A thickness of the diffusion preventing layer 141 may be 150 nm to 250 nm.

Figure 15:
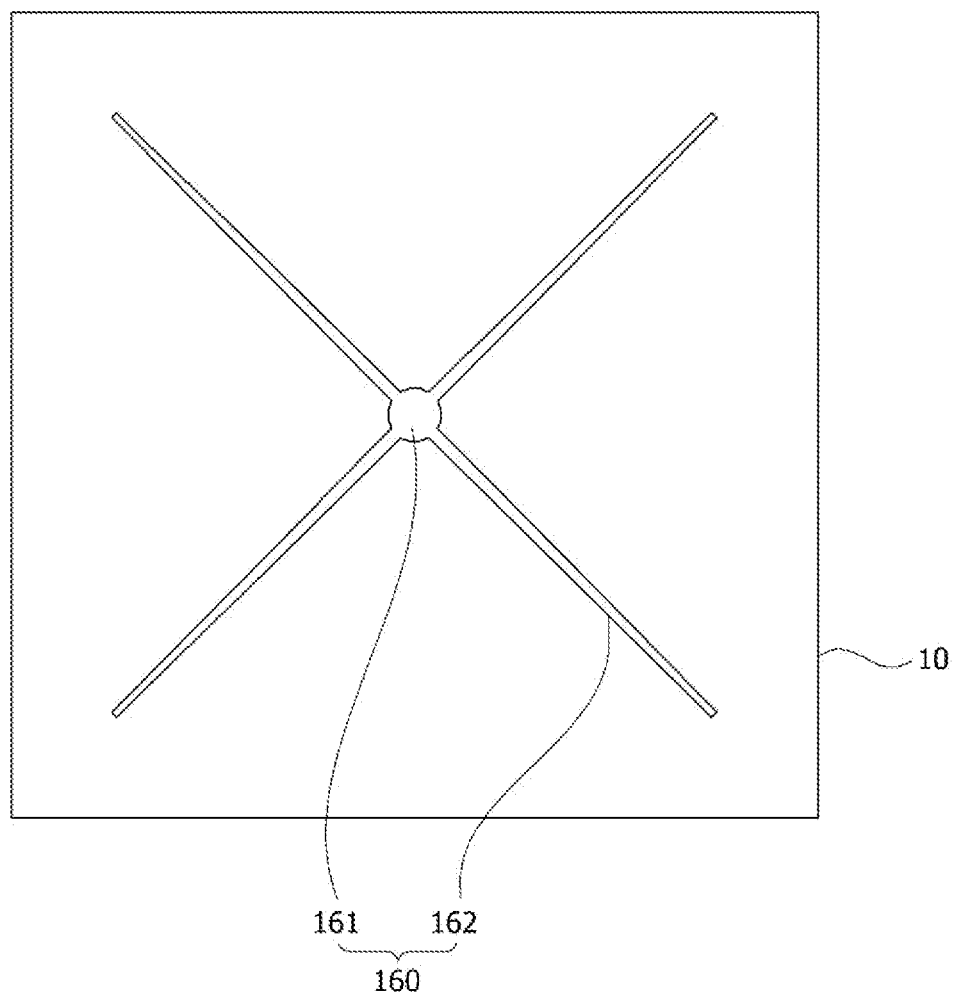

Referring to FIG. 15, the second ohmic electrode 160 may include a pad electrode 161 formed at the center and branched electrodes 162 which extend to each corner. The second ohmic electrode 160 may be formed in a range of 2% to 7% of the area of the second conductive semiconductor layer 140.

Figure 16:
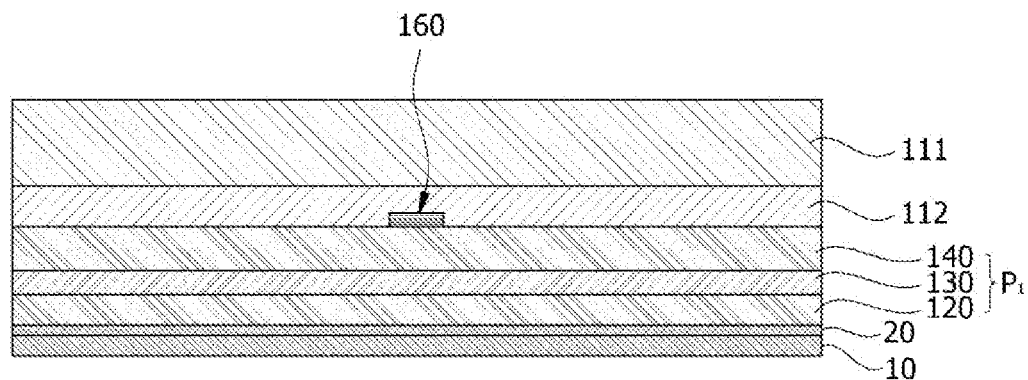

Referring to FIG. 16, an optical layer 112 and a light transmitting substrate 111 may be formed on the second ohmic electrode 160. Specifically, after resin such as PC, PMMA, and silicone is applied on the light emitting structure P1, the light transmitting substrate 111 may be formed thereon to cover the resin and be hardened.

Then, the growth substrate 10 may be removed. The growth substrate 10 may be removed using a wet-etching method. Various etching solutions capable of selectively removing GaAs may be selected as an etching solution. As an example, the etching solution may be an ammonia solution.

The etching solution may remove GaAs but does not etch GaInP. Therefore, the growth substrate 10 may be selectively removed using the etching solution. Then, the etch stop layer 20 may be removed. A method of removing the etch stop layer 20 is not particularly limited. As an example, the etch stop layer 20 may be removed using polishing.

Figure 17:
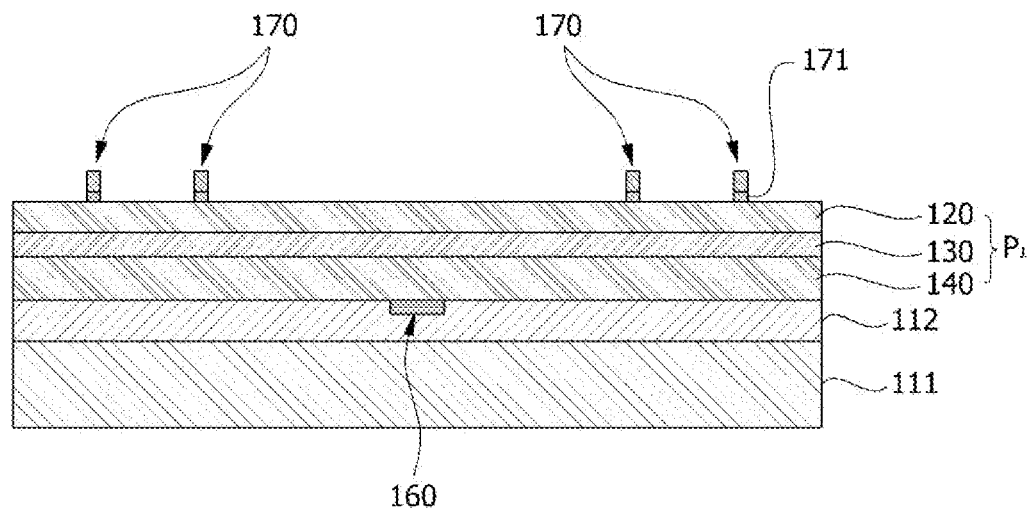

Referring to FIG. 17, the first ohmic electrode 170 is formed on the first conductive semiconductor layer 120 which is exposed due to the removal of the growth substrate 10. In this case, first, a sub-layer 171 including the GaAs composition may be formed, and then the first ohmic electrode 170 may be formed thereon. Then, a region in which the first ohmic electrode 170 is not formed may be removed.

Figure 18:
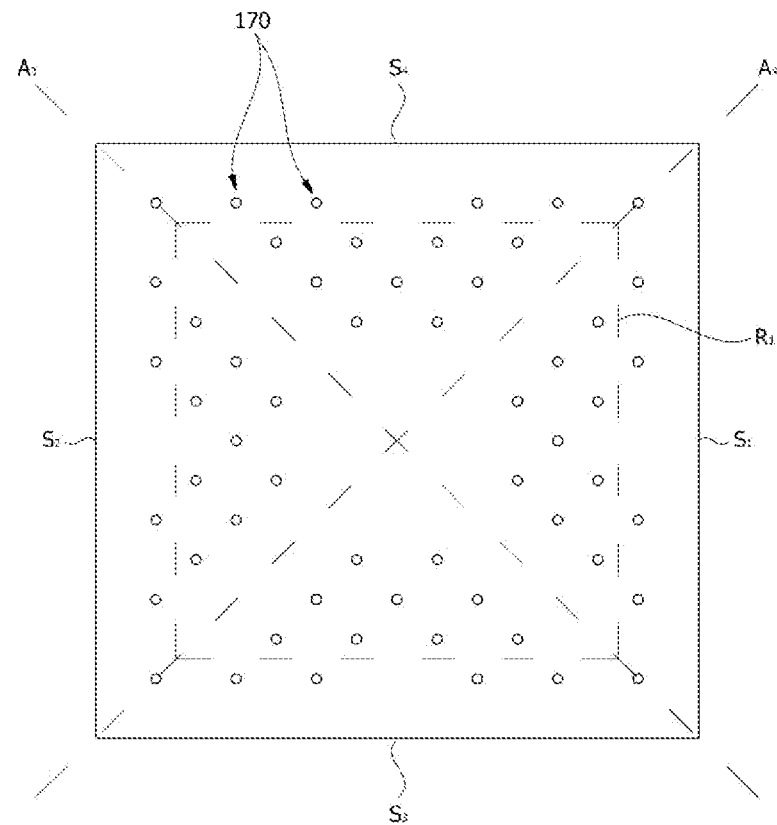

Referring to FIG. 18, the first ohmic electrode 170 may be formed in portions defined by a virtual quadrilateral shape R1 and two virtual lines A3 and A4 which connect corners of the quadrilateral shape. That is, the first ohmic electrode 170 and the second ohmic electrode 160 do not overlap with each other in plan view. The quadrilateral shape R1 may be in a range of 80% to 90% of the outermost quadrangle.

Figure 19:
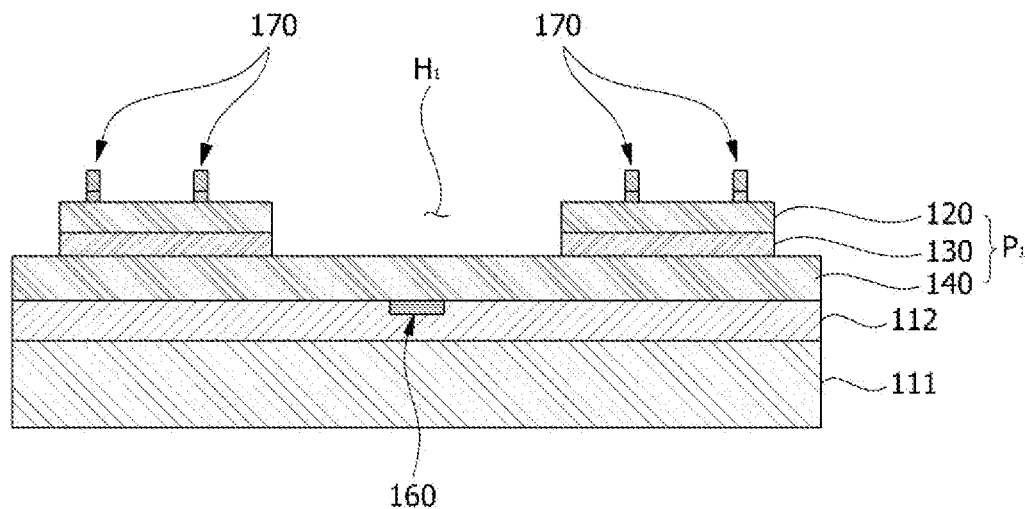
Figure 20:
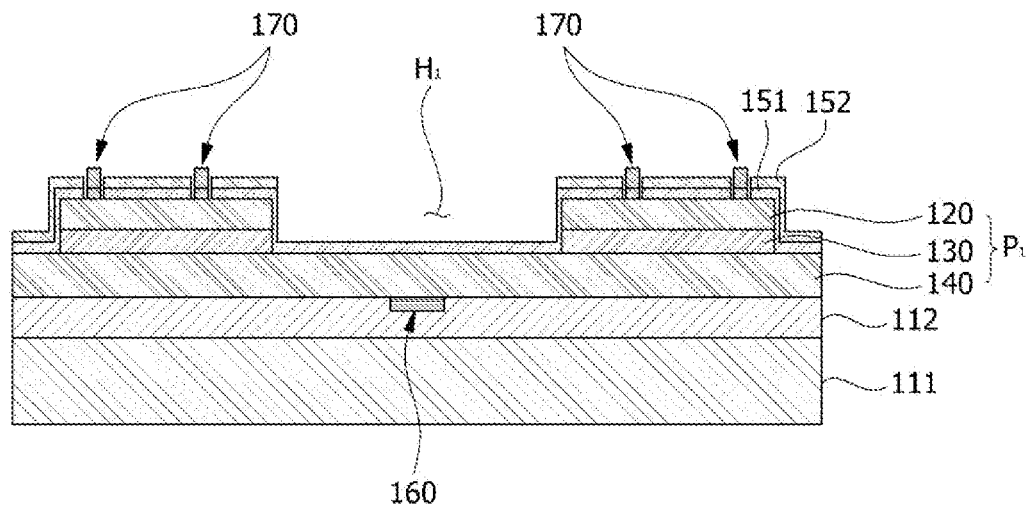
Figure 21:
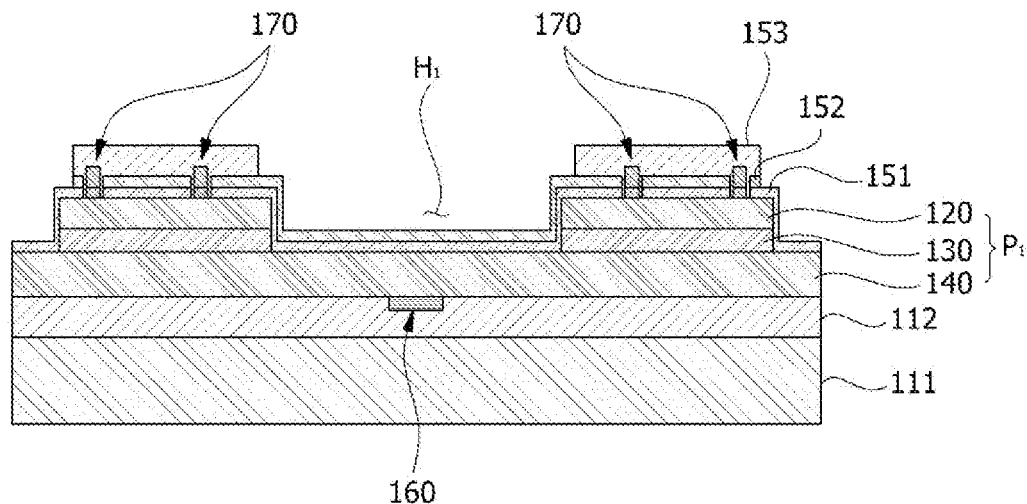
Figure 22:
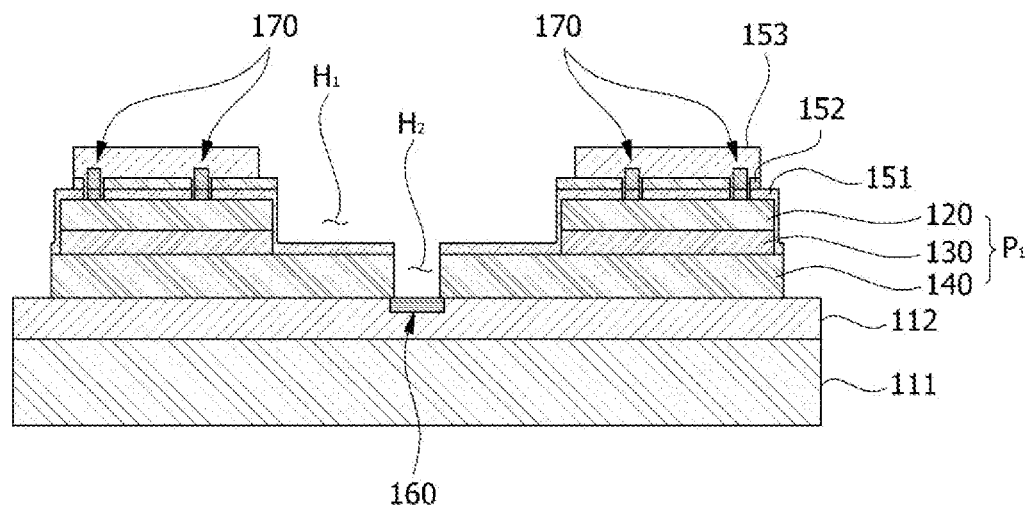

Referring to FIGS. 19 to 21, the first conductive semiconductor layer 120 and the active layer 130 are etched to form a first through-hole H1, and then a first reflective layer 151 and a transparent electrode layer 152 are formed thereon. Then, a second reflective layer 153 is formed as in FIG. 21. Then, the center is etched again as in FIG. 22 to form a second through-hole H2 and expose the second ohmic electrode 160.

Figure 23:
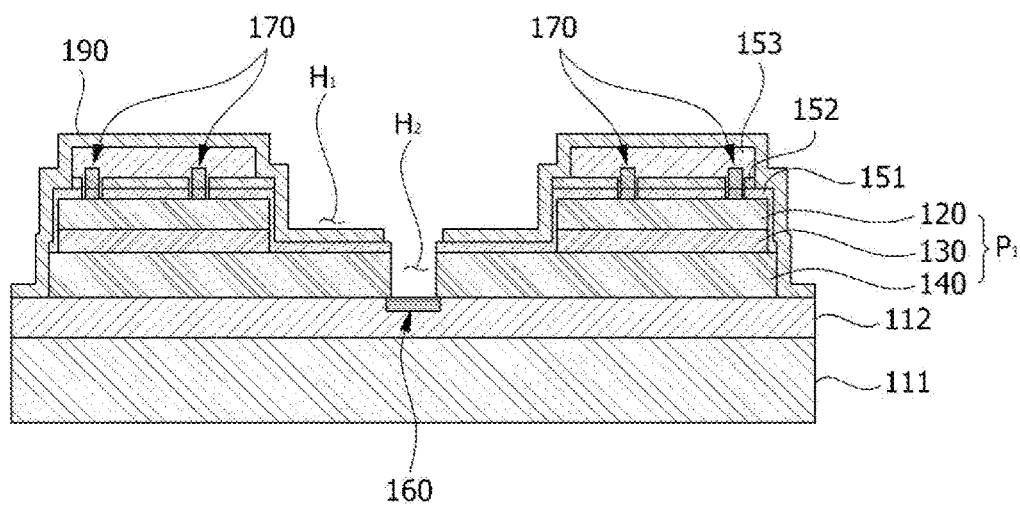
Figure 24:
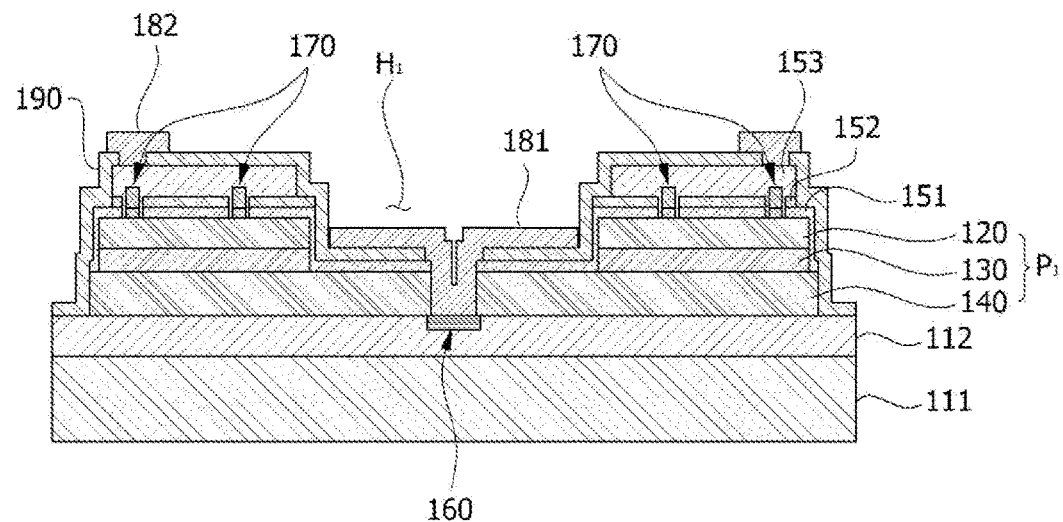

Then, after the insulating layer 190 is formed at an entire upper portion as in FIG. 23, the first electrode 182 and the first conductive semiconductor layer 120 may be electrically connected through the first ohmic electrode 170, and the second electrode 181 and the second conductive semiconductor layer 140 may be electrically connected through the second ohmic electrode 160.

Figure 25:
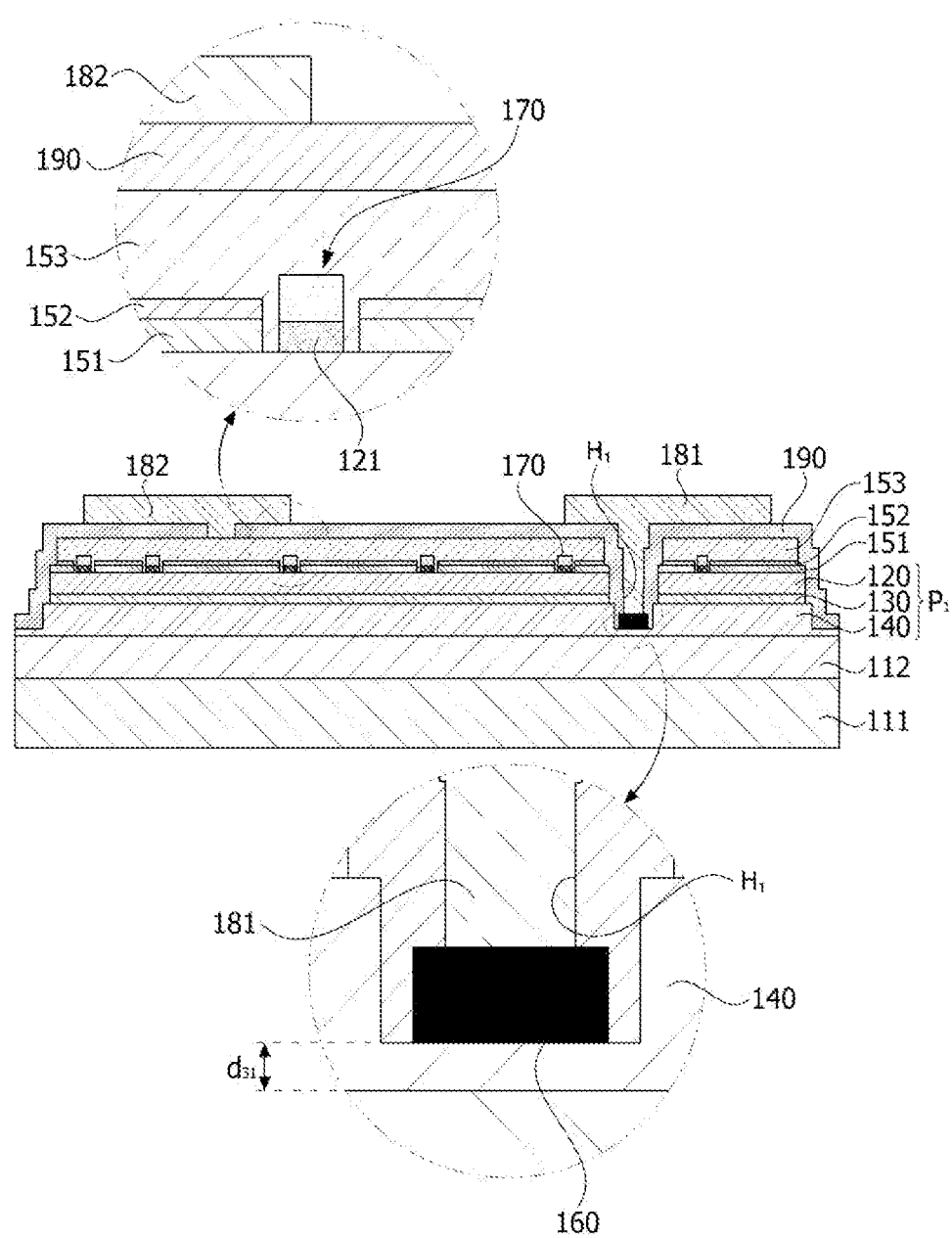
FIG. 25 is a conceptual diagram of a light emitting device according to a fifth embodiment of the present invention.
Figure 26:
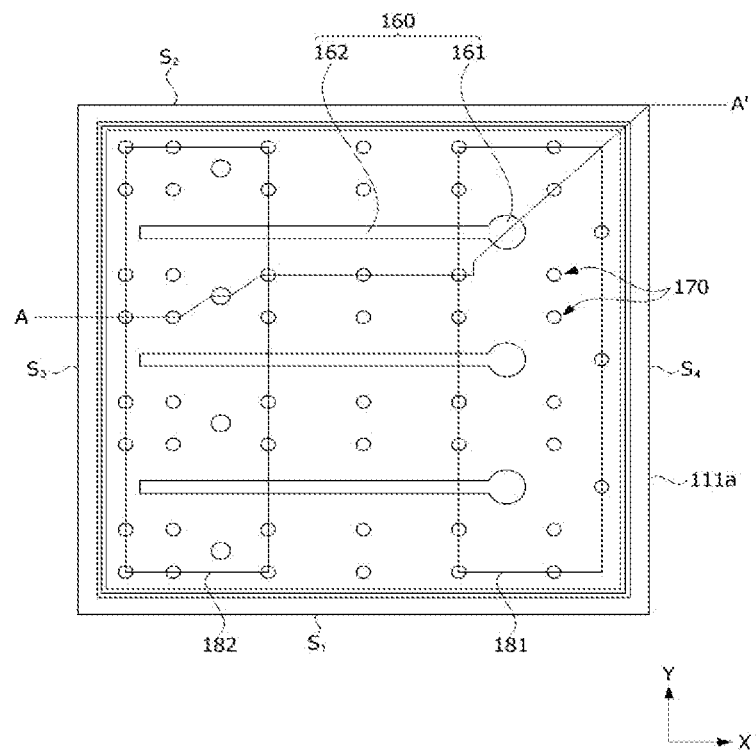
FIG. 26 is a plan view of FIG. 25.

FIG. 25 is a conceptual diagram of a light emitting device according to a fifth embodiment of the present invention, FIG. 26 is a plan view of FIG. 25, and FIG. 27 is a modified example of FIG. 26.

Referring to FIG. 25, a light emitting device includes a light emitting structure P1, an insulating layer 190 disposed at the other side of the light emitting structure P1, a first electrode 182 electrically connected to a first conductive semiconductor layer 120 through the insulating layer 190, and a second electrode 181 electrically connected to a second conductive semiconductor layer 140.

The light emitting structure P1 includes the first conductive semiconductor layer 120, an active layer 130, and the second conductive semiconductor layer 140. A type of wavelength of the light emitting structure P1 is not particularly limited. Hereinafter, description will be given by assuming that light output from the light emitting structure P1 is light in a red wavelength band.

A first reflective layer 151 may be disposed on the first conductive semiconductor layer 120. The first reflective layer 151 may be an ODR formed of at least one selected from a compound, a mixture, an oxide, and a nitride containing Si, Ti, Mg, Al, Zn, In, Sn, and C. However, embodiments are not necessarily limited thereto, and an insulating layer or a reflective layer formed of various other materials may be applied as the first reflective layer 151. The first reflective layer 151 may be ITO.

A plurality of first ohmic electrodes 170 may come into contact with the first conductive semiconductor layer 120 through the first reflective layer 151. A first ohmic layer 121 of the first conductive semiconductor layer 120 may have a GaAs composition with a low energy band gap. Therefore, contact resistance between the first conductive semiconductor layer 120 and the first ohmic electrode 170 may be reduced. Since the first ohmic layer 121 absorbs light in a red wavelength band, a region other than a region in which the first ohmic electrode 170 is formed may be removed. An area of the first ohmic layer 121 may be 2% to 7% of an entire area of the second conductive semiconductor layer. When the area of the first ohmic layer 121 exceeds 7%, there is a problem in that the first ohmic layer 121 excessively absorbs infrared light and the light output is decreased. When the area of the first ohmic layer 121 is less than 2%, there is a problem in that an ohmic contact area is reduced.

A transparent electrode layer 152 may be disposed on the first reflective layer 151. The transparent electrode layer 152 may be formed of a material having excellent electrical conductivity so that a current injected from the outside is able to be evenly spread horizontally.

The transparent electrode layer 152 may be formed of TCO. The TCO may be selected from ITO, IZO, AZO, AGZO, IZTO, IAZO, IGZO, IGTO, ATO, GZO, IZON, ZnO, IrOx, RuOx, NiO, and the like. However, embodiments are not necessarily limited thereto, and the first reflective layer 151 and the transparent electrode layer 152 may also be configured as a single layer. As an example, the first reflective layer 151 and the transparent electrode layer 152 may include an ITO layer, but embodiments are not necessarily limited thereto.

A second reflective layer 153 may be formed of a material having high reflectance such as Ag, Ni, Al, Rh, Pd, Ir, Ru, Mg, Zn, Pt, Au, Hf, and the like or may be formed of a mixture of the material having high reflectance and a transparent conductive material such as IZO, IZTO, IAZO, IGZO, IGTO, AZO, and ATO.

The insulating layer 190 may be disposed on the light emitting structure P1. The insulating layer 190 may be formed of at least one selected from the group consisting of SiO$_2$, Si$_x$O$_y$, Si$_3$N$_4$, Si$_x$N$_y$, SiO$_x$N$_y$, Al$_2$O$_3$, TiO$_2$, AlN, and the like, but embodiments are not limited thereto. The insulating layer 190 may be formed of a single layer or multiple layers. As an example, the insulating layer 190 may have a DBR structure in which a high refractive index layer and a low refractive index layer are alternately stacked.

The insulating layer 190 may extend to a sidewall of a groove H1 formed in the light emitting structure P1 and may electrically insulate the second electrode 181 and the active layer 130 from each other.

The second ohmic electrode 160 may come into contact with the second conductive semiconductor layer 140. The second conductive semiconductor layer 140 coming into contact with the second ohmic electrode 160 may have a GaP composition. Therefore, since an energy band gap of GaP is relatively low, contact resistance between the second conductive semiconductor layer 140 and the second ohmic electrode 160 may be decreased. A thickness d31 between the second ohmic electrode 160 and the first conductive semiconductor layer 20 may be 150 nm to 4250 nm.

The first ohmic electrode 170 and the second ohmic electrode 160 may be formed to include at least one of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, and Hf, but materials of the first ohmic electrode 170 and the second ohmic electrode 160 are not limited thereto.

An optical layer 112 may be formed at one side of the light emitting structure P1 and adhere the light transmitting substrate 111 and the light emitting structure P1 to each other. The optical layer 112 may be resin such as PC and PMMA and may also be an OCA. A material of the optical layer 112 is not particularly limited as long as the material transmits visible light.

The light transmitting substrate 111 may be an insulating substrate. The light transmitting substrate 111 may be formed of a material selected from sapphire (Al$_2$O$_3$), SiC, GaN, ZnO, Si, GaP, InP, and Ge, but the material of the light transmitting substrate 111 is not particularly limited as long as the material transmits visible light.

A thickness of the light transmitting substrate 111 may be 100 um to 1000 um. Therefore, light may also be output to a side of the light transmitting substrate 111, and light extraction efficiency may be improved. A plurality of irregularities may be formed on the light transmitting substrate 111. The irregularities may improve the light extraction efficiency.

Referring to FIG. 26, in plan view, a light emitting device according to an embodiment may have a quadrilateral shape having four sides S1, S2, S3, and S4. In plan view, a first electrode 182 and a second electrode 181 may have a rectangular shape and be spaced apart from each other.

A plurality of second ohmic electrodes 160 may include a pad electrode 161 disposed on the second electrode 181 and branched electrodes 162 which extend from the pad electrode 161 toward the first electrode 182.

In plan view, a first ohmic electrode 170 may overlap with the first electrode 182 and the second electrode 181. In plan view, the second ohmic electrode 160 may overlap with the first electrode 182 and the second electrode 181. In this case, in plan view, the first ohmic electrode 170 and the second ohmic electrode 160 may not overlap with each other. However, embodiments are not necessarily limited thereto, and when a separate insulator is provided, the first ohmic electrode 170 and the second ohmic electrode 160 may overlap with each other in plan view.

Figure 27A:
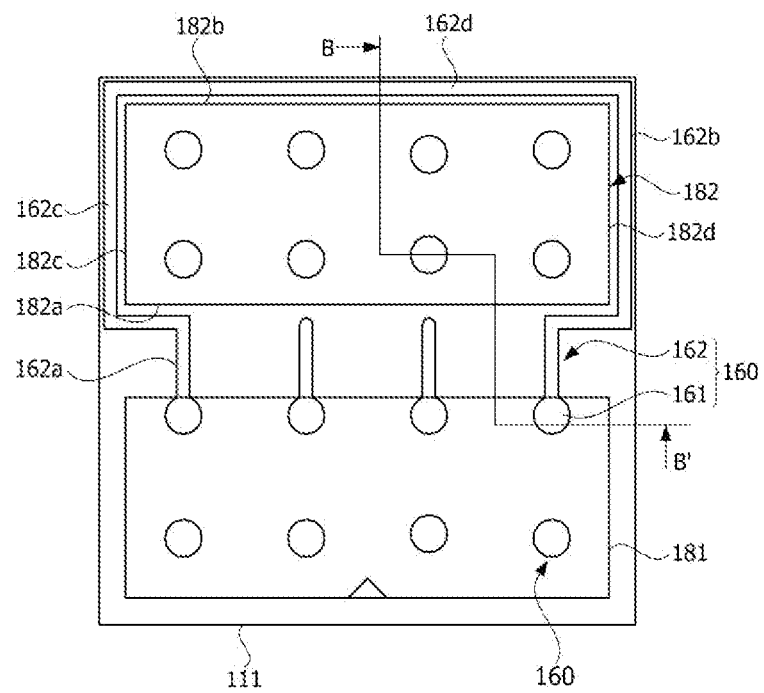
FIG. 27A is a first modified example of the light emitting device according to the fifth embodiment of the present invention.
Figure 27B:
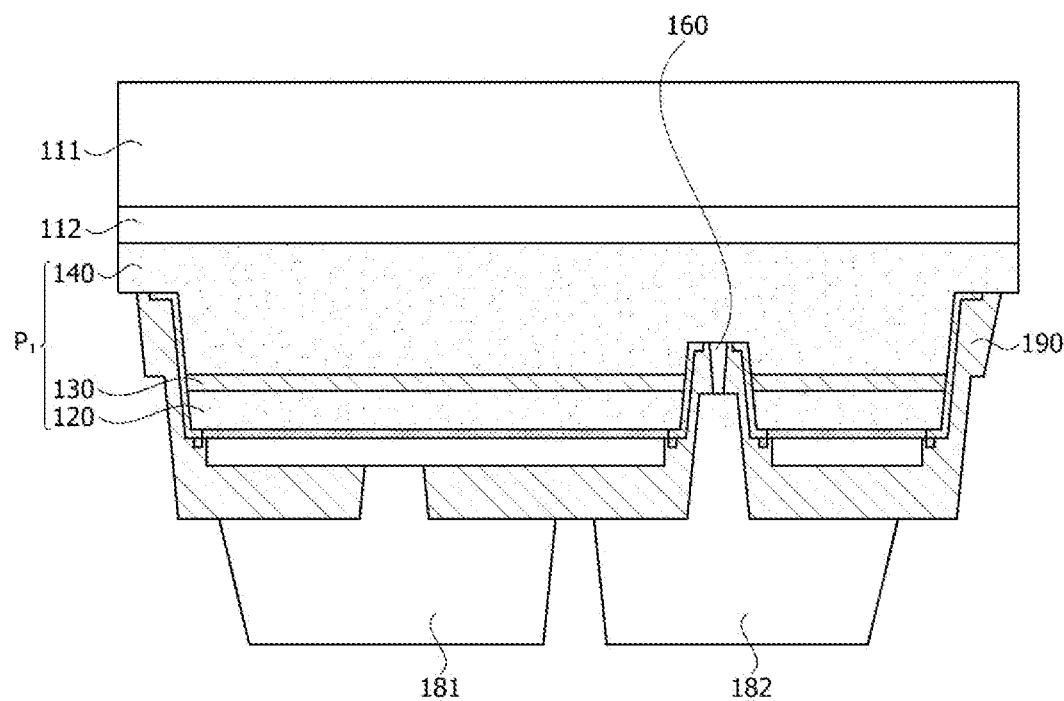
FIG. 27B is a cross-sectional view taken along line B-B' in FIG. 27A.
Figure 27C:
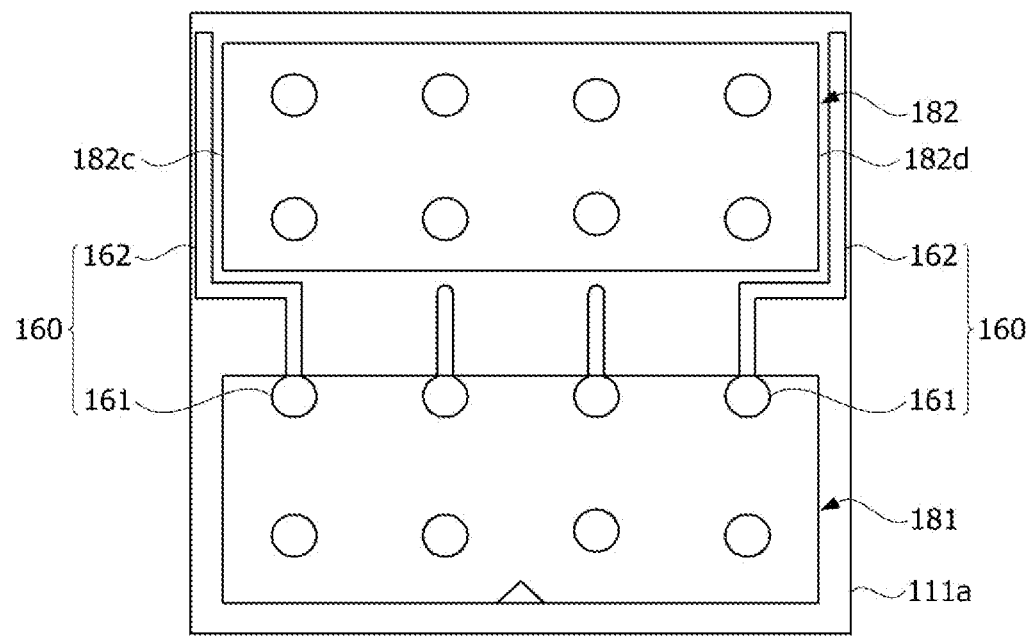
FIG. 27C is a second modified example of the light emitting device according to the fifth embodiment of the present invention.
Figure 27D:
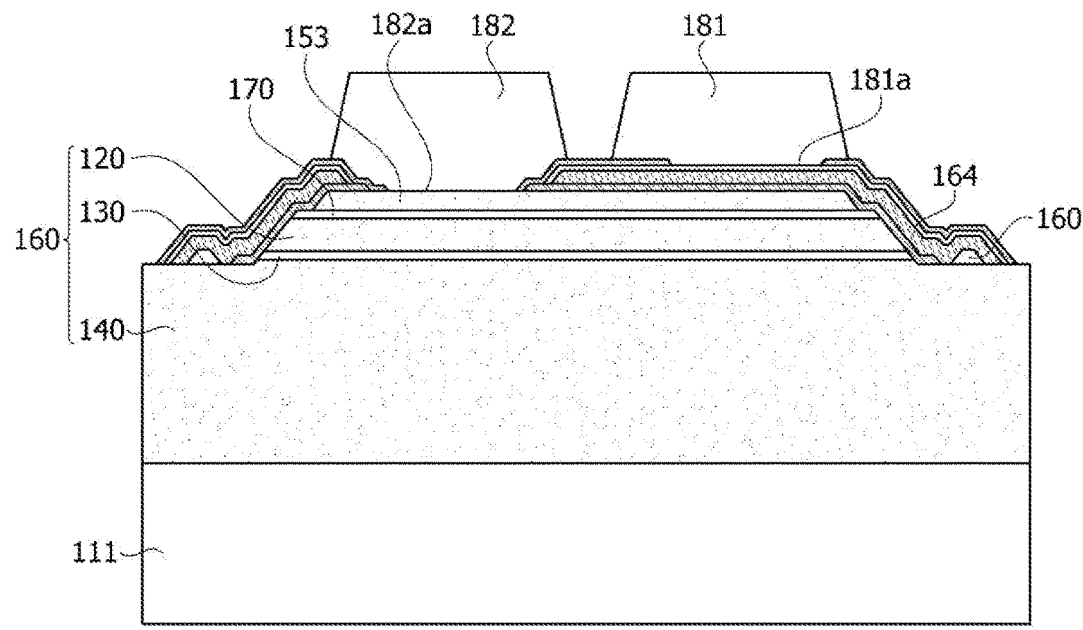
FIG. 27D is a third modified example of the light emitting device according to the fifth embodiment of the present invention.
Figure 27E:
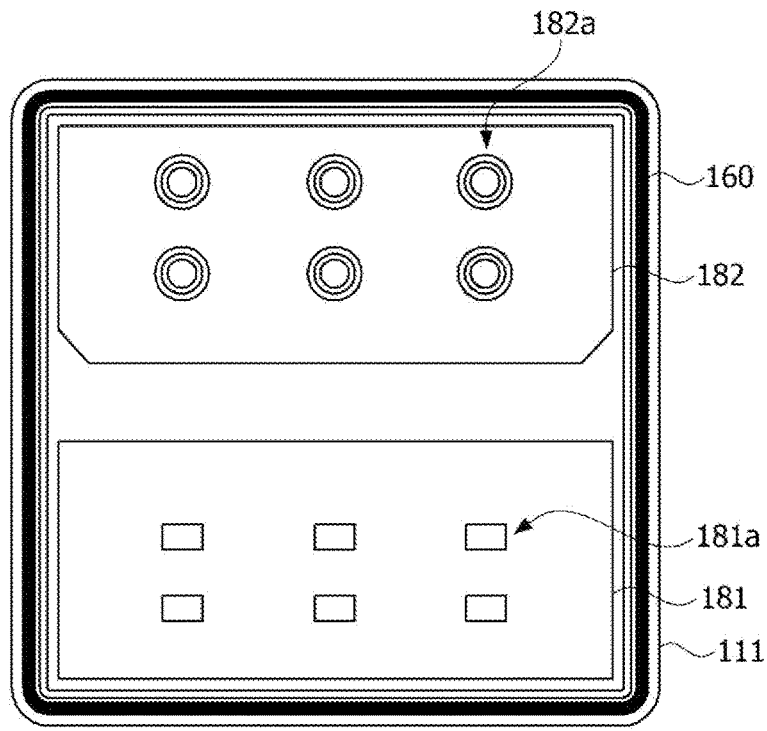
FIG. 27E is a plan view of FIG. 27D.
Figure 27F:
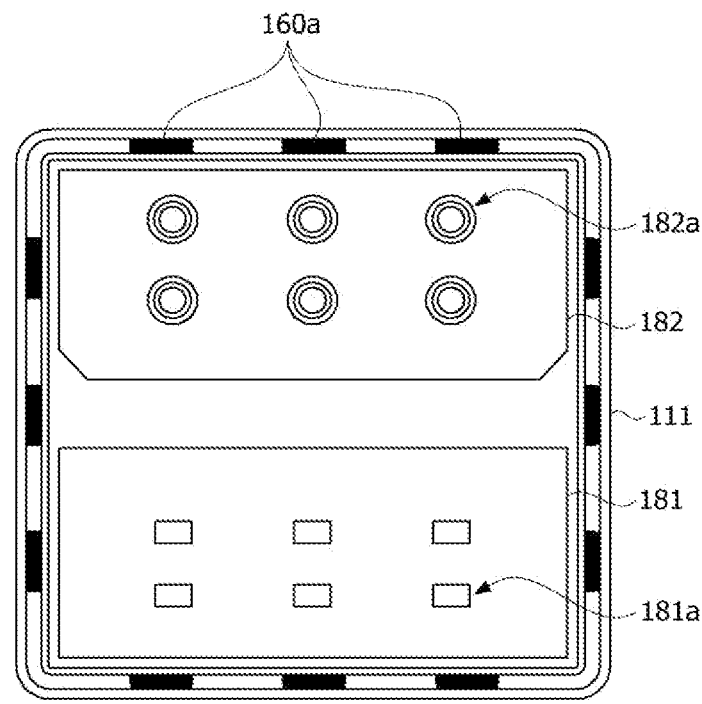
FIG. 27F is a fourth modified example of the light emitting device according to the fifth embodiment of the present invention.

FIG. 27A is a first modified example of the light emitting device according to the fifth embodiment of the present invention, FIG. 27B is a cross-sectional view taken along line B-B' in FIG. 27A, FIG. 27C is a second modified example of the light emitting device according to the fifth embodiment of the present invention, FIG. 27D is a third modified example of the light emitting device according to the fifth embodiment of the present invention, FIG. 27E is a plan view of FIG. 27D, and FIG. 27F is a fourth modified example of the light emitting device according to the fifth embodiment of the present invention.

A shape of a second ohmic electrode may be deformed to various shapes. Referring to FIGS. 27A and 27B, a second ohmic electrode 160 includes a plurality of pad electrodes 161 disposed on a second electrode 181 and branched electrodes 162 electrically connected to the pad electrodes 161.

A branched electrode 162 disposed at the outermost side may include a first region 162a which extends toward the first electrode 182 and second regions 162b and 162c which are bent along a side of the first electrode 182. That is, in plan view, the branched electrode 162 does not overlap with the first electrode 182. Therefore, even when a crack is formed in an insulating layer 190 due to an external impact or the like, a problem in that the first electrode 182 and the second ohmic electrode 160 are disconnected may be improved.

In plan view, a light emitting structure may have a rectangular shape, and the first electrode 182 may have a quadrilateral shape including four sides. The first electrode 182 may include a first surface 182a and a second surface 182b which face each other and a third surface 182c and a fourth surface 182d which face each other and connect the first surface 182a and the second surface 182b.

The first region 162a of the branched electrode 162 may extend toward the first surface 182a. The second regions 162b and 162c may be bent along the first surface 182a and extend between the third surface 182c and an edge 111a (a side of a transparent substrate) of the light emitting device or extend between the fourth surface 182d and the edge 111a of the light emitting device.

The branched electrode 162 may further include a third region 162d which is bent along the third surface 182c or the fourth surface 182d and surrounds the second surface 182b. However, embodiments are not necessarily limited thereto, and as in FIG. 27C, the branched electrode 162 may have a shape that is bent along both sides 182c and 182d of an electrode without a third region.

Referring to FIGS. 27D and 27E, a second ohmic electrode 160 may be disposed at an edge of a second conductive semiconductor layer 130. In this case, a conductive reflective layer 164 may be disposed between a second electrode 181 and the second ohmic electrode 160. The conductive reflective layer 164 may be electrically connected to the second ohmic electrode 160.

Since the second conductive semiconductor layer 130 has an AlGaInP composition and has a relatively low Al composition, the second conductive semiconductor layer 130 may serve as a low resistance layer. Therefore, a current distribution effect may be sufficient even when the second ohmic electrode 160 is only disposed at an outer boundary of the second conductive semiconductor layer 130.

Referring to FIG. 27F, a second ohmic electrode 160 may be divided into a plurality of electrodes 160a. Since each of the plurality of electrodes 160a are electrically connected to a conductive reflective layer 164, current injection may be possible. In this case, a contact area with a second conductive semiconductor layer 130 may be further decreased.

In plan view, an area of the second ohmic electrode 160 may be 0.1% to 10% of the entire area of the second conductive semiconductor layer 130. When the area of the second ohmic electrode 160 is less than 0.1% of the entire area, it is difficult to uniformly distribute an injected current to the semiconductor layer 130, and when the area of the second ohmic electrode 160 exceeds 10%, there is a problem in that an area of a conductive reflective layer decreases and the light output is decreased.

Figure 28:
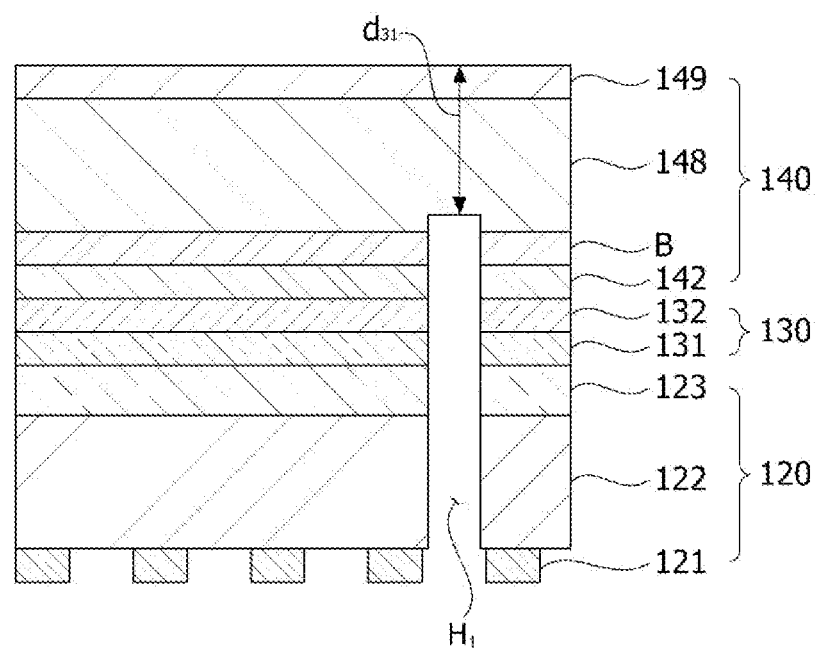
FIG. 28 is a conceptual diagram of a light emitting structure in FIG. 25.
Figure 29:
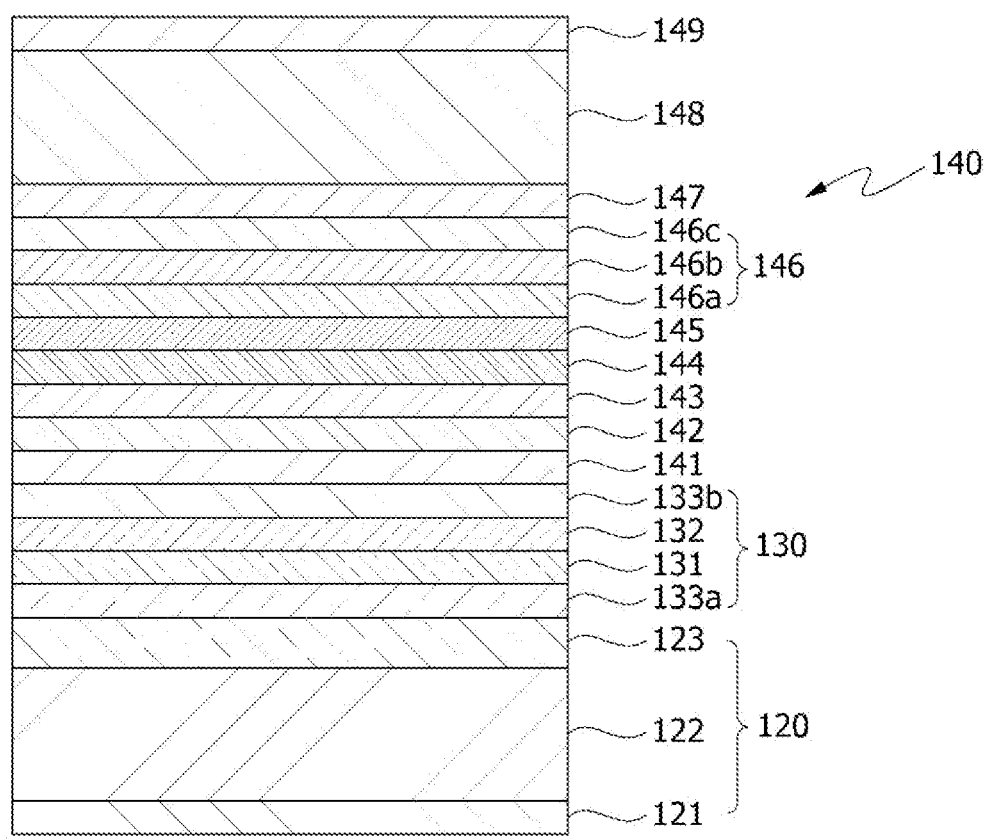
FIG. 29 is a modified example of FIG. 28.

FIG. 28 is a conceptual diagram of a light emitting structure in FIG. 25, and FIG. 29 is a modified example of FIG. 28.

Referring to FIG. 28, a light emitting structure P1 may include a first conductive semiconductor layer 120, an active layer 130, and a second conductive semiconductor layer 140.

The first conductive semiconductor layer 120 may be implemented using at least one of a Group III-V compound semiconductor and a Group II-VI compound semiconductor which are doped with a first conductive dopant.

The first conductive semiconductor layer 120 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The first conductive semiconductor layer 120 may include at least one of, for example, AlGaInP, AlInP, GaN, AlN, AlGaN, InGaN, InN, InAlGaN, AlJnN, AlGaAs, GaP, GaAs, and GaAsP.

The first conductive semiconductor layer 120 may be an n-type semiconductor layer doped with an n-type dopant such as Si, Ge, Sn, Se, and Te. The first conductive semiconductor layer 120 may be disposed as a single layer or multiple layers.

The first conductive semiconductor layer 120 according to an embodiment may include a first clad layer 123, a first current distribution layer 122, and a plurality of first ohmic layers 121.

The first clad layer 123 may be an n-type carrier injection layer and include AlInP. The Al composition may be 0.2 to 0.7. A thickness of the first clad layer 123 may be 300 nm to 700 nm. Since the Al composition of the first clad layer 123 is relatively high, the first clad layer 123 may be a layer having the highest transmittance with respect to light in a red wavelength band. A dopant doping concentration may be $4.0 \times 10^{17}/cm^3$ to $6.0 \times 10^{17}/cm^3$.

The first current distribution layer 122 serves to distribute a current injected through an electrode. The first current distribution layer 122 may have an energy band gap that is smaller than that of the first clad layer 123 and is larger than that of the first ohmic layer 121.

The first current distribution layer 122 may include AlGaInP. As the Al composition becomes higher, the transmittance may become higher but resistance may also become higher. The first current distribution layer 122 may serve as a low resistance layer due to having a lower Al composition than that of the first clad layer 123. A dopant doping concentration may be $0.8 \times 10^{18}/cm^3$ to $1.2 \times 10^{18}/cm^3$.

A thickness of the first current distribution layer 122 may be 2500 nm to 3000 nm. Irregularities may be formed on a surface of the first current distribution layer 122 and increase light extraction efficiency. The irregularities may be formed by dry etching.

The first ohmic layer 121 may include gallium (Ga) and arsenic (As) and may be doped with an n-type dopant such as Si, Ge, Sn, Se, and Te. A thickness of the first ohmic layer 121 may be about 20 nm to 80 nm. Since the first ohmic layer 121 has a smaller energy band gap than that of the first current distribution layer 122, ohmic contact between the first ohmic layer 121 and an electrode may be facilitated. As an example, the energy band gap of the first ohmic layer 121 may be 1.4 eV.

The dopant doping concentration of the first ohmic layer 121 may be $4.0 \times 10^{18}/cm^3$ to $6.0 \times 10^{19}/cm^3$ and may be the highest within the first conductive semiconductor layer 120. Therefore, contact resistance with an ohmic electrode may be decreased.

However, embodiments are not necessarily limited thereto, and a structure of the first conductive semiconductor layer 120 may be deformed to various structures. As an example, the first conductive semiconductor layer 120 may include the first clad layer 123 and the first current distribution layer 122 or may include the first ohmic layer 121 and the first clad layer 123.

The active layer 130 may be formed of at least one of a single well structure, a single quantum well structure, a multi-well structure, a MQW structure, a quantum-wire structure, and a quantum dot structure.

The active layer 130 is a layer at which electrons (or holes) injected through the first conductive semiconductor layer 120 and holes (or electrons) injected through the second conductive semiconductor layer 140 combine and light is emitted due to a band gap difference according to a material forming the active layer 130. The active layer 130 according to an embodiment may emit light in a red wavelength band.

The active layer 130 may be implemented using a compound semiconductor. As an example, the active layer 130 may be implemented using at least one of a Group II-VI compound semiconductor and a Group III-V compound semiconductor.

The active layer 130 includes a plurality of well layers 131 and a plurality of barrier layers 132 which are alternately disposed, wherein a well layer 131/barrier layer 132 pair may be formed every 2 to 30 cycles. The well layer 131/barrier layer 132 cycle includes, for example, at least one of a AlInGaP/AlInGaP pair, a InGaN/GaN pair, a GaN/AlGaN pair, a AlGaN/AlGaN pair, a InGaN/AlGaN pair, a InGaN/InGaN pair, a AlGaAs/GaAs pair, a InGaAs/GaAs pair, a InGaP/GaP pair, a AlInGaP/InGaP pair, and a InP/GaAs pair.

The well layer 131 may be disposed as a semiconductor material having an empirical formula of $In_xAl_yGa_{1-x-y}P$ ($0 < x \leq 1$, $0 \leq y \leq 1$, $0 \leq x+y < 1$). The barrier layer 132 may be formed using a semiconductor material having an empirical formula of $In_xAl_yGa_{1-x-y}P$ ($0 \leq x \leq 1$, $0 \leq y \leq 1$, $0 \leq x+y < 1$).

A thickness of the well layer 131 may be about 5 nm to 10 nm, and a thickness of the barrier layer 132 may be 10 to 20 nm.

The active layer 130 may include outermost barrier layers 133a and 133b disposed adjacent to the first conductive semiconductor layer 120 and the second conductive semiconductor layer 140. The outermost barrier layers 133a and 133b may have a composition of $(Al_{0.1}Ga_{0.9})_{0.5}In_{0.5}P$ and a thickness of 40 nm to 60 nm.

The second conductive semiconductor layer 140 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The second conductive semiconductor layer 140 may include, for example, at least one of AlInP, GaP, GaN, AlN, AlGaN, InGaN, InN, InAlGaN, AlInN, AlGaAs, GaAs, GaAsP, and AlGaInP and may be a p-type semiconductor layer doped with a p-type dopant such as Mg.

The second conductive semiconductor layer 140 may be disposed as a single layer or multiple layers. The second conductive semiconductor layer 140 may have a superlattice structure in which at least two layers different from each other are alternately disposed.

The second conductive semiconductor layer 140 may include a second clad layer 142, a second current distribution layer 148, and a second ohmic layer 149.

The second clad layer 142 may be a P-type carrier injection layer and include AlInP. The Al composition may be 0.2 to 0.7. A thickness of the second clad layer 142 may be 300 nm to 700 nm. A dopant doping concentration may be $1.0 \times 10^{18}/cm^3$ to $2.0 \times 10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0 \times 10^{18}/cm^3$ to $2.0 \times 10^{18}/cm^3$.

The second ohmic layer 149 may include GaP and may be doped with carbon. A thickness of the second ohmic layer 149 may be about 150 nm to 250 nm. A carbon doping concentration may be $5.0 \times 10^{19}/cm^3$ to $2.0 \times 10^{20}/cm^3$. When the carbon doping concentration is $5.0 \times 10^{19}/cm^3$ to $2.0 \times 10^{20}/cm^3$, ohmic contact with a metal or ITO may be improved. The carbon concentration may be increased as the second ohmic layer 149 becomes more distant from the active layer 130. However, embodiments are not necessarily limited thereto, and the second ohmic layer 149 may not be doped with carbon.

Since the thickness of the second current distribution layer 148 is 3000 nm to 4000 nm and the thickness of the second ohmic layer 149 is 150 nm to 250 nm, a thickness d31 of the second conductive semiconductor layer 140 remaining between the second ohmic electrode 160 and the optical layer 112 may be 150 nm to 4250 nm. When the thickness d31 of the remaining second conductive semiconductor layer 140 is less than 250 nm, the second conductive semiconductor layer 140 may come into contact with the second ohmic layer 149 and contact resistance may be further decreased.

Referring to FIG. 29, a plurality of buffer layers may be disposed between the second clad layer 142 and the second current distribution layer 148.

A first buffer layer 143 may have a thickness of 150 nm to 250 nm and a dopant doping concentration of $1.0 \times 10^{18}/cm^3$ to $2.0 \times 10^{18}/cm^3$. A second buffer layer 144 may have a thickness of 10 nm to 15 nm, and a dopant doping concentration of $1.0 \times 10^{18}/cm^3$ to $2.0 \times 10^{18}/cm^3$.

The Al composition in the first buffer layer 143 and the second buffer layer 144 may be gradually reduced to decrease an energy band gap difference between AlInP and GaP.

A third buffer layer 145 may a thickness of 20 nm to 40 nm and a dopant doping concentration of $1.0 \times 10^{18}/cm^3$ to $2.0 \times 10^{18}/cm^3$. The third buffer layer 145 may mitigate stress due to a crystal lattice difference between AlGaP and GaP.

The Al composition of the first buffer layer 143 may be 80% to 90%, the Al composition of the second buffer layer 144 may be 20% to 50%, and the Al composition of the third buffer layer 145 may be 0% to 10%.

A second diffusion preventing layer 147 may be fabricated with a low doping concentration, $2.0 \times 10^{17}/cm^3$ to $3.0 \times 10^{17}/cm^3$ and prevent diffusion of a dopant such as Mg. A thickness of the second diffusion preventing layer 147 may be 150 nm to 250 nm.

A first diffusion preventing layer 141 may be disposed between the active layer 130 and the second conductive semiconductor layer 140. The first diffusion preventing layer 141 may prevent diffusion of a dopant of the second conductive semiconductor layer 140 to the active layer 130. The first diffusion preventing layer 141 may have a AlInP composition and a thickness of 200 nm to 300 nm.

Figure 30:
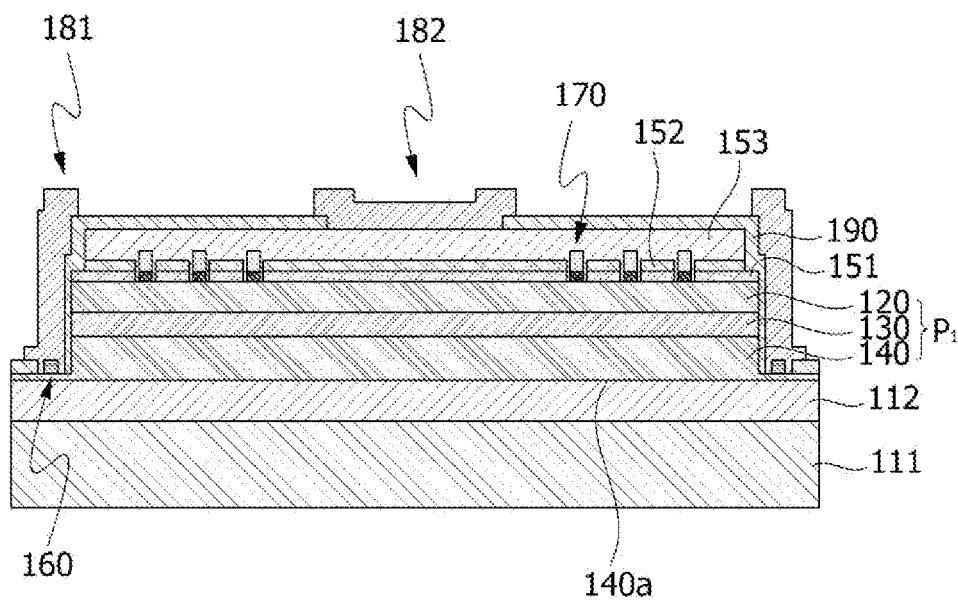
FIG. 30 is a conceptual diagram of a light emitting device according to a sixth embodiment of the present invention.
Figure 31:
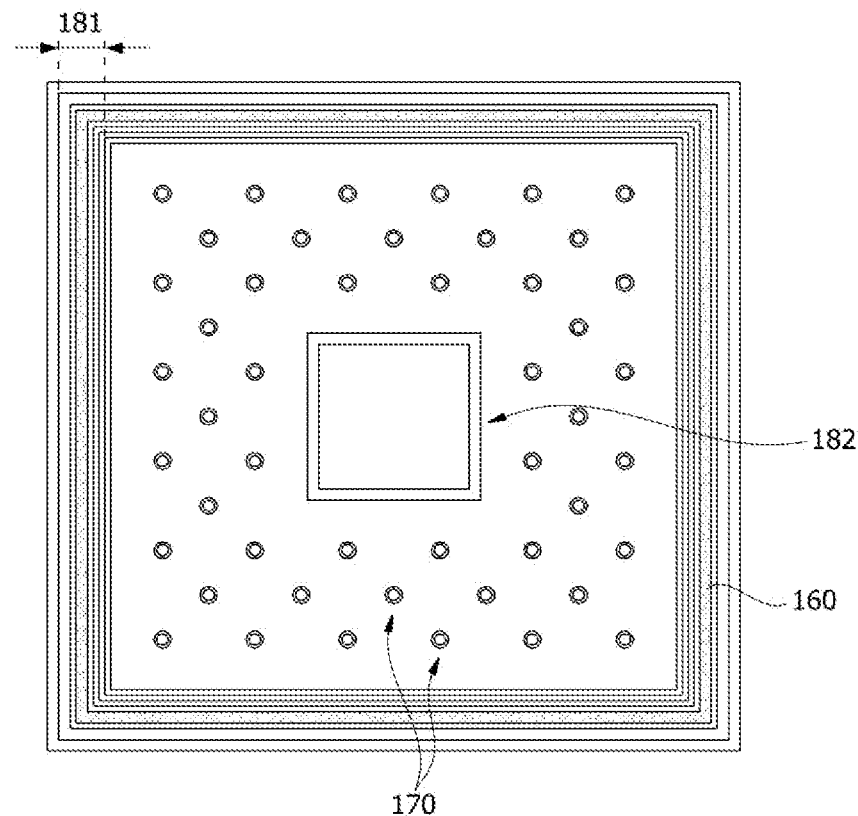
FIG. 31 is a plan view of FIG. 30.
Figure 32:
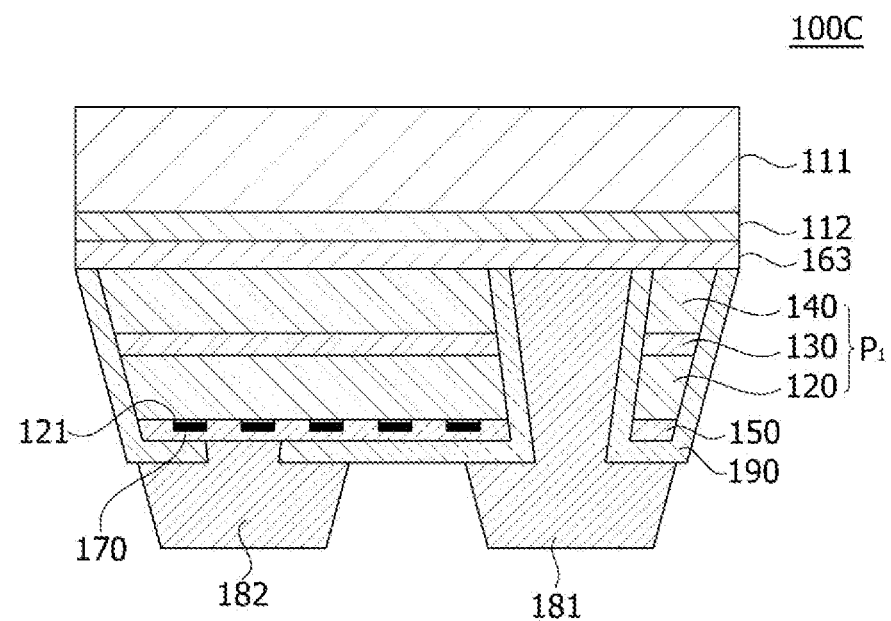
FIG. 32 is a conceptual diagram of a light emitting device according to a seventh embodiment of the present invention.
Figure 33:
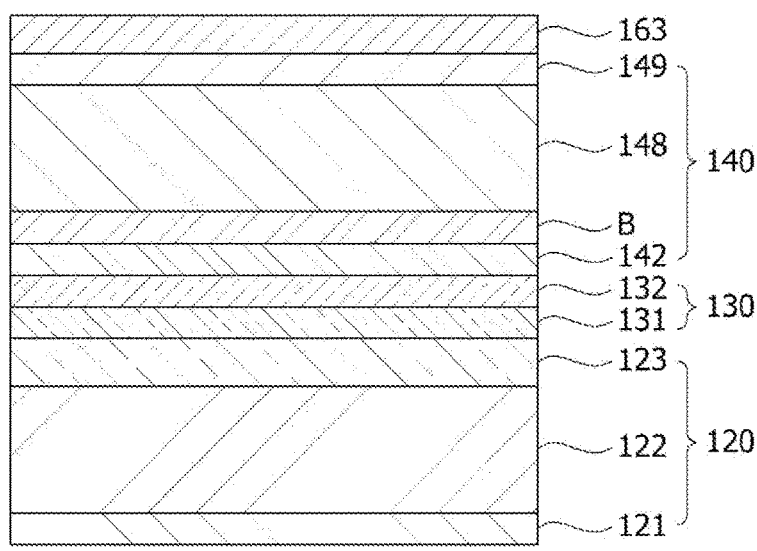
FIG. 33 is a view showing ohmic contact between a second ohmic layer and a second ohmic electrode.

FIG. 30 is a conceptual diagram of a light emitting device according to a sixth embodiment of the present invention, FIG. 31 is a plan view of FIG. 30, FIG. 32 is a conceptual diagram of a light emitting device according to a seventh embodiment of the present invention, and FIG. 33 is a view showing ohmic contact between a second ohmic layer and an ITO layer.

Referring to FIGS. 30 and 31, a light emitting device according to an embodiment may include a first electrode 182 disposed at the center and a second electrode 181 disposed at an edge of the light emitting device.

The first electrode 182 may have a polygonal shape or a circular shape, and the second electrode 181 may be disposed at the edge and have a shape surrounding the first electrode 182.

An edge of the light emitting structure P1 may be etched, and a portion of a second conductive semiconductor layer 140 may remain thereon. A second ohmic electrode 160 may be disposed on the remaining second conductive semiconductor layer 140. Although not illustrated, the second ohmic electrode 160 may further include a plurality of branched electrodes which extend toward the center.

In the present embodiment, the structure of the light emitting structure described above with reference to FIG. 28 may be applied as it is. Since the thickness of the second current distribution layer is 3000 nm to 4000 nm and the thickness of the second ohmic layer is 150 nm to 250 nm as described above, a thickness of the second conductive semiconductor layer 140 that remains between the second ohmic electrode 160 and the optical layer 112 may be 150 nm to 4250 nm.

When the thickness of the remaining second conductive semiconductor layer 140 is less than 250 nm, the second conductive semiconductor layer 140 may come into contact with the second ohmic layer and contact resistance may be further decreased. The second ohmic layer may include GaP and may be doped with carbon by $5.0 \times 10^{19}/cm^3$ to $2.0 \times 10^{20}/cm^3$.

Referring to FIGS. 32 and 33, a light emitting device according to an embodiment may have a second ohmic electrode 163 formed at an entire upper portion of a light emitting structure 163. The second ohmic electrode 163 may be TCO.

The TCO may be selected from ITO, IZO, AZO, AGZO, IZTO, IAZO, IGZO, IGTO, ATO, GZO, IZON, ZnO, IrOx, RuOx, NiO, and the like.

The second ohmic layer 149 may include GaP and may be doped with carbon by $5.0 \times 10^{19}/cm^3$ to $2.0 \times 10^{20}/cm^3$. Therefore, contact resistance between the second ohmic layer 149 and the second ohmic electrode 163 may be decreased.

The second electrode 181 may be electrically connected to the second ohmic electrode 163 formed thereon through the light emitting structure P1.

According to an embodiment, since the transparent ohmic electrode is formed on the light emitting structure, light absorption may be minimized while current distribution is facilitated.

FIGS. 34 to 40 are views for describing a method of manufacturing a light emitting device according to an embodiment of the present invention.

Figure 34:
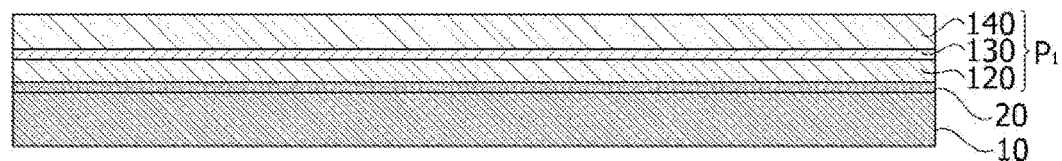
FIGS. 34 to 40 are views for describing a method of manufacturing a light emitting device according to an embodiment of the present invention.
Figure 35:
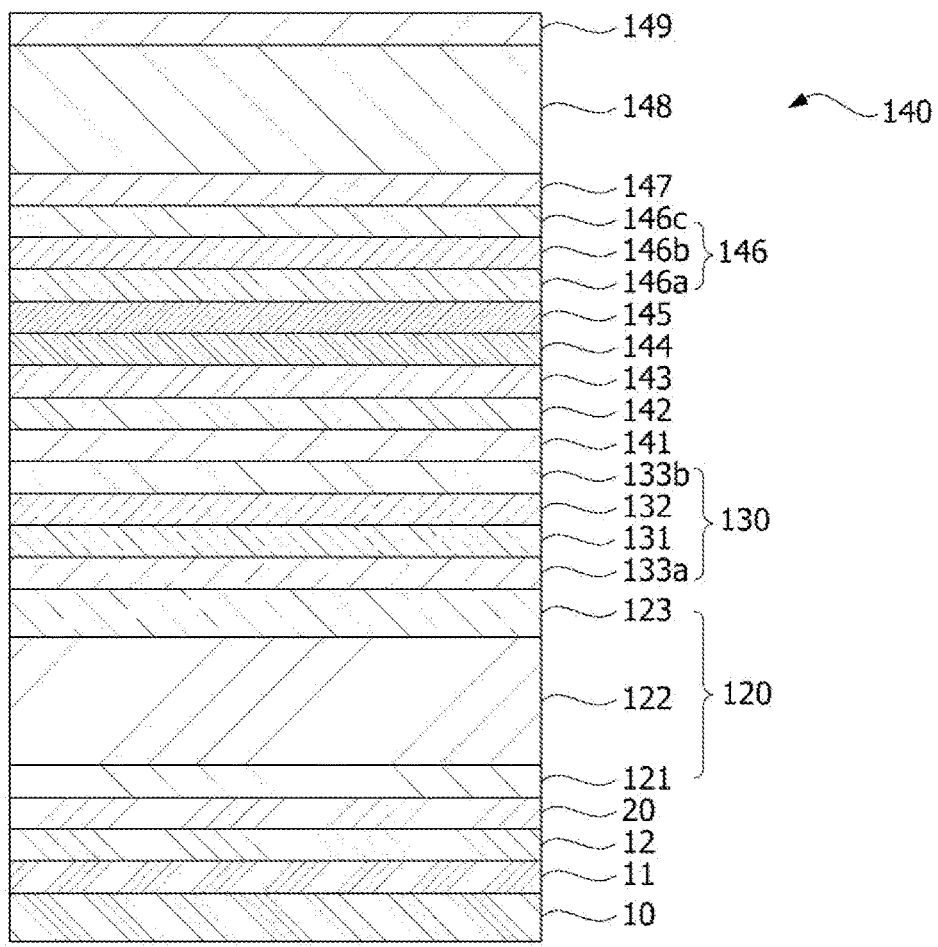

Referring to FIGS. 34 and 35, an etch stop layer 20 may be formed on a growth substrate 10, and a light emitting structure P1 and a first ohmic electrode 170 may be grown on the etch stop layer 20.

The growth substrate 10 may be a GaAs substrate. A thickness of the substrate may be 0.5 to 0.8 mm. An off-angle of the growth substrate 10 (an angle at which a wafer ingot is cut with respect to a flat surface) may be 15°. When the off-angle is 15°, a speed of epitaxial growth may be increased.

Then, the growth substrate 10 is pre-heated, and stress mitigating layers 11 and 12 are formed. The stress mitigating layers 11 and 12 may have a GaAs composition and a thickness of 200 nm to 400 nm. The stress mitigating layers 11 and 12 may be doped with an n-type dopant as necessary.

Then, the etch stop layer 20 may be formed. The etch stop layer 20 may have a GaInP composition and may be doped with an n-type dopant as necessary. However, embodiments are not necessarily limited thereto, and various P-based semiconductor layers (e.g., InP) may be used as the etch stop layer. The etch stop layer 20 may be formed to have a thickness of about 100 nm to 200 nm.

The first ohmic layer 121 may include GaAs and may be doped with an n-type dopant such as Si, Ge, Sn, Se, and Te. A thickness of the first ohmic layer 121 may be about 20 nm to 50 nm. Since an energy band gap of the first ohmic layer 121 is smaller than that of the first current distribution layer 122, ohmic contact may be facilitated. As an example, the energy band gap of the first ohmic layer 121 may be 1.4 eV.

The first current distribution layer 122 serves to distribute a current injected through an electrode. The first current distribution layer 122 may have an energy band gap that is smaller than that of the first clad layer 123 and is larger than that of the first ohmic layer 121. The first current distribution layer 122 may include AlGaInP.

The first current distribution layer 122 may be fabricated to have a thickness of 2500 nm to 3000 nm. Irregularities may be formed on a surface of the first current distribution layer 122 and increase light extraction efficiency. The irregularities may be formed by dry etching.

The first clad layer 123 may be an n-type carrier injection layer and include AlInP. The Al composition may be 0.2 to 0.7. A thickness of the first clad layer 123 may be 300 nm to 700 nm.

The active layer 130 may include a plurality of well layers 131 and a plurality of barrier layers 132 which are alternately formed. The number of well layer 131/barrier layer 132 pairs may be 20 but is not necessarily limited thereto.

A thickness of the well layer 131 may be about 5 nm to 10 nm, and a thickness of the barrier layer 132 may be 10 to 20 nm.

The active layer 130 may include outermost barrier layers 133a and 133b disposed adjacent to the first conductive semiconductor layer 120 and the second conductive semiconductor layer 140.

A diffusion preventing layer 141 may be formed between the active layer 130 and the second conductive semiconductor layer 140. The diffusion preventing layer 141 may prevent diffusion of a dopant of the second conductive semiconductor layer 140 to the active layer 130. The diffusion preventing layer 141 may have a AlInP composition and a thickness of 200 nm to 300 nm.

The second conductive semiconductor layer 140 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The second clad layer 142 may be a P-type carrier injection layer and include AlInP. The Al composition may be 0.2 to 0.7. A thickness of the second clad layer 142 may be 300 nm to 700 nm. A dopant doping concentration may be $1.0 \times 10^{18}/cm^3$ to $2.0 \times 10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0 \times 10^{18}/cm^3$ to $2.0 \times 10^{18}/cm^3$.

The second ohmic layer 149 may include GaP and may be doped with carbon. A thickness of the second ohmic layer 149 may be about 150 nm to 250 nm. A carbon doping concentration may be $5.0 \times 10^{19}/cm^3$ to $2.0 \times 10^{20}/cm^3$. When the carbon doping concentration is $5.0 \times 10^{19}/cm^3$ to $2.0 \times 10^{20}/cm^3$, electrical conductivity may be increased and thus ohmic contact with a metal or a transparent electrode (e.g., ITO) may be improved.

A plurality of buffer layers may be disposed between the second clad layer 142 and the second current distribution layer 148. A first buffer layer 143 may have a thickness of 150 nm to 250 nm and a dopant doping concentration of $1.0 \times 10^{18}/cm^3$ to $2.0 \times 10^{18}/cm^3$. A second buffer layer 144 may have a thickness of 10 nm to 15 nm and a dopant doping concentration of $1.0 \times 10^{18}/cm^3$ to $2.0 \times 10^{18}/cm^3$. The first buffer layer 143 and the second buffer layer 144 may decrease an energy band gap difference between AlInP and GaP.

A third buffer layer 145 may have a thickness of 20 nm to 40 nm and a dopant doping concentration of $1.0 \times 10^{18}/cm^3$ to $2.0 \times 10^{18}/cm^3$. The third buffer layer 145 may mitigate stress due to a crystal lattice difference between AlGaP and GaP.

A fourth buffer layer 146 may have a GaP composition and enhance thin film quality of the second current distribution layer 148 by adjusting a growth speed and a growth temperature.

The diffusion preventing layer 147 may be fabricated with a low doping concentration, $2.0 \times 10^{17}/cm^3$ to $3.0 \times 10^{17}/cm^3$, and prevent diffusion of a dopant such as Mg. A thickness of the diffusion preventing layer 147 may be 150 nm to 250 nm.

Figure 36:
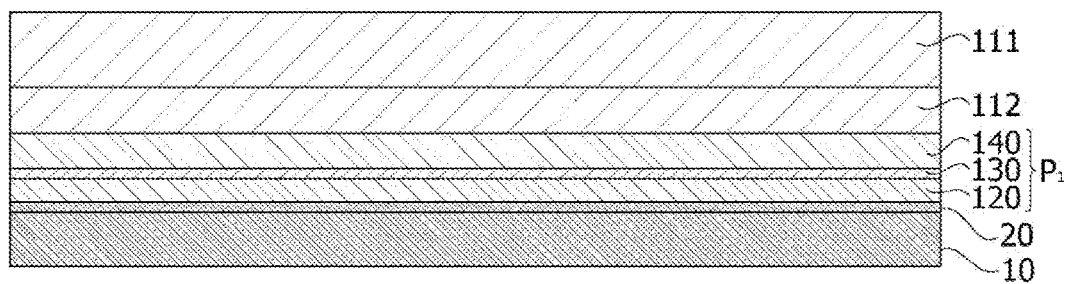

Referring to FIG. 36, an optical layer 112 and a light transmitting substrate 111 may be formed on the second ohmic electrode 160. Specifically, after resin such as PC, PMMA, and silicone is applied on the light emitting structure P1, the light transmitting substrate 111 may be formed thereon to cover the resin and be hardened.

Figure 37:
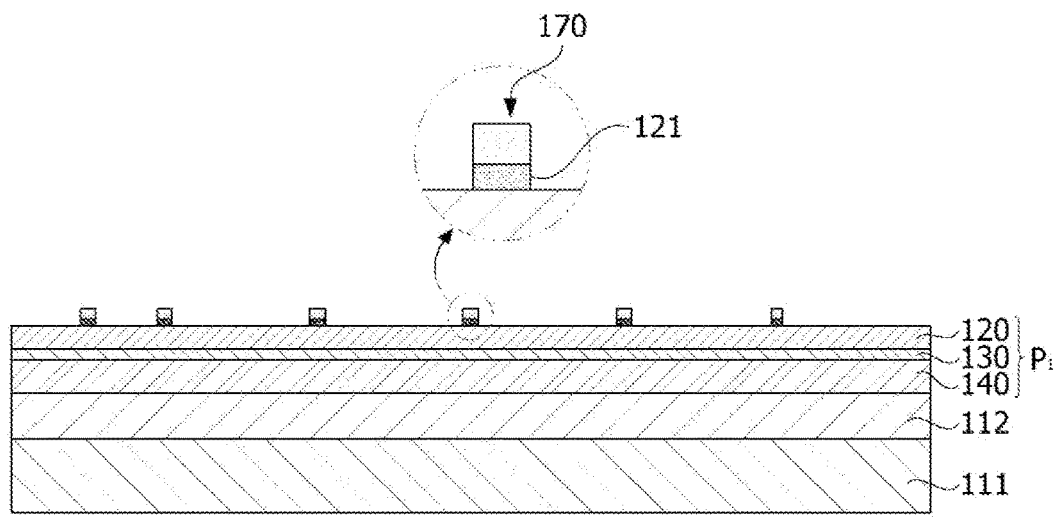

Referring to FIG. 37, the growth substrate 10 may be removed. The growth substrate 10 may be removed using a wet-etching method. Various etching solutions capable of selectively removing GaAs may be selected as an etching solution. As an example, the etching solution may be an ammonia solution.

The etching solution may remove GaAs but does not etch GaInP. Therefore, the growth substrate 10 may be selectively removed using the etching solution. Then, the etch stop layer 20 may be removed. A method of removing the etch stop layer 20 is not particularly limited. As an example, the etch stop layer 20 may be removed using polishing.

Then, a plurality of first ohmic electrodes 170 are formed on the first ohmic layer 121 of the first conductive semiconductor layer 120 which is exposed due to the removal of the growth substrate 10. Then, the first ohmic layer 121 in which the first ohmic electrode 170 is not formed may be removed.

Figure 38:
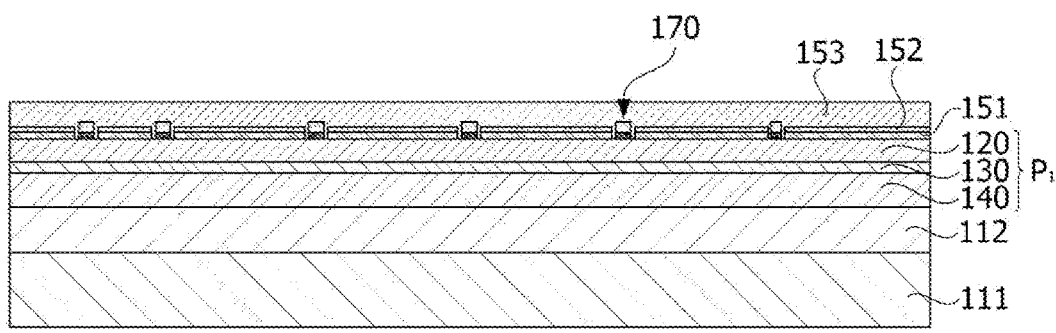

Referring to FIG. 38, a first reflective layer 151 and a transparent electrode layer 152 are formed on a first conductive semiconductor layer 120, and a second reflective layer 153 is formed on the first reflective layer 151 and the transparent electrode layer 152.

Figure 39:
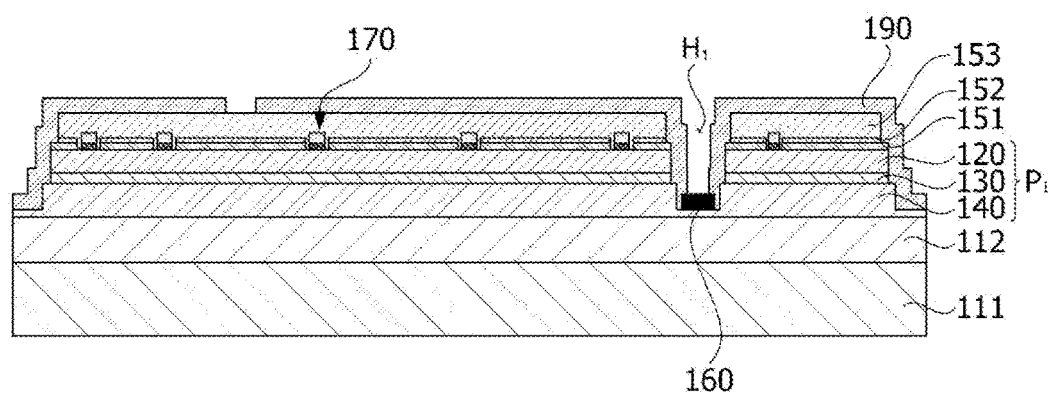

Referring to FIG. 39, the first conductive semiconductor layer 120 and the active layer 130 are etched to form a through-hole so that a second conductive semiconductor layer is exposed therethrough. Then, an insulating layer 190 is formed at an entire upper portion.

Figure 40:
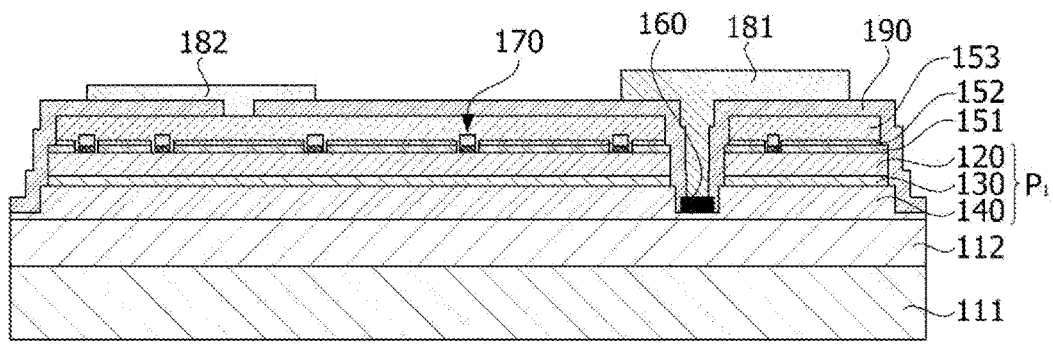

Referring to FIG. 40, the first electrode 182 and the first conductive semiconductor layer 120 may be electrically connected through the first ohmic electrode 170, and the second electrode 181 and the second conductive semiconductor layer 140 may be electrically connected through the second ohmic electrode 160.

Figure 41:
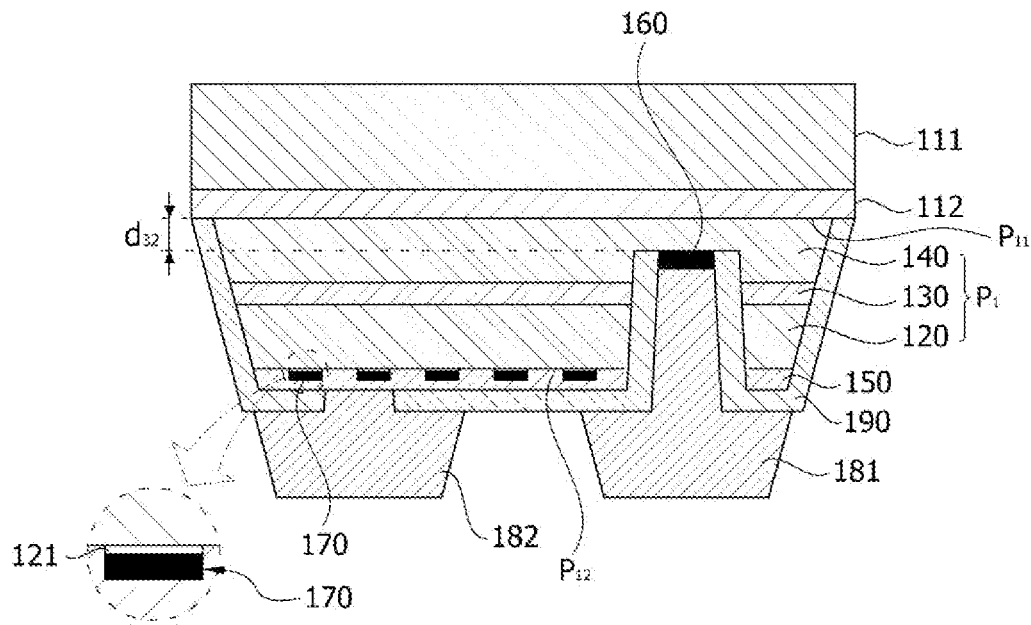
FIG. 41 is a conceptual diagram of a light emitting device according to an eighth embodiment of the present invention.

FIG. 41 is a conceptual diagram of a light emitting device according to an eighth embodiment of the present invention.

Referring to FIG. 41, a light emitting device 100A includes a light emitting structure P1, an insulating layer 190 disposed at the other side P12 of the light emitting structure P1, a first electrode 182 electrically connected to a first conductive semiconductor layer 120 through the insulating layer 190, and a second electrode 181 electrically connected to a second conductive semiconductor layer 140 through the insulating layer 190.

The light emitting structure P1 includes the first conductive semiconductor layer 120, an active layer 130, and the second conductive semiconductor layer 140. Light output from the light emitting structure P1 may be in a red wavelength band. However, embodiments are not necessarily limited thereto.

A plurality of first ohmic electrodes 170 may come into contact with the first conductive semiconductor layer 120 through the insulating layer 190. A first ohmic layer 121 of the first conductive semiconductor layer 120 may have a GaAs composition with a low energy band gap. Therefore, contact resistance between the first conductive semiconductor layer 120 and the first ohmic electrode 170 may be reduced. Since the first ohmic layer 121 absorbs light in a red wavelength band, a region other than a region in which the first ohmic electrode 170 is formed may be removed. An area of the first ohmic layer 121 may be 2% to 7% of the entire area of the second conductive semiconductor layer 140.

A reflective electrode layer 150 may be disposed on the first conductive semiconductor layer 120. The reflective electrode layer 150 may entirely cover the first ohmic electrodes 170. The reflective electrode layer 150 may include a transparent electrode layer and a reflective layer.

The transparent electrode layer may be formed of a material having excellent electrical conductivity so that a current injected from the outside is able to be evenly spread horizontally. The transparent electrode layer may be formed of TCO. The TCO may be selected from ITO, IZO, AZO, AGZO, IZTO, IAZO, IGZO, IGTO, ATO, GZO, IZON, ZnO, IrOx, RuOx, NiO, and the like.

A reflective layer may be formed of a material having high reflectance such as Ag, Ni, Al, Rh, Pd, Ir, Ru, Mg, Zn, Pt, Au, Hf, and the like or may be formed of a mixture of the material having high reflectance and a transparent conductive material such as IZO, IZTO, IAZO, IGZO, IGTO, AZO, and ATO.

The insulating layer 190 may be disposed on an entire portion of the other side P12 of the light emitting structure P1. The insulating layer 190 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but embodiments are not limited thereto. The insulating layer 190 may be formed of a single layer or multiple layers. As an example, the insulating layer 190 may have a DBR structure formed of Si oxide, Ti oxide, or the like.

The insulating layer 190 may be formed at a sidewall of a through-hole formed in the light emitting structure P1 and may electrically insulate the second electrode 181 and the active layer 130 from each other.

The second ohmic electrode 160 may come into contact with the second conductive semiconductor layer 140. The second conductive semiconductor layer 140 coming into contact with the second ohmic electrode 160 may have a GaP composition. Therefore, contact resistance between the second conductive semiconductor layer 140 and the second ohmic electrode 160 may be decreased. A thickness d32 between the second ohmic electrode 160 and the first conductive semiconductor layer 20 may be 150 nm to 4250 nm.

The first ohmic electrode 170 and the second ohmic electrode 160 may be formed to include at least one of ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, and Hf, but materials of the first ohmic electrode 170 and the second ohmic electrode 160 are not limited thereto.

An optical layer 112 may be formed at one side P 11 of the light emitting structure P1 and adhere the light transmitting substrate 111 and the light emitting structure P1 to each other. The optical layer 112 may be resin such as PC and PMMA and may also be an OCA. A material of the optical layer 112 is not particularly limited as long as the material transmits visible light.

The light transmitting substrate 111 may be an insulating substrate. The light transmitting substrate 111 may be formed of a material selected from sapphire ($Al_2O_3$), SiC, GaN, ZnO, Si, GaP, InP, and Ge, but the material of the light transmitting substrate 111 is not particularly limited as long as the material transmits visible light.

A thickness of the light transmitting substrate 111 may be 100 um to 1000 um. Therefore, light may also be output to a side of the light transmitting substrate 111, and light extraction efficiency may be improved. A plurality of irregularities may be formed on the light transmitting substrate 111. The irregularities may improve the light extraction efficiency.

FIGS. 42A to 42I are various embodiments of a light emitting structure, and FIGS. 43A to 43E are various modified examples of a buffer layer.

Referring to FIG. 42, a light emitting structure P1 may include a first conductive semiconductor layer 120, an active layer 130, and a second conductive semiconductor layer 140.

The first conductive semiconductor layer 120 may be implemented using at least one of a Group III-V compound semiconductor and a Group II-VI compound semiconductor which are doped with a first conductive dopant.

The first conductive semiconductor layer 120 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The first conductive semiconductor layer 120 may include at least one of, for example, AlGaInP, AlInP, GaN, AlN, AlGaN, InGaN, InN, InAlGaN, AlInN, AlGaAs, GaP, GaAs, and GaAsP.

The first conductive semiconductor layer 120 may be an n-type semiconductor layer doped with an n-type dopant such as Si, Ge, Sn, Se, and Te. The first conductive semiconductor layer 120 may be disposed as a single layer or multiple layers.

The first conductive semiconductor layer 120 according to an embodiment may include a first clad layer 123, a first current distribution layer 122, and a first ohmic layer 121.

The first clad layer 123 may be an n-type carrier injection layer and include AlInP. The Al composition may be 0.2 to 0.7. A thickness of the first clad layer 123 may be 300 nm to 700 nm. Since the Al composition of the first clad layer 123 is relatively high, the first clad layer 123 may be a layer having the highest transmittance with respect to light in a red wavelength band. A dopant doping concentration may be $4.0 \times 10^{17}/cm^3$ to $6.0 \times 10^{17}/cm^3$.

The first current distribution layer 122 serves to distribute a current injected through an electrode. The first current distribution layer 122 may have an energy band gap that is smaller than that of the first clad layer 123 and is larger than that of the first ohmic layer 121.

The first current distribution layer 122 may include AlGaInP. As the Al composition becomes higher, the transmittance may become higher but resistance may also become higher. The first current distribution layer 122 may serve as a low resistance layer due to having a lower Al composition than that of the first clad layer 123. A dopant doping concentration may be $0.8 \times 10^{18}/cm^3$ to $1.2 \times 10^{18}/cm^3$.

A thickness of the first current distribution layer 122 may be 2500 nm to 3000 nm. Irregularities may be formed on a surface of the first current distribution layer 122 and increase light extraction efficiency. The irregularities may be formed by dry etching.

The first ohmic layer 121 may include Ga and As and may be doped with an n-type dopant such as Si, Ge, Sn, Se, and Te. A thickness of the first ohmic layer 121 may be about 20 nm to 80 nm. Since the first ohmic layer 121 has a smaller energy band gap than that of the first current distribution layer 122, ohmic contact between the first ohmic layer 121 and an electrode may be facilitated.

As an example, the energy band gap of the first ohmic layer 121 may be 1.4 eV. The dopant doping concentration of the first ohmic layer 121 may be $4.0 \times 10^{18}/cm^3$ to $6.0 \times 10^{19}/cm^3$ and may be the highest within the first conductive semiconductor layer 120. Therefore, contact resistance with an ohmic electrode may be decreased.

However, embodiments are not necessarily limited thereto, and a structure of the first conductive semiconductor layer 120 may be deformed to various structures. As an example, the first conductive semiconductor layer 120 may include the first clad layer 123 and the first current distribution layer 122 as in FIG. 42B or may include the first ohmic layer 121 and the first clad layer 123 as in FIG. 42D.

The active layer 130 may be formed of at least one of a single well structure, a single quantum well structure, a multi-well structure, a MQW structure, a quantum-wire structure, and a quantum dot structure.

The active layer 130 is a layer at which electrons (or holes) injected through the first conductive semiconductor layer 120 and holes (or electrons) injected through the second conductive semiconductor layer 140 combine and light is emitted due to a band gap difference according to a material forming the active layer 130.

The active layer 130 may be implemented using a compound semiconductor. As an example, the active layer 130 may be implemented using at least one of a Group II-VI compound semiconductor and a Group III-V compound semiconductor.

Figure 42A:
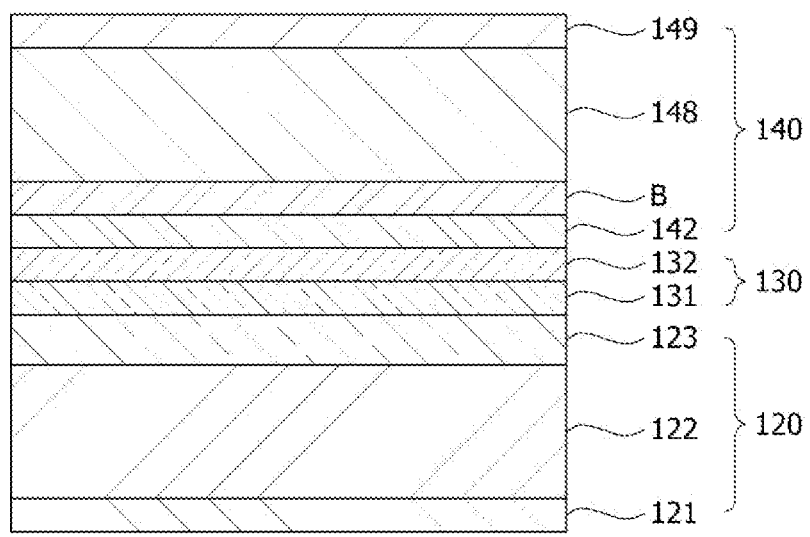
FIGS. 42A to 42I are various embodiments of a light emitting structure.
Figure 42B:
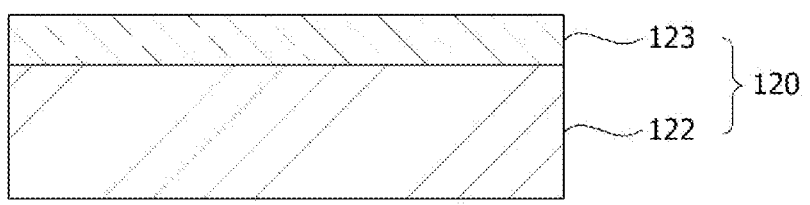
Figure 42C:
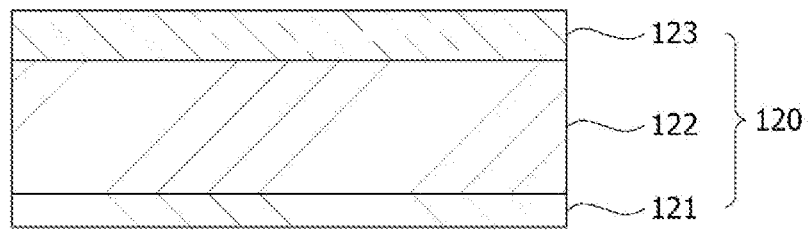
Figure 42D:
Figure 42E:
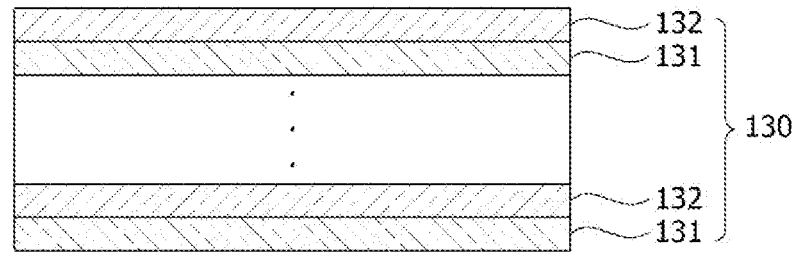
Figure 42F:
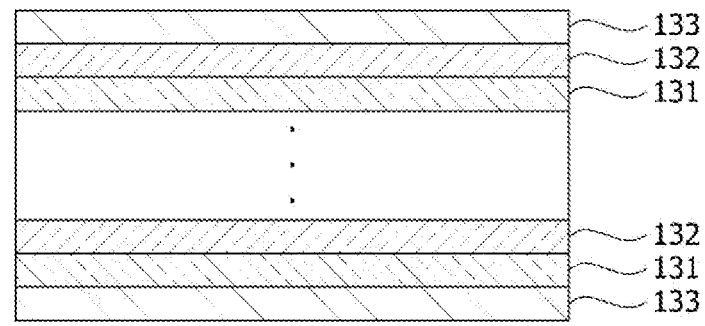
Figure 42G:
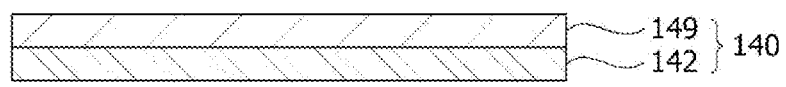
Figure 42H:
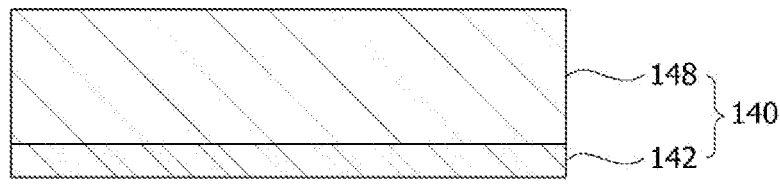
Figure 42I:
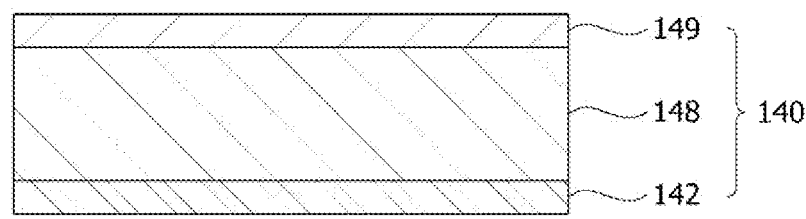

Referring to FIG. 42E, the active layer 130 includes a plurality of well layers 131 and a plurality of barrier layers 132 which are alternately disposed, wherein a well layer 131/barrier layer 132 pair may be formed every 2 to 30 cycles. The well layer 131/barrier layer 132 cycle includes, for example, at least one of a AlInGaP/AlInGaP pair, a InGaN/GaN pair, a GaN/AlGaN pair, a AlGaN/AlGaN pair, a InGaN/AlGaN pair, a InGaN/InGaN pair, a AlGaAs/GaAs pair, a InGaAs/GaAs pair, a InGaP/GaP pair, a AlInGaP/InGaP pair, and a InP/GaAs pair.

The well layer 131 may be disposed as a semiconductor material having an empirical formula of $In_xAl_yGa_{1-x-y}P$ ($0 < x \leq 1$, $0 \leq y \leq 1$, $0 \leq x+y < 1$). The barrier layer 132 may be formed using a semiconductor material having an empirical formula of $In_xAl_yGa_{1-x-y}P$ ($0 \leq x \leq 1$, $0 \leq y \leq 1$, $0 \leq x+y < 1$).

A thickness of the well layer 131 may be about 5 nm to 10 nm, and a thickness of the barrier layer 132 may be 10 to 20 nm.

The active layer 130 may include outermost barrier layers 133a and 133b disposed adjacent to the first conductive semiconductor layer 120 and the second conductive semiconductor layer 140. The outermost barrier layers 133a and 133b may have a AlGaInP composition and a thickness of 40 nm to 60 nm.

The second conductive semiconductor layer 140 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The second conductive semiconductor layer 140 may include, for example, at least one of AlInP, GaP, GaN, AlN, AlGaN, InGaN, InN, InAlGaN, AlInN, AlGaAs, GaAs, GaAsP, and AlGaInP and may be a p-type semiconductor layer doped with a p-type dopant such as Mg.

The second conductive semiconductor layer 140 may be disposed as a single layer or multiple layers. The second conductive semiconductor layer 140 may have a superlattice structure in which at least two layers different from each other are alternately disposed.

The second conductive semiconductor layer 140 may include a second clad layer 142, a second current distribution layer 148, and a second ohmic layer 149.

The second clad layer 142 may be a P-type carrier injection layer and include AlInP. The Al composition may be 0.2 to 0.7. A thickness of the second clad layer 142 may be 300 nm to 700 nm. A dopant doping concentration may be $1.0 \times 10^{18}/cm^3$ to $2.0 \times 10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0 \times 10^{18}/cm^3$ to $2.0 \times 10^{18}/cm^3$.

The second ohmic layer 149 may include GaP and may be doped with carbon. A thickness of the second ohmic layer 149 may be about 150 nm to 250 nm. A carbon doping concentration may be $5.0×10^{19}/cm^3$ to $2.0×10^{20}/cm^3$. When the carbon doping concentration is $5.0×10^{19}/cm^3$ to $2.0×10^{20}/cm^3$, ohmic contact with a metal or ITO may be improved. The carbon concentration may be increased as the second ohmic layer 149 becomes more distant from the active layer 130. However, embodiments are not necessarily limited thereto, and the second ohmic layer 149 may not be doped with carbon.

Since the thickness of the second current distribution layer 148 is 3000 nm to 4000 nm and the thickness of the second ohmic layer 149 is 150 nm to 250 nm, a thickness d31 (see FIG. 41) of the second conductive semiconductor layer 140 that remains between the second ohmic electrode 160 and the optical layer 112 may be 150 nm to 4250 nm. When the thickness d31 (see FIG. 41) of the remaining second conductive semiconductor layer 140 is less than 250 nm, the second conductive semiconductor layer 140 may come into contact with the second ohmic layer 149 and contact resistance may be further decreased.

However, embodiments are not necessarily limited thereto, and a structure of the second conductive semiconductor layer 140 may be deformed to various structures. As an example, the second conductive semiconductor layer 140 may include the second clad layer 142 and the second ohmic layer 148 as in FIG. 42G. Alternatively, the second conductive semiconductor layer 140 may include the second clad layer 142 and the second current distribution layer 148 as in FIG. 42H, and the second current distribution layer 148 may be doped with carbon.

Figure 43A:
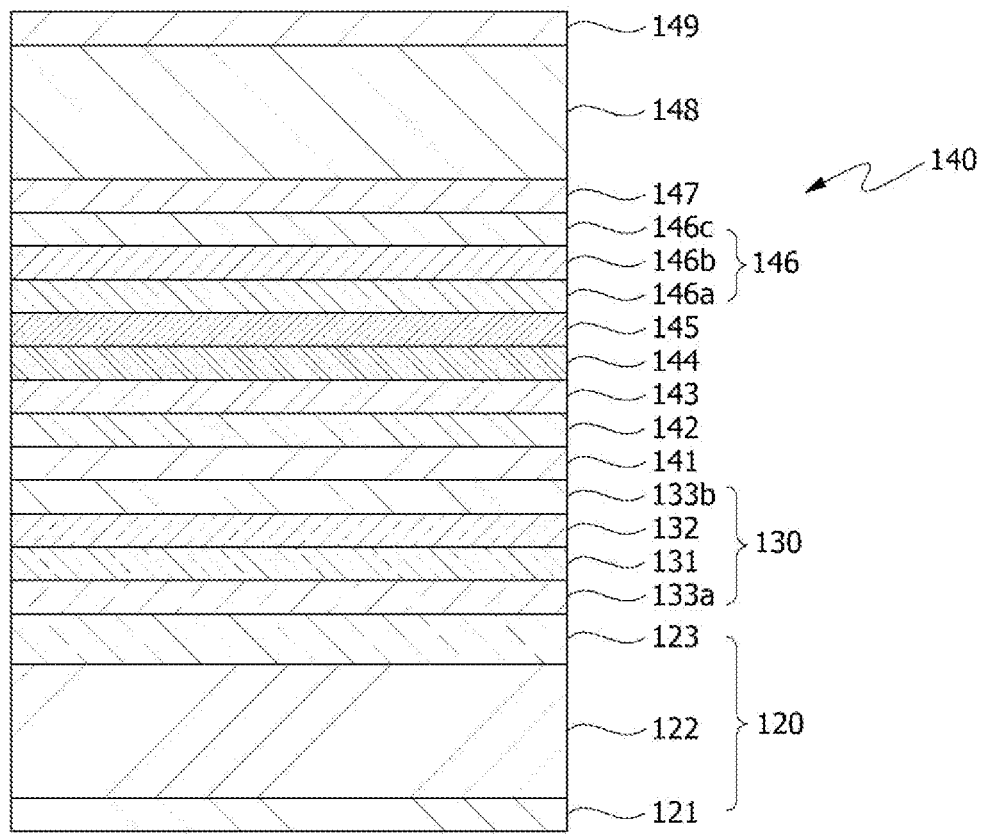
FIGS. 43A to 43E are various modified examples of a buffer layer inserted into a second conductive semiconductor layer.
Figure 43B:
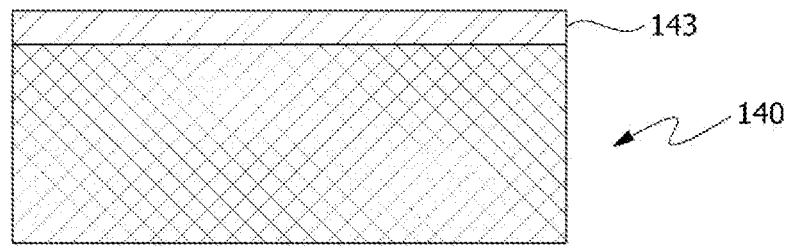
Figure 43C:
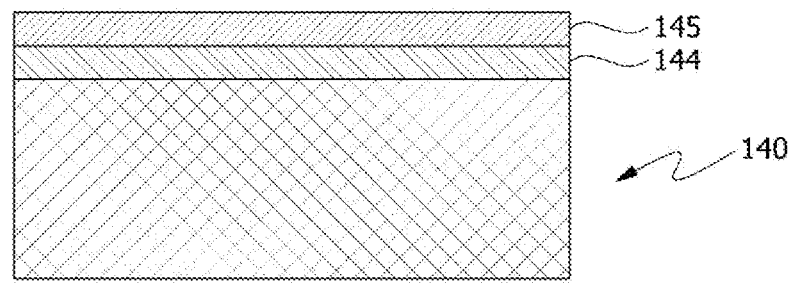
Figure 43D:
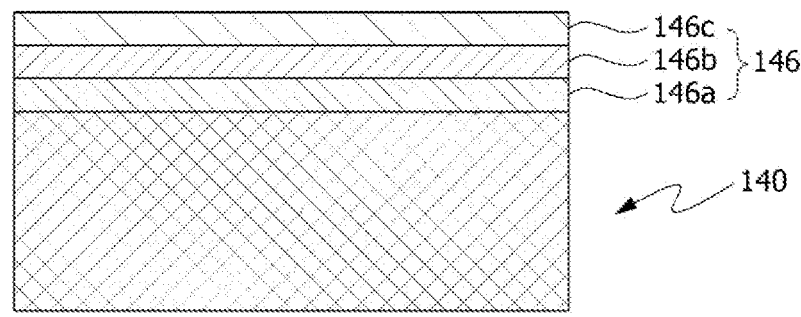
Figure 43E:
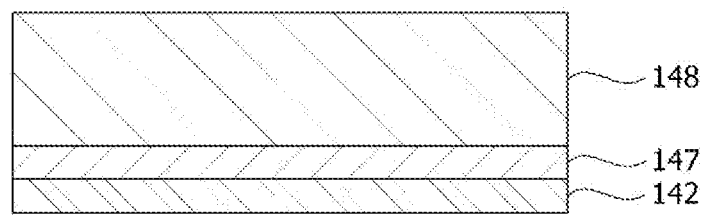

Referring to FIG. 43A, a plurality of buffer layers may be disposed between the second clad layer 142 and the second current distribution layer 148.

A first buffer layer 143 may have a AlGaInP composition, a thickness of 150 nm to 250 nm, and a dopant doping concentration of $1.0×10^{18}/cm^3$ to $2.0×10^{18}/cm^3$. A second buffer layer 144 may have a AlGaInP composition, a thickness of 10 nm to 15 nm, and a dopant doping concentration of $1.0×10^{18}/cm^3$ to $2.0×10^{18}/cm^3$.

The Al composition in the first buffer layer 143 and the second buffer layer 144 may be gradually reduced to decrease an energy band gap difference between AlInP and GaP.

A third buffer layer 145 may have a GaInP composition, a thickness of 20 nm to 40 nm, and a dopant doping concentration of $1.0×10^{18}/cm^3$ to $2.0×10^{18}/cm^3$. The third buffer layer 145 may mitigate stress due to a crystal lattice difference between AlGaP and GaP.

A fourth buffer layer 146 may have a GaP composition and enhance thin film quality of the second current distribution layer 148 by adjusting a growth speed and a growth temperature.

A thickness of the fourth-first buffer layer 146a may be 10 nm to 15 nm, a thickness of a fourth-second buffer layer 146b may be 40 nm to 60 nm, and a thickness of a fourth-third buffer layer 146c may be 60 nm to 80 nm. A doping concentration of all of the fourth-first buffer layer to the fourth-third buffer layer 146c may be $1.0×10^{18}/cm^3$ to $2.0×10^{18}/cm^3$.

A second diffusion preventing layer 147 may be fabricated with a low doping concentration, $2.0×10^{17}/cm^3$ to $3.0×10^{17}/cm^3$, and prevent diffusion of a dopant such as Mg. A thickness of the second diffusion preventing layer 147 may be 150 nm to 250 nm.

A first diffusion preventing layer 141 may be disposed between the active layer 130 and the second conductive semiconductor layer 140. The first diffusion preventing layer 141 may prevent diffusion of a dopant of the second conductive semiconductor layer 140 to the active layer 130. The first diffusion preventing layer 141 may have a AlInP composition and a thickness of 200 nm to 300 nm.

However, embodiments are not necessarily limited thereto, and the shape of the buffer layer disposed within the second conductive semiconductor layer 140 may be deformed to various shapes as in FIGS. 43B to 43E.

Figure 44:
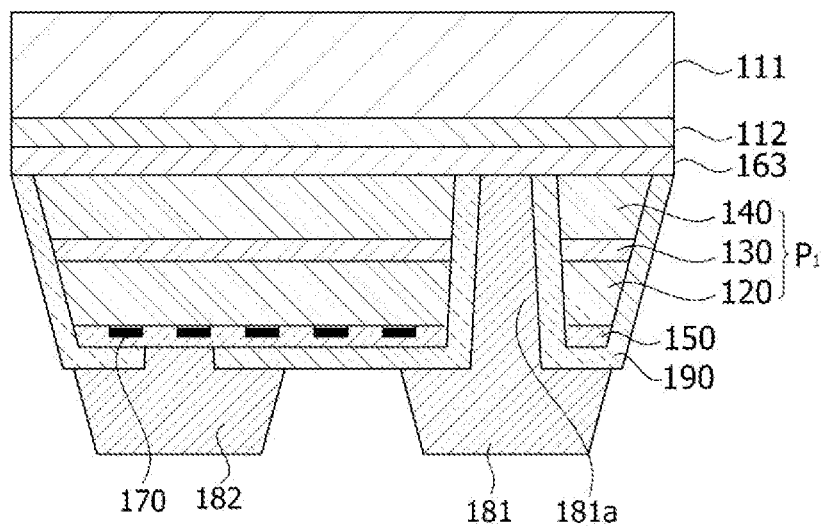
FIG. 44 is a conceptual diagram of a light emitting device according to a ninth embodiment of the present invention.

FIG. 44 is a conceptual diagram of a light emitting device according to a ninth embodiment of the present invention.

Referring to FIG. 44, a light emitting device 100B according to an embodiment may have a second ohmic electrode 163 formed at an entire upper portion of a light emitting structure 163. The second ohmic electrode 163 may be TCO. The TCO may be selected from ITO, IZO, AZO, AGZO, IZTO, IAZO, IGZO, IGTO, ATO, GZO, IZON, ZnO, IrOx, RuOx, NiO, and the like.

All of the structures described above with reference to FIGS. 42 and 43 may be applied as the structure of the light emitting structure. Therefore, since a surface layer (a layer farthest from an active layer) of a second conductive semiconductor layer 140 includes carbon, the efficiency of ohmic contact with a transparent electrode such as ITO may be improved.

A second electrode 181 may be electrically connected to the second ohmic electrode 163 formed thereon through the light emitting structure P1.

According to an embodiment, since the transparent ohmic electrode is formed on the light emitting structure, light absorption may be minimized while current distribution is facilitated.

FIGS. 45 to 49 are views showing a method of manufacturing a light emitting device according to another embodiment of the present invention.

Figure 45:
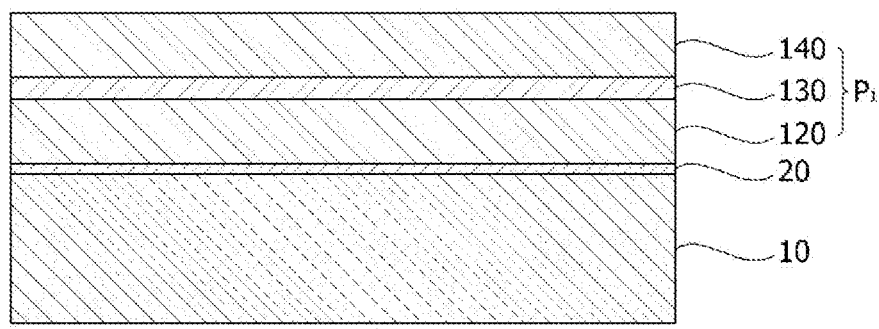
FIGS. 45 to 49 are views showing a method of manufacturing a light emitting device according to another embodiment of the present invention.
Figure 46:
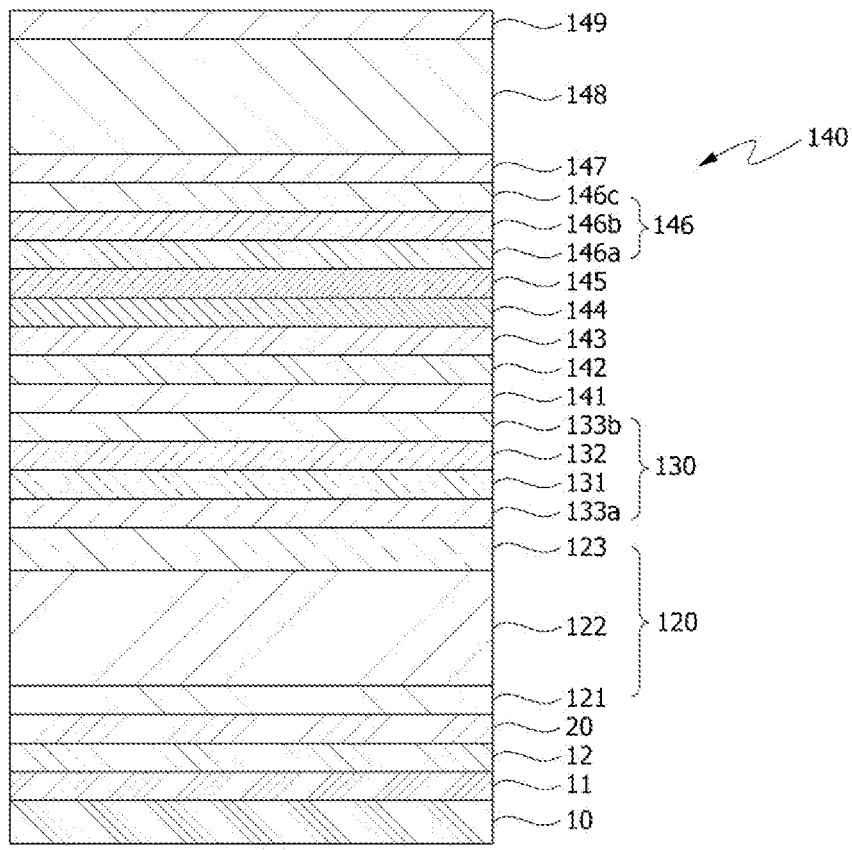

Referring to FIGS. 45 and 46, an etch stop layer 20 may be formed on a growth substrate 10, and a light emitting structure P1 may be grown on the etch stop layer 20.

The growth substrate 10 may be a GaAs substrate. A thickness of the substrate may be 0.5 to 0.8 mm. An off-angle of the growth substrate 10 (an angle at which a wafer ingot is cut with respect to a flat surface) may be 15°. When the off-angle is 15°, a speed of epitaxial growth may be increased.

Then, the growth substrate 10 is pre-heated, and stress mitigating layers 11 and 12 are formed. The stress mitigating layers 11 and 12 may have a GaAs composition and a thickness of 200 nm to 400 nm. The stress mitigating layers 11 and 12 may be doped with an n-type dopant as necessary.

Then, the etch stop layer 20 may be formed. The etch stop layer 20 may have a GaInP composition and may be doped with an n-type dopant as necessary. However, embodiments are not necessarily limited thereto, and various P-based semiconductor layers (e.g., InP) may be used as the etch stop layer. The etch stop layer 20 may be formed to have a thickness of about 100 nm to 200 nm.

The first ohmic layer 121 may include GaAs and may be doped with an n-type dopant such as Si, Ge, Sn, Se, and Te. A thickness of the first ohmic layer 121 may be about 20 nm to 50 nm. Since an energy band gap of the first ohmic layer 121 is smaller than that of the first current distribution layer 122, ohmic contact may be facilitated. As an example, the energy band gap of the first ohmic layer 121 may be 1.4 eV.

The first current distribution layer 122 serves to distribute a current injected through an electrode. The first current distribution layer 122 may have an energy band gap that is smaller than that of the first clad layer 123 and is larger than that of the first ohmic layer 121. The first current distribution layer 122 may include AlGaInP.

The first current distribution layer 122 may be fabricated to have a thickness of 2500 nm to 3000 nm. Irregularities may be formed on a surface of the first current distribution layer 122 and increase light extraction efficiency. The irregularities may be formed by dry etching.

The first clad layer 123 may be an n-type carrier injection layer and include AlInP. The Al composition may be 0.2 to 0.7. A thickness of the first clad layer 123 may be 300 nm to 700 nm.

The active layer 130 may include a plurality of well layers 131 and a plurality of barrier layers 132 which are alternately formed. The number of well layer 131/barrier layer 132 pairs may be 20 but is not necessarily limited thereto.

A thickness of the well layer 131 may be about 5 nm to 10 nm, and a thickness of the barrier layer 132 may be 10 to 20 nm.

The active layer 130 may include outermost barrier layers 133a and 133b disposed adjacent to the first conductive semiconductor layer 120 and the second conductive semiconductor layer 140.

A diffusion preventing layer 141 may be formed between the active layer 130 and the second conductive semiconductor layer 140. The diffusion preventing layer 141 may prevent diffusion of a dopant of the second conductive semiconductor layer 140 to the active layer 130.

The second conductive semiconductor layer 140 may be formed of a semiconductor material having an empirical formula of, for example, $In_xAl_yGa_{1-x-y}P$ ($0 \leq x \leq 1$, $0 \leq y \leq 1$, $0 \leq x+y \leq 1$).

The second clad layer 142 may be a P-type carrier injection layer and include AlInP. The Al composition may be 0.2 to 0.7. A thickness of the second clad layer 142 may be 300 nm to 700 nm. A dopant doping concentration may be $1.0 \times 10^{18}/cm^3$ to $2.0 \times 10^{18}/cm^3$.

The second current distribution layer 148 serves to distribute a current injected through an electrode. The second current distribution layer 148 may have an energy band gap that is smaller than that of the second clad layer 142 and is larger than that of the second ohmic layer 149. The second current distribution layer 148 may include GaP.

A thickness of the second current distribution layer 148 may be 3000 nm to 4000 nm. A dopant doping concentration may be $1.0 \times 10^{18}/cm^3$ to $2.0 \times 10^{18}/cm^3$.

The second ohmic layer 149 may include GaP and may be doped with carbon. A thickness of the second ohmic layer 149 may be about 150 nm to 250 nm. A carbon doping concentration may be $5.0 \times 10^{19}/cm^3$ to $2.0 \times 10^{20}/cm^3$. When the carbon doping concentration is $5.0 \times 10^{19}/cm^3$ to $2.0 \times 10^{20}/cm^3$, electrical conductivity may be increased and thus ohmic contact with a metal or a transparent electrode (e.g., ITO) may be improved.

A plurality of buffer layers may be disposed between the second clad layer 142 and the second current distribution layer 148. A first buffer layer 143 may have a AlGaInP composition, a thickness of 150 nm to 250 nm, and a dopant doping concentration of $1.0 \times 10^{18}/cm^3$ to $2.0 \times 10^{18}/cm^3$. A second buffer layer 144 may have a AlGaInP composition, a thickness of 10 nm to 15 nm, and a dopant doping concentration of $1.0 \times 10^{18}/cm^3$ to $2.0 \times 10^{18}/cm^3$. The first buffer layer 143 and the second buffer layer 144 may decrease an energy band gap difference between AlInP and GaP.

A third buffer layer 145 may have a GaInP composition, a thickness of 20 nm to 40 nm, and a dopant doping concentration of $1.0 \times 10^{18}/cm^3$ to $2.0 \times 10^{18}/cm^3$. The third buffer layer 145 may mitigate stress due to a crystal lattice difference between AlGaP and GaP.

A fourth buffer layer 146 may have a GaP composition and enhance thin film quality of the second current distribution layer 148 by adjusting a growth speed and a growth temperature.

A thickness of the fourth-first buffer layer 146a may be 10 nm to 15 nm, a thickness of a fourth-second buffer layer 146b may be 40 nm to 60 nm, and a thickness of a fourth-third buffer layer 146c may be 60 nm to 80 nm. A doping concentration of all of the fourth-first buffer layer to the fourth-third buffer layer 146c may be $1.0 \times 10^{18}/cm^3$ to $2.0 \times 10^{18}/cm^3$.

A diffusion preventing layer 147 may be fabricated with a low doping concentration, $2.0 \times 10^{17}/cm^3$ to $3.0 \times 10^{17}/cm^3$, and prevent diffusion of a dopant such as Mg. A thickness of the diffusion preventing layer 147 may be 150 nm to 250 nm.

Figure 47:
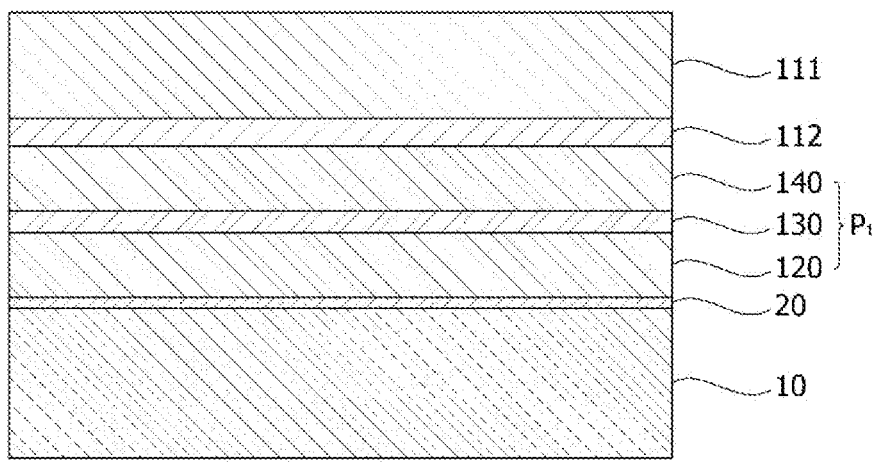

Referring to FIG. 47, an optical layer 112 and a light transmitting substrate 111 may be formed. Specifically, after resin such as PC, PMMA, and silicone is applied on the light emitting structure P1, the light transmitting substrate 111 may be formed thereon to cover the resin and be hardened.

The light transmitting substrate 111 may be formed of a material selected from sapphire ($Al_2O_3$), SiC, GaN, ZnO, Si, GaP, InP, and Ge, but the material of the light transmitting substrate 111 is not particularly limited as long as the material transmits visible light.

Then, a growth substrate 10 may be removed. The growth substrate 10 may be removed using a wet-etching method. Various etching solutions capable of selectively removing GaAs may be selected as an etching solution. As an example, the etching solution may be an ammonia solution.

The etching solution may remove GaAs but does not etch GaInP. Therefore, the growth substrate 10 may be selectively removed using the etching solution. Then, the etch stop layer 20 may be removed. A method of removing the etch stop layer 20 is not particularly limited. As an example, the etch stop layer 20 may be removed using polishing.

Figure 48:
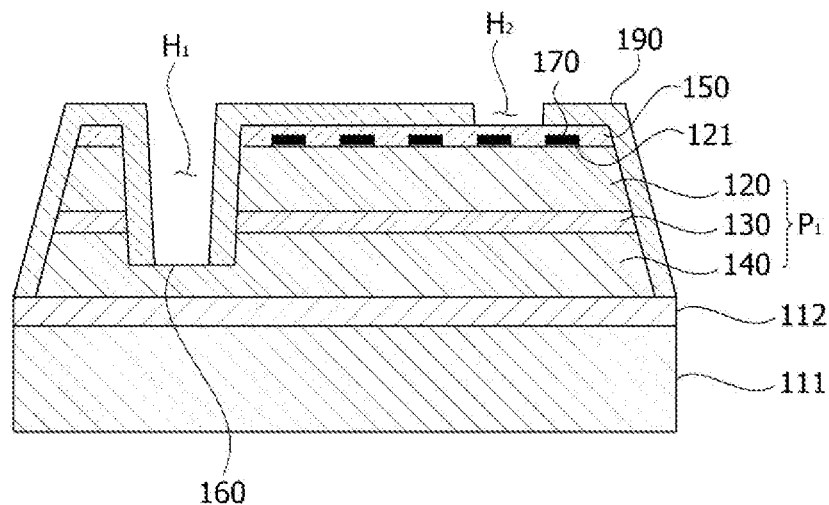

Referring to FIG. 48, a first ohmic electrode 170 may be formed on a first ohmic layer 121 of a first conductive semiconductor layer 120, and then a reflective electrode layer 150 may be formed on the first ohmic electrode 170. In this case, since the first ohmic layer 121 is formed of GaAs and absorbs red light, a region in which the first ohmic electrode 170 is not formed may be eliminated. Then, a first conductive semiconductor layer 120 and an active layer 130 are etched to form a first through-hole H1, and a second ohmic electrode 160 is formed.

The reflective electrode layer 150 is formed on the second ohmic electrode 160, and an insulating layer 190 is formed on an entire upper portion of the reflective electrode layer 150.

Figure 49:
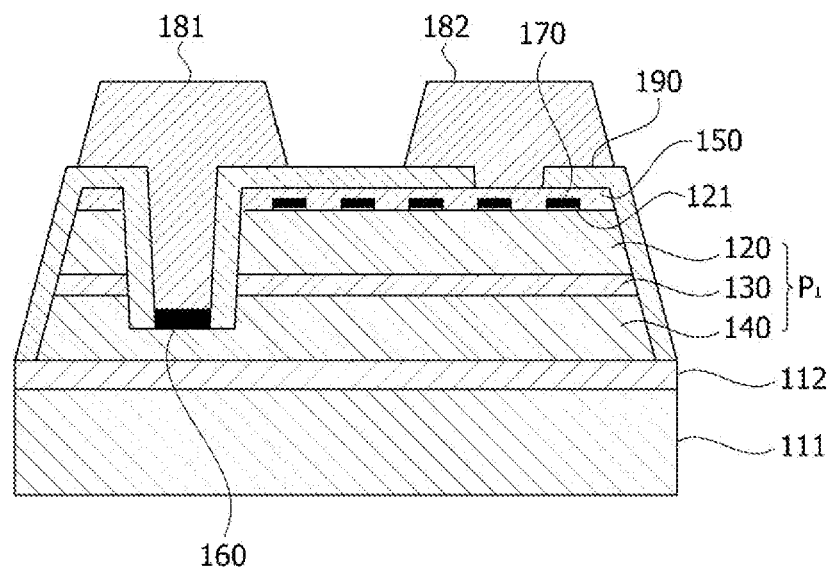

Then, as in FIG. 49, the first electrode 182 and the first conductive semiconductor layer 120 may be electrically connected through the insulating layer 190, and the second electrode 181 may be electrically connected to the second conductive semiconductor layer 140.

FIGS. 50 to 53 are views showing a method of manufacturing a light emitting device according to still another embodiment of the present invention.

Figure 50:
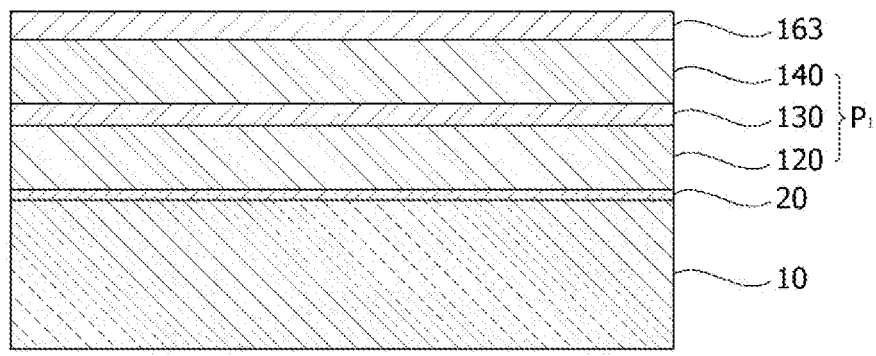
FIGS. 50 to 53 are views showing a method of manufacturing a light emitting device according to still another embodiment of the present invention.
Figure 51:
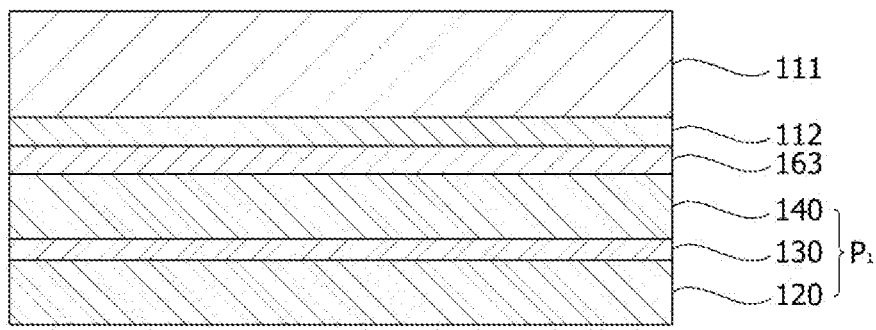

Referring to FIG. 50, a second ohmic electrode 163 is formed on a light emitting structure P1. The second ohmic electrode 163 may be a transparent electrode such as ITO.

In this case, a surface layer of the second conductive semiconductor layer 140 may be doped with carbon. A carbon doping concentration may be $5.0 \times 10^{19}/cm^3$ to $2.0 \times 10^{20}/cm^3$. When the carbon doping concentration is $5.0 \times 10^{19}/cm^3$ to $2.0 \times 10^{20}/cm^3$, electrical conductivity may be increased and thus ohmic contact with a metal or a transparent electrode (e.g., ITO) may be improved. Then, as in FIG. 51, an optical layer 112 and a light transmitting substrate 111 are formed.

Figure 52:
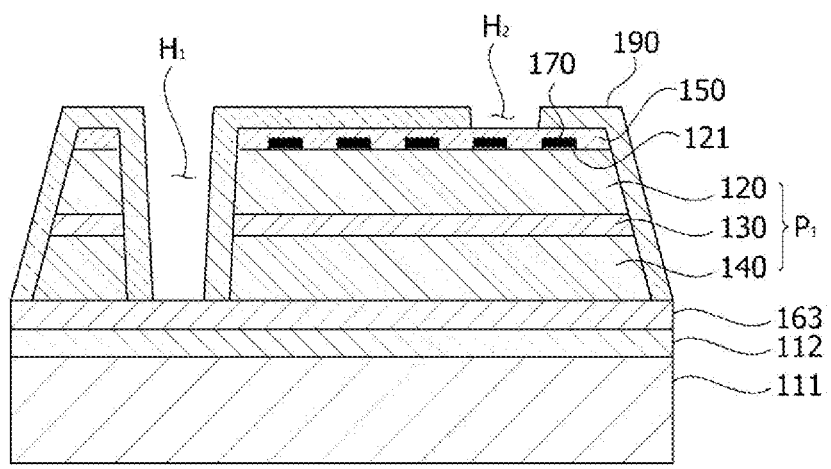
Figure 53:
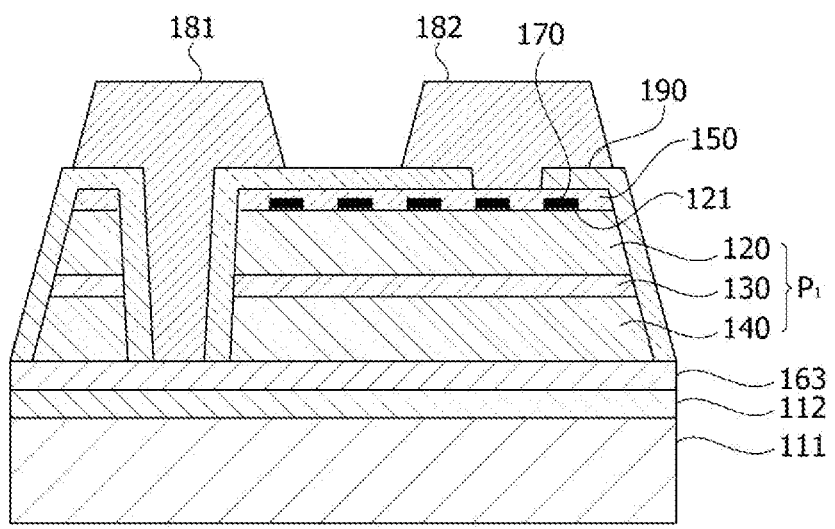

Referring to FIG. 52, a through-hole H1 may be formed in a light emitting structure P1 to expose a second ohmic electrode 163 therethrough. Then, as in FIG. 53, a second electrode 181 is formed and electrically connected to the second ohmic electrode 163.

Figure 54:
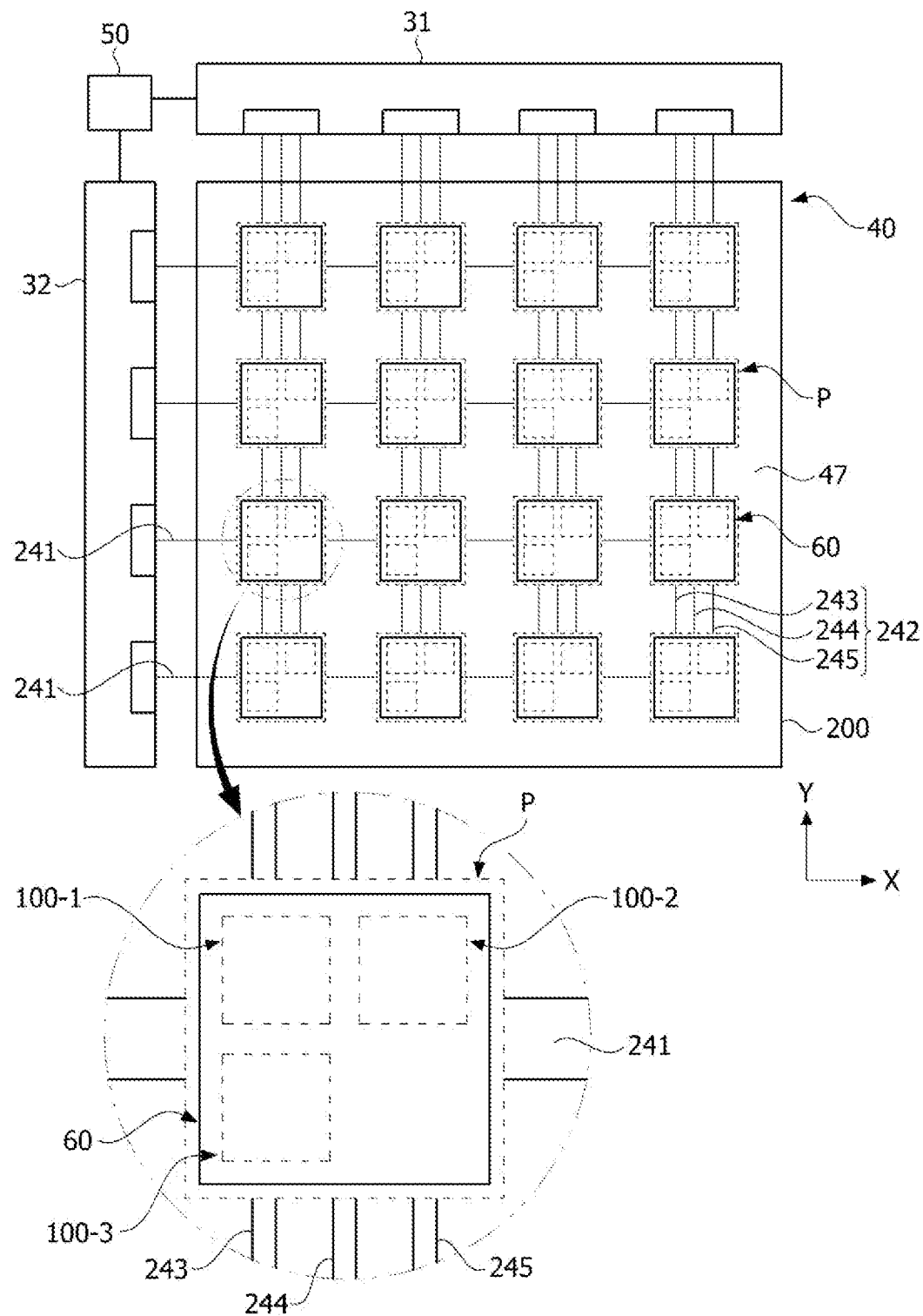
FIG. 54 is a conceptual diagram of a display according to an embodiment of the present invention.

FIG. 54 is a conceptual diagram of a display according to an embodiment of the present invention.

Referring to FIG. 54, a display may include a panel 40 including an array substrate 200 on which a plurality of common lines 241 and driving lines 242 intersect and light emitting device packages 60 disposed in each pixel region P, a first driver 32 configured to apply a driving signal to the common lines 241, a second driver 31 configured to apply a driving signal to the driving lines 242, and a controller 50 configured to control the first driver 20 and the second driver 31.

The array substrate 200 may be a circuit board on which the light emitting device packages 60 are mounted. The array substrate 200 may be a rigid substrate or a flexible substrate formed of a single layer or multiple layers. The common lines 241 and the driving lines 242 may be formed on the array substrate 200.

The pixel regions P may refer to regions in which the plurality of common lines 241 and driving lines 242 intersect. The pixel regions P may be concepts including RGB subpixels. A light emitting device package 60 in which first to third light emitting devices 100-1, 100-2, and 100-3 are disposed may be mounted in a pixel region P and serve as RGB subpixels. Although description will be given below by assuming that three light emitting devices serve as RGB subpixels, the number of light emitting devices may be adjusted as necessary.

The first light emitting device 100-1 may serve as a first subpixel configured to output light in a blue wavelength band. The second light emitting device 100-2 may serve as a second subpixel configured to output light in a green wavelength band. The third light emitting device 100-3 may serve as a third subpixel configured to output light in a red wavelength band. All of the first to third light emitting devices 100-1, 100-2, and 100-3 may be flip chip types. At least one of the first to third light emitting devices 100-1, 100-2, and 100-3 may have the above-described light emitting device structure. As an example, the third light emitting device 100-3 configured to output light in a red wavelength band may have the light emitting device structures described above with reference to FIGS. 1 to 53.

The common lines 241 may be electrically connected to the light emitting devices disposed in the plurality of pixel regions P which are disposed in a first direction (X-direction).

A method of electrical connection between the common lines 241 and the light emitting devices 100A, 100B, and 100C is not limited. As an example, the common lines 241 and the light emitting devices may be electrically connected using a through-electrode or using a lead electrode of a substrate.

First to third driving lines 243, 244, and 245 may be electrically connected to light emitting devices disposed in the plurality of pixel regions P which are disposed in a second direction (Y-direction).

The first driving line 243 may be electrically connected to the first light emitting device 100-1, the second driving line 244 may be electrically connected to the second light emitting device 100-2, and the third driving line may be electrically connected to the third light emitting device 100-3.

A method of electrical connection between the driving lines 242 and the light emitting devices 100A, 100B, and 100C is not limited. As an example, the driving lines 242 and the light emitting devices may be electrically connected using a through-electrode or using a lead electrode of a substrate.

A protective layer 47 may be disposed between the light emitting device packages 60. The protective layer 47 may protect the light emitting device packages 60 and a circuit pattern of the array substrate 200.

The protective layer 47 may be formed of a material such as solder resist or formed of an insulating material. The protective layer 47 may include at least one of $SiO_2$, $Si_3N_4$, $TiO_2$, $Al_2O_3$, and MgO.

The protective layer 47 may include a black matrix material. When the protective layer 47 is formed of a black matrix material, for example, the protective layer 47 may be implemented using carbon black, graphite, or poly pyrrole.

The controller 50 may output control signals to the first and second drivers 20 and 30 so that power is selectively applied to the common lines 241 and the first to third driving lines 243, 244, and 245, thereby separately controlling the first to third light emitting devices 100-1, 100-2, and 100-3 in a single pixel P.

The display may be implemented to have a standard definition (SD) level resolution (760×480), a high definition (HD) level resolution (1180×720), a full HD (FHD) level resolution (1920×1080), an ultra HD (UH) level resolution (3480×2160), or a UHD level resolution (e.g., 4K(K=1000), 8K, etc.). In this case, the plurality of first to third light emitting devices 100-1, 100-2, and 100-3 according to an embodiment may be arranged and connected corresponding to the resolution.

The display may be an electric sign board or a TV whose diagonal length is 100 inches or greater, and pixels of the display may be implemented using LEDs. Therefore, a high-brightness self-emitting display which has low power consumption and a long service life with a low maintenance cost may be provided.

An embodiment implements a video and an image using the light emitting device packages 60, thereby having an advantage in that color purity and color reproduction are excellent.

An embodiment implements a video and an image using light emitting device packages having excellent straightness, thereby implementing a clear large-screen display whose diagonal length is 100 inches or greater.

An embodiment may implement a high-resolution large-screen display whose diagonal length is 100 inches or greater with low cost.

The light emitting device package 60 according to an embodiment may further include an optical member such as a light guide plate, a prism sheet, and a diffusion sheet and serve as a backlight unit. In addition, the light emitting device package of the embodiment may be further applied to a display, a lighting, and an indicator.

In this case, the display may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate is disposed on the bottom cover, and the light emitting module emits light. The light guide plate is disposed in front of the reflective plate and guides light emitted from the light emitting module forward. The optical sheet includes a prism sheet or the like and is disposed in front of the light guide plate. The display panel is disposed in front of the optical sheet, the image signal output circuit supplies an image signal to the display panel, and the color filter is disposed in front of the display panel.

In addition, the lighting may include a light source module including a substrate and the light emitting device package of the embodiment, a heat dissipating unit configured to dissipate heat of the light source module, and a power providing unit configured to process or convert an electrical signal received from the outside and provide the processed or converted electrical signal to the light source module. Further, the lighting may include a lamp, a head lamp, a street light, or the like.

In addition, a camera flash of a mobile terminal may include a light source module including the light emitting device package of the embodiment. Since the light emitting device package has an angle of beam spread that corresponds to an angle of view of a camera as described above, there is an advantage in that light loss is small.

An embodiment of the present invention is not limited to the above-described embodiments and accompanying drawings. It should be apparent to those of ordinary skill in the art to which the embodiment of the present invention pertains that various substitutions, modifications, and changes may be made to the embodiment of the present invention within the scope not departing from the technical idea of the embodiment.

The invention claimed is:

1. A light emitting device comprising:
a light transmitting substrate;
a light emitting structure including a second conductive semiconductor layer disposed on the light transmitting substrate, a first conductive semiconductor layer disposed on the second conductive semiconductor layer, and an active layer disposed between the second conductive semiconductor layer and the first conductive semiconductor layer;
an insulating layer configured to cover the light emitting structure;
a first ohmic electrode electrically connected to the first conductive semiconductor layer;
a second ohmic electrode disposed on one side of the second conductive semiconductor layer facing the light transmitting substrate and electrically connected to the second conductive semiconductor layer;
a first electrode electrically connected to the first ohmic electrode through the insulating layer; and
a second electrode electrically connected to the second ohmic electrode through the insulating layer and the light emitting structure, wherein:
the active layer emits light in a red wavelength band; and
the second ohmic electrode includes a pad electrode disposed at the center of the second conductive semiconductor layer and a plurality of branched electrodes extending outward from the center of the second conductive semiconductor layer.

2. The light emitting device of claim 1, comprising an optical layer disposed between the second conductive semiconductor layer and the light transmitting substrate, wherein the optical layer joins the light transmitting substrate and the light emitting structure.

3. The light emitting device of claim 1, wherein:
the first electrode has a rotationally symmetrical shape about a central axis of the light emitting structure;
the second electrode has a rotationally symmetrical shape about the central axis of the light emitting structure;
the first electrode is disposed on the central axis of the light emitting structure; and
the second electrode is disposed on an edge of the light emitting structure.

4. The light emitting device of claim 1, wherein:
the second electrode is electrically connected to the second ohmic electrode through the insulating layer and the light emitting structure;
the light emitting structure includes a through-hole in which the second electrode extends; and
a ratio between a diameter of the through-hole and a diameter of the pad electrode of the second ohmic electrode is 1:1.2 to 1:2.

5. The light emitting device of claim 1, wherein an area of the second ohmic electrode is 2% to 7% of an entire area of the second conductive semiconductor layer.

6. The light emitting device of claim 1 wherein:
the second conductive semiconductor layer includes a second clad layer, a second current distribution layer, and a second ohmic layer;
the light emitting structure includes an accommodating groove formed on the first conductive semiconductor layer and configured to expose the second current distribution layer; and
the second ohmic electrode is disposed on a bottom surface of the accommodating groove.

7. The light emitting device of claim 6, wherein the second current distribution layer and the second ohmic layer includes Ga and P.

8. The light emitting device of claim 1, wherein the first conductive semiconductor layer includes a first ohmic layer coming into contact with the first ohmic electrode, and the first ohmic layer includes a GaAs composition.

9. A display comprising:
an array substrate;
a common line formed on the array substrate;
a plurality of driving lines formed on the array substrate; and
a plurality of light emitting devices mounted on the array substrate, wherein the light emitting device includes:
a light transmitting substrate;
a light emitting structure including a second conductive semiconductor layer disposed on the light transmitting substrate, a first conductive semiconductor layer disposed on the second conductive semiconductor layer, and an active layer disposed between the second conductive semiconductor layer and the first conductive semiconductor layer;
an insulating layer configured to cover the light emitting structure;
a first ohmic electrode electrically connected to the first conductive semiconductor layer;
a second ohmic electrode disposed on one side of the second conductive semiconductor layer facing the light transmitting substrate and electrically connected to the second conductive semiconductor layer;
a first electrode electrically connected to the first ohmic electrode through the insulating layer; and
a second electrode electrically connected to the second ohmic electrode through the insulating layer and the light emitting structure, wherein:
the active layer emits light in a red wavelength band; and
the second ohmic electrode includes a pad electrode disposed at the center of the second conductive semiconductor layer and a plurality of branched electrodes extending outward from the center of the second conductive semiconductor layer.

\* \* \* \* \*